(12) United States Patent
Yamagami et al.

(10) Patent No.: US 7,719,043 B2
(45) Date of Patent: May 18, 2010

(54) SEMICONDUCTOR DEVICE WITH FIN-TYPE FIELD EFFECT TRANSISTOR AND MANUFACTURING METHOD THEREOF.

(75) Inventors: Shigeharu Yamagami, Tokyo (JP); Hitoshi Wakabayashi, Tokyo (JP); Risho Koh, Tokyo (JP); Kiyoshi Takeuchi, Tokyo (JP); Masahiro Nomura, Tokyo (JP); Koichi Takeda, Tokyo (JP); Koichi Terashima, Tokyo (JP); Masayasu Tanaka, Tokyo (JP); Katsuhiko Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 685 days.

(21) Appl. No.: 11/632,352

(22) PCT Filed: Jul. 4, 2005

(86) PCT No.: PCT/JP2005/012338

§ 371 (c)(1),
(2), (4) Date: Jan. 12, 2007

(87) PCT Pub. No.: WO2006/006438

PCT Pub. Date: Jan. 19, 2006

(65) Prior Publication Data

US 2008/0029821 A1 Feb. 7, 2008

(30) Foreign Application Priority Data

Jul. 12, 2004 (JP) ............................. 2004-204973

(51) Int. Cl.
*H01L 27/108* (2006.01)
*H01L 29/94* (2006.01)

(52) U.S. Cl. .................... 257/308; 257/74; 257/306; 257/350; 257/351; 257/506; 438/283; 438/176

(58) Field of Classification Search .......... 257/E25.011, 257/74, 308, 350, 351, 306, 506; 438/283, 438/176
See application file for complete search history.

(56) References Cited

U.S. PATENT DOCUMENTS 6,885,055 B2 * 4/2005 Lee ........................... 257/308

(Continued)

FOREIGN PATENT DOCUMENTS

JP 64-8670 1/1989

(Continued)

OTHER PUBLICATIONS

Lee D-H et al., "Fin-Channel-Array Transistor (FCAT) Featuring Sub-70nm Low Power and High Performance DRAM", *IEEE*, pp. 407-410 (2003).

(Continued)

*Primary Examiner*—Thao X Le
*Assistant Examiner*—Thanh Y Tran
(74) *Attorney, Agent, or Firm*—Scully, Scott, Murphy & Presser, P.C.

(57) ABSTRACT

The present invention relates to a semiconductor device including a Fin type field effect transistor (FET) having a protrusive semiconductor layer protruding from a substrate plane, a gate electrode formed so as to straddle the protrusive semiconductor layer, a gate insulating film between the gate electrode and the protrusive semiconductor layer, and source and drain regions provided in the protrusive semiconductor layer, wherein the semiconductor device has on a semiconductor substrate an element forming region having a Fin type FET, a trench provided on the semiconductor substrate for separating the element forming region from another element forming region, and an element isolation insulating film in the trench; the element forming region has a shallow substrate flat surface formed by digging to a depth shallower than the bottom surface of the trench and deeper than the upper surface of the semiconductor substrate, a semiconductor raised portion protruding from the substrate flat surface and formed of a part of the semiconductor substrate, and an insulating film on the shallow substrate flat surface; and the protrusive semiconductor layer of the Fin type FET is formed of a portion protruding from the insulating film of the semiconductor raised portion.

22 Claims, 55 Drawing Sheets

U.S. PATENT DOCUMENTS 6,949,768 B1 * 9/2005 Anderson et al. ............. 257/74
7,163,851 B2 * 1/2007 Abadeer et al. ............. 438/157

FOREIGN PATENT DOCUMENTS

| | | |
|---|---|---|
| JP | 02-201965 | 8/1990 |
| JP | 04-276662 | 10/1992 |
| JP | 04-368180 | 12/1992 |
| JP | 09-008119 | 1/1997 |
| JP | 11-251579 | 9/1999 |
| JP | 2002-118255 | 4/2002 |
| JP | 2002-151688 | 5/2002 |
| JP | 2002-198532 | 7/2002 |
| JP | 2002-246481 | 8/2002 |
| JP | 2002-530872 | 9/2002 |

OTHER PUBLICATIONS

Abstract of PCT Publication No. WO 00/30181 A3, published May 25, 2000.

Lee C.H. et al., "Novel Body Tied FinFET Cell Array Transistor DRAM with Negative Word Line Operation for sub 60nm Technology and Beyond", *2004 Symposium on VLSI Technology Digest of Technical Papers*, pp. 130-131 (2004).

* cited by examiner (a)

(b)

(a)  (b)  (c)  (d)

SEMICONDUCTOR DEVICE WITH FIN-TYPE FIELD EFFECT TRANSISTOR AND MANUFACTURING METHOD THEREOF.

TECHNICAL FIELD

The present invention relates to a semiconductor device and a method for production thereof, and more particularly to a semiconductor device having a MIS type field effect transistor having a gate electrode on a semiconductor layer protruding with respect to a substrate plane, and a method for production thereof.

BACKGROUND ART

In recent years, a so-called Fin type FET has been proposed as a type of MIS type field effect transistor (hereinafter referred to as "FET"). This Fin type FET has a rectangular parallelepiped protrusive semiconductor layer protruding in a vertical direction to the plane of a substrate, and a gate electrode is provided so as to straddle the protrusive semiconductor layer from one side surface thereof to the opposite side surface across the upper surface. A gate electrode is interposed between the protrusive semiconductor layer and the gate electrode, and channels are formed mainly along the opposite side surfaces of the protrusive semiconductor layer. Such a Fin type FET is known to be advantageous for miniaturization because the channel width can be situated in a direction vertical to a substrate plane, and also advantageous for improvements of various kinds of characteristics such as improvements of the cut-off characteristic and carrier mobility and reduction of the short channel effect and punch-through.

As such a Fin type FET, Patent Document 1 (Japanese Patent Laid-Open No. 64-8670) discloses a MOS field effect transistor characterized in that a semiconductor portion having a source region, a drain region and a channel region is a rectangular parallelepiped having side surfaces almost vertical to the flat surface of a wafer substrate, the height of the rectangular parallelepiped semiconductor portion is greater than the width thereof, and a gate electrode extends along a direction vertical to the flat surface of the wafer substrate.

Patent Document 1 shows as an example a configuration in which a part of the rectangular parallelepiped semiconductor portion is a part of a silicon wafer substrate and a configuration in which a part of the rectangular parallelepiped semiconductor portion is a part of a monocrystalline silicon layer of an SOI (Silicon On Insulator). The former is shown in FIG. 1(a) and the latter is shown in FIG. 1(b).

In the configuration shown in FIG. 1(a), a part of a silicon wafer substrate 101 is a rectangular parallelepiped portion 103, and a gate electrode 105 extends to one side to the opposite side across the top of the rectangular parallelepiped portion 103. In the rectangular parallelepiped portion 103, a source region and a drain region are formed in portions on opposite sides of the gate electrode, and a channel is formed in a portion below an insulating film 104 below the gate electrode. The channel width is equivalent to double the height (h) of the rectangular parallelepiped portion 103, and the gate length corresponds to the width L of the gate electrode 105. The rectangular parallelepiped portion 103 is formed of a portion left inside of a trench formed by anisotropically etching the silicon wafer substrate 101. Furthermore, the gate electrode 105 is provided so as to straddle the rectangular parallelepiped portion 103 on an insulating film 102 formed in the trench.

In the configuration shown in FIG. 1(b), an SOI substrate consisting of a silicon wafer substrate 111, an insulating layer 112 and a silicon monocrystalline layer is prepared, the silicon monocrystalline layer is patterned to form a rectangular parallelepiped portion 113, and a gate electrode 115 is provided on the exposed insulating layer 112 so as to straddle the rectangular parallelepiped portion 113. In the rectangular parallelepiped portion 113, a source region and a drain region are formed in portions on opposite sides of the gate electrode, and a channel is formed in a portion below an insulating film 114 below the gate electrode. The channel width is equivalent to the sum of double the height (a) of rectangular parallelepiped portion 113 and the width (b) thereof, and the gate length corresponds to the width L of the gate electrode 115.

Patent Document 2 (Japanese Patent Laid-Open No. 2002-118255) discloses a Fin type FET having a plurality of rectangular parallelepiped semiconductor portions (raised semiconductor layers 213) shown in, for example, FIGS. 2(a) to 2(c). FIG. 2(b) is a sectional view taken along line B-B of FIG. 2(a), and FIG. 2(c) is a sectional view taken along line C-C of FIG. 2(a). The Fin type FET has a plurality of raised semiconductor layers 213 formed of a part of a well layer 211 of a silicon substrate 210, these layers are arranged in parallel, and a gate electrode 216 is provided so as to straddle the central portions of these raised semiconductor layers. The gate electrode 216 is formed along the side surface of each raised semiconductor layer 213 from the upper surface of an insulating film 214. An insulating film 218 is interposed between each raised semiconductor layer and the gate electrode, and a channel 215 is formed on the raised semiconductor layer below the gate electrode. A source/drain region 217 is formed on each raised semiconductor layer, and a high-concentration impurity layer (punch-through stopper layer) is provided in a region 212 below the source/drain region 217. Upper wirings 229 and 230 are provided on an interlayer insulating film 226, and each upper wiring is connected to the source/drain region 207 and the gate electrode 216 by each contact plug 228. It is described that according to such a structure, the side surface of the raised semiconductor layer may be used as a channel width, and therefore a planar area can be decreased as compared to a conventional FET of planar type.

DISCLOSURE OF THE INVENTION

The Fin type FET shown in FIG. 1(a) in which the raised semiconductor layer is formed of a part of the semiconductor substrate is advantageous in terms of a heat dissipation characteristic and a substrate floating effect, but has the problems described below.

FIGS. 3(a) to 3(c) are sectional views showing a conventional structure having a Fin region on which a Fin type FET is formed and another region (planar region) on the same semiconductor substrate. Reference numeral 301 in the figure denotes a semiconductor substrate, reference numeral 302 denotes an insulating film, reference numeral 303 denotes a protrusive semiconductor layer, reference symbol 303A denotes a semiconductor raised portion, and reference numeral 304 denotes a gate electrode. In this connection, the Fin region and the planar region in the figure are adjacent to each other for convenience of explanations.

Generally, a trench for element isolation in the planar region is required to have a depth D of about 300 nm, and when a very small protrusive semiconductor layer 303 having a width W of about 20 nm as shown in FIG. 3(a) is formed, a semiconductor raised portion 303A having a high aspect ratio (height D/width W of semiconductor raised portion=15/1) is formed, and therefore the production is difficult. Therefore, the Fin type FET cannot be sufficiently miniaturized. As shown in FIG. 3(b), a structure in which a plurality of protrusive semiconductor layers 303 are closely arranged is still further difficult to produce. Namely, it is difficult to form a gap having a high aspect ratio (height H/spacing S of protrusive semiconductor layer 303) in a Fin region, and the density cannot be sufficiently increased in the Fin region. If the depth D of the trench is decreased as shown in FIG. 3(c) in order to avoid such problems, a parasitic capacitance occurs between the gate electrode 304 and the semiconductor substrate in the planar region to deteriorate an element characteristic.

Thus, it is an object of the present invention to provide a semiconductor device having a Fin type FET with a protrusive semiconductor layer formed of a part of a semiconductor substrate and having a structure allowing the very fine and highly dense Fin type FET to be easily produced, and a method for production thereof.

The present invention includes aspects described in the following items (1) to (22).

(1) A semiconductor device comprising a Fin type field effect transistor which comprises a protrusive semiconductor layer protruding upward with respect to a substrate plane, a gate electrode extending from the upper part of the protrusive semiconductor layer onto facing opposite side surfaces thereof so as to straddle the protrusive semiconductor layer, a gate insulating film interposed between the gate electrode and the protrusive semiconductor layer, and a pair of source and drain regions provided in the protrusive semiconductor layer, wherein the semiconductor device comprises on a semiconductor substrate an element forming region having at least one Fin type field effect transistor, a trench provided on the semiconductor substrate for separating the element forming region from another element forming region, and an element separation isolation film provided in the trench; and the element forming region comprises a shallow substrate flat surface formed by digging to a depth shallower than the bottom surface of the trench and deeper than the upper surface of the semiconductor substrate, a semiconductor raised portion protruding with respect to the substrate flat surface and formed of a part of the semiconductor substrate, and an insulating film provided on the shallow substrate flat surface; and the protrusive semiconductor layer of the Fin type field effect transistor is formed of a portion protruding with respect to the insulating film of the semiconductor raised portion.

(2) The semiconductor device according to item 1, comprising a plurality of element forming regions, and a Fin type field effect transistor formed on a well of a first conductivity type is provided on an element forming region different from that of a Fin type field effect transistor formed on a well of a second conductivity type.

(3) The semiconductor device according to item 1 or 2, wherein one Fin type field effect transistor is provided on one element forming region separated by the trench and the element isolation insulating film buried in the trench.

(4) The semiconductor device according to any one of items 1 to 3, wherein the Fin type field effect transistor has a plurality of protrusive semiconductor layers in one transistor.

(5) The semiconductor device according to any one of items 1 to 4, comprising a planar type field effect transistor where a channel is formed along the upper surface of the semiconductor substrate on an element forming region different from the element forming region having the Fin type field effect transistor.

(6) A method for production of the semiconductor device set forth in item 1, comprising the steps of:

forming on a semiconductor substrate a first trench for separating element forming regions, and burying an insulating film in the trench to form an element isolation insulating film;

forming a second trench shallower than the bottom surface of the trench on the semiconductor substrate region separated by the element isolation insulating film to form a semiconductor raised portion formed of a part of the semiconductor substrate and protruding with respect to the bottom surface of the second trench;

forming an insulating film on the bottom surface of the second trench to form a protrusive semiconductor layer formed of a portion protruding with respect to the insulating film of the semiconductor raised portion;

forming a gate insulating film at least on the side surface of the protrusive semiconductor layer;

forming a gate electrode material film and patterning the film to form a gate electrode; and introducing an impurity into the protrusive semiconductor layer to form source and drain regions.

(7) The method for production of a semiconductor device according to item 6, wherein the insulating film which is formed on the bottom surface of the second trench is formed by thermally oxidizing the exposed bottom surface of the second trench after forming an antioxidant film on the side surface of said semiconductor raised portion.

(8) The method for production of a semiconductor device according to item 6, wherein the insulating film which is formed on the bottom surface of the second trench is formed by forming an insulating film so as to fill the second trench and etching back the insulating film.

(9) The method for production of a semiconductor device according to any one of items 6 to 8, wherein the first trench is formed simultaneously with formation of a trench for isolating another element forming region provided with a planar type field effect transistor where a channel is formed along the upper surface of the semiconductor substrate.

(10) The method for production of a semiconductor device according to any one of items 6 to 9, wherein burying the insulating film in the first trench is simultaneous with burying the insulating film in a trench for isolating another element forming region provided with a planar type field effect transistor where a channel is formed along the upper surface of the semiconductor substrate.

(11) A method for production of the semiconductor device set forth in item 1, comprising the steps of:

forming on a semiconductor substrate a first trench shallower than the bottom surface of a second trench which is subsequently formed to form a semiconductor raised portion formed of a part of the semiconductor substrate and protruding with respect to the bottom surface of the first trench;

forming a second trench for separating an element forming region provided with the semiconductor raised portion and another element forming region;

forming an insulating film so as to fill the first trench and the second trench;

etching back the insulating film to expose the semiconductor raised portion, and to form a protrusive semiconductor layer formed of a portion protruding with respect to the insulating film of the semiconductor raised portion;

forming a gate insulating film at least on the side surface of the protrusive semiconductor layer;

forming a gate electrode material film and pattering the film to form a gate electrode; and introducing an impurity into the protrusive semiconductor layer to form source and drain regions.

(12) A method for production of the semiconductor device set forth in item 1, comprising the steps of:

forming on a semiconductor substrate a first trench shallower than the bottom surface of a second trench which is subsequently formed to form a semiconductor raised portion formed of a part of the semiconductor substrate and protruding with respect to the bottom surface of the first trench;

forming a first insulating film so as to fill the first trench;

forming a second trench for separating an element forming region provided with the semiconductor raised portion and another element forming region;

forming a second insulating film so as to fill the second trench;

etching back the first and second insulating films to expose the semiconductor raised portion, and to form a protrusive semiconductor layer formed of a portion protruding with respect to the first insulating film of the semiconductor raised portion;

forming a gate insulating film at least on the side surface of the protrusive semiconductor layer;

forming a gate electrode material film and patterning the film to form a gate electrode; and introducing an impurity into the protrusive semiconductor layer to form source and drain regions.

(13) A method for production of the semiconductor device set forth in item 1, comprising the steps of:

forming a mask film on a semiconductor substrate;

forming, on the semiconductor substrate on which the mask film is formed, a first trench shallower than the bottom surface of a second trench which is subsequently formed to form a semiconductor raised portion formed of a part of the semiconductor substrate and protruding with respect to the bottom surface of the first trench;

forming a first insulating film so as to fill the first trench;

carrying out polishing using the mask film as a stopper to remove the first insulating film on the mask film except for the inside of the first trench;

forming a second trench for separating an element forming region provided with the semiconductor raised portion and another element forming region;

forming a second insulating film so as to fill the second trench;

carrying out polishing using the mask film as a stopper to remove the second insulating film on the mask film except for the inside of the second trench;

etching back the first and second insulating films to expose the semiconductor raised portion, and to form a protrusive semiconductor layer formed of a portion protruding with respect to the first insulating film of the semiconductor raised portion;

forming a gate insulating film at least on the side surface of the protrusive semiconductor layer;

forming a gate electrode material film and patterning the film to form a gate electrode; and introducing an impurity into the protrusive semiconductor layer to form source and drain regions.

(14) A method for production of the semiconductor device set forth in item 1, comprising the steps of:

forming a first mask film on a semiconductor substrate;

forming, on the semiconductor substrate on which the first mask film is formed, a first trench shallower than the bottom surface of a second trench which is subsequently formed to form a semiconductor raised portion formed of a part of the semiconductor substrate and protruding with respect to the bottom surface of the first trench;

forming a first insulating film so as to fill the first trench;

carrying out polishing using the first mask film as a stopper to remove the first insulating film on the first mask film except for the inside of the first trench;

forming a second mask film;

forming a second trench for separating an element forming region provided with the semiconductor raised portion and another element forming region;

forming a second insulating film so as to fill the second trench;

carrying out polishing using the second mask film as a stopper to remove the second insulating film on the second mask film except for the inside of the second trench;

etching back the first and second insulating films to expose the semiconductor raised portion, and to form a protrusive semiconductor layer formed of a portion protruding with respect to the first insulating film of the semiconductor raised portion;

forming a gate insulating film at least on the side surface of the protrusive semiconductor layer;

forming a gate electrode material film and pattering the film to form a gate electrode; and introducing an impurity into the protrusive semiconductor layer to form source and drain regions.

(15) The method for production of a semiconductor device according to item 14, wherein the second mask film is thicker than the first mask film.

(16) The method for production of a semiconductor device according to item 14 or 15, wherein a pad film formed of a material different from the material of each of the first mask film and the second mask film is provided between the first mask film and the second mask film.

(17) The method for production of a semiconductor device according to any one of items 11 to 16, wherein the second trench is formed simultaneously with formation of a trench for separating another element forming region provided with a planar type field effect transistor where a channel is formed along the upper surface of the semiconductor substrate.

(18) The method for production of a semiconductor device according to any one of items 11 to 16, wherein burying the insulating film in the second trench is simultaneous with burying the insulating film in a trench for separating another element forming region provided with a planar type field effect transistor where a channel is formed along the upper surface of the semiconductor substrate.

(19) The method for production of a semiconductor device according to any one of items 11 to 18, wherein the insulating film formed so as to be buried in the second trench and the insulating film formed so as to fill a trench for separating another element forming region provided with a planar type field effect transistor where a channel is formed along the upper surface of the semiconductor substrate are polished simultaneously.

(20) The method for production of a semiconductor device according to any one of items 11 to 19, wherein the first trench has the plane geometry of a strip, and a plurality of the trenches are formed in parallel, and the semiconductor raised portion is formed of a semiconductor portion between first trenches.

(21) The method for production of a semiconductor device according to item 20, wherein in the step of forming the first trench, when the first trench is formed by etching the semiconductor substrate, a dummy region where the semiconductor substrate is left without being removed by the etching is formed between semiconductor raised portions constituting different Fin type field effect transistors in the same element forming region.

(22) The method for production of a semiconductor device according to item 21, further comprising the steps of, after forming the first trench and the dummy region, forming a mask material so as to cover the entire surface; exposing the semiconductor substrate in the dummy region; and etching a region of the semiconductor substrate including the dummy region to form the second trench.

According to the present invention, there can be provided a semiconductor device having a Fin type FET with a protrusive semiconductor layer formed of a part of a semiconductor substrate and having a structure allowing the very fine and highly dense Fin type FET to be easily produced, and a method for production thereof.

BEST MODE FOR CARRYING OUT THE INVENTION

Figure 1:
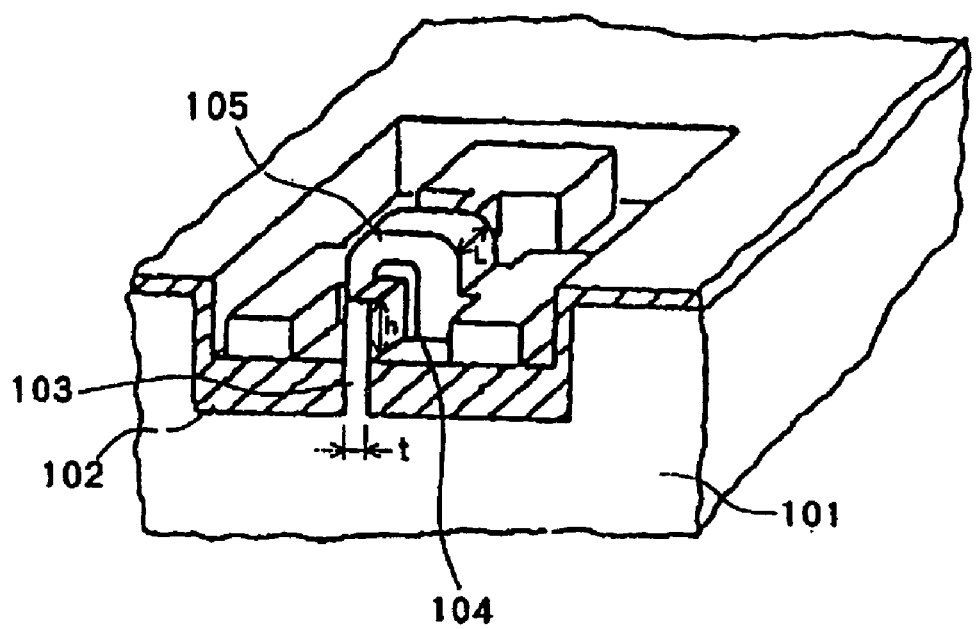
FIGS. 1(a) and 1(b) are explanatory views of an element structure of a conventional Fin type FET.
Figure 1:
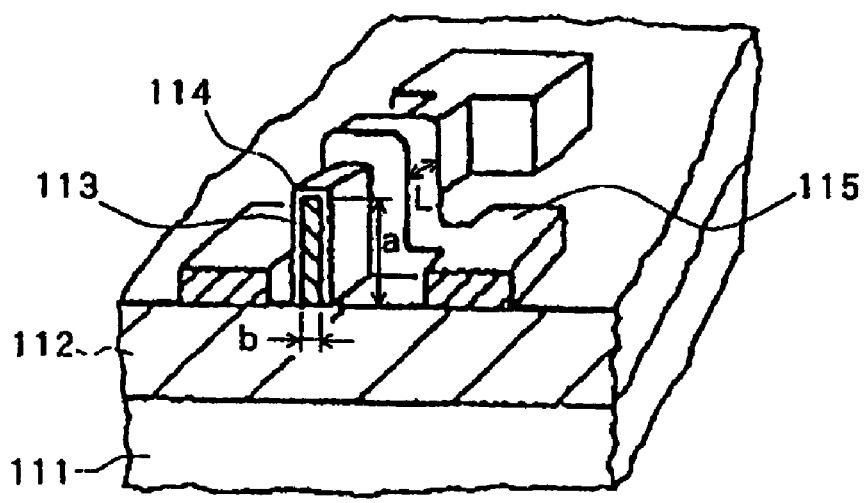
Figure 2:
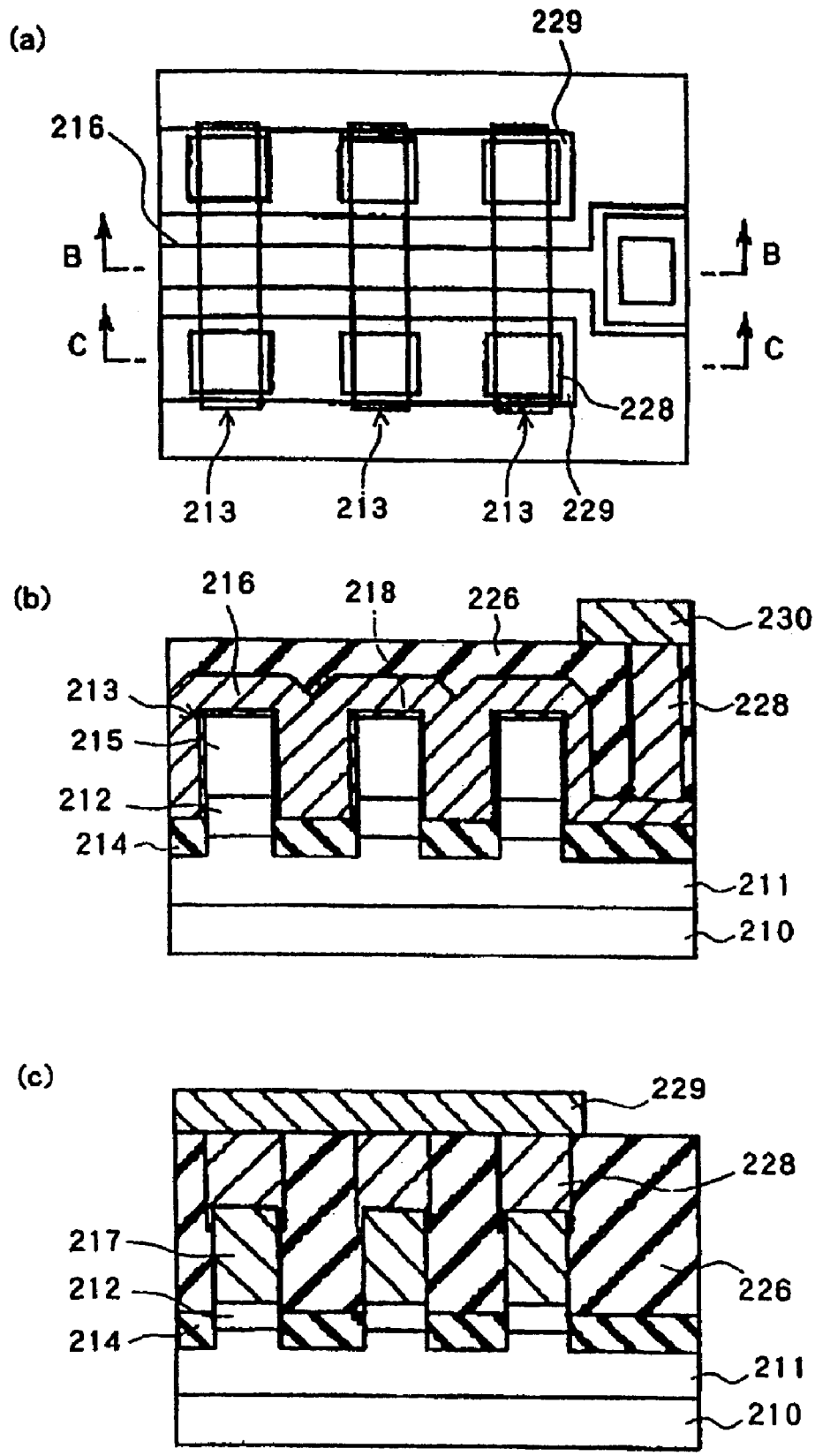
FIGS. 2(a) to 2(c) are explanatory views of an element structure of a conventional Fin type FET.
Figure 3:
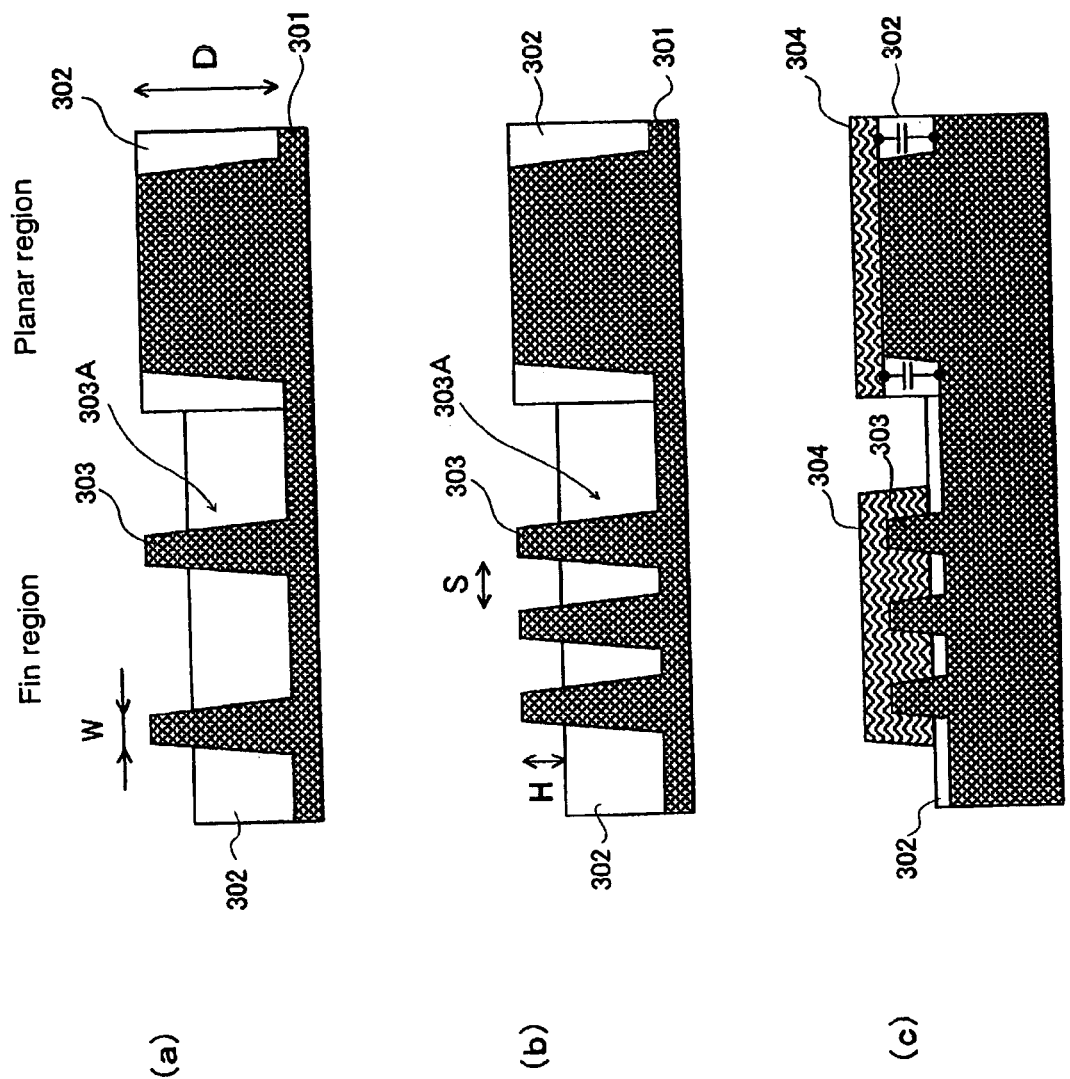
FIGS. 3(a) to 3(c) are sectional views for explaining a problem in a conventional structure having a Fin type FET.
Figure 4:
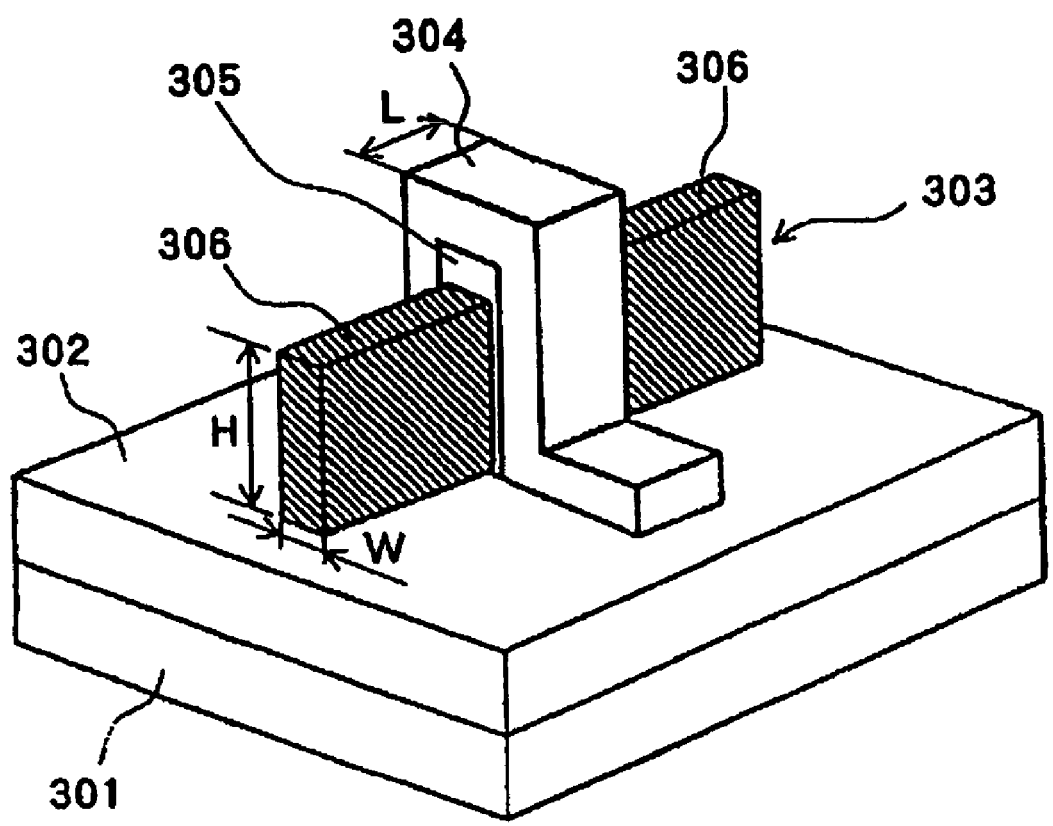
FIG. 4 is an explanatory view of an element structure of a Fin type FET in the present invention.

As a Fin type FET in the present invention can be used a MIS type field effect transistor having a semiconductor layer 303 protruding upward in a vertical direction with respect to a substrate plane, a gate electrode 304 extending from the upper part of the semiconductor layer to facing opposite side surfaces so as to straddle the semiconductor layer, a gate insulating film 305 interposed between the gate electrode 304 and the semiconductor layer 303, and source and drain regions 306 provided in the semiconductor layer 303 as shown in, for example, FIG. 4.

For the semiconductor (hereinafter referred to as "protrusive semiconductor layer" or "Fin" as appropriate) constituting the Fin type FET and protruding upward in a vertical direction to a substrate plane, a semiconductor layer protruding with respect to the surface of an insulating film 302 on a semiconductor substrate 301 as shown, for example, in FIG. 4 can be used. In the present invention, a substrate plane refers to any surface parallel to the substrate, and refers to the surface (upper surface) of the insulating film 302 here. This configuration is advantageous in terms of a heat dissipation characteristic and suppression of a substrate floating effect, since heat and a charge generated in the semiconductor layer due to the driving of an element can be dissipated to the semiconductor substrate. The geometry of the protrusive semiconductor layer of the Fin type FET may be the geometry of substantially a rectangular parallelepiped depending on the machining accuracy, but may be a geometry deviated from a rectangular parallelepiped within the bounds of obtaining a desired element characteristic.

In the Fin type FET in the present invention, the gate electrode extends from the upper part of the protrusive semiconductor layer to facing opposite side surfaces so as to straddle the protrusive semiconductor layer, and the gate insulating film is interposed between the gate electrode and the protrusive semiconductor layer. An impurity is introduced into a portion of the protrusive semiconductor layer below the gate electrode in a relatively low concentration according to a predetermined threshold voltage, and a channel is formed by application of a voltage to the gate electrode. The insulating film interposed between each side surface (surface vertical to a substrate plane) of the protrusive semiconductor layer and the gate electrode is made to function as a gate insulating film, whereby channels can be formed on facing opposite side surfaces of the protrusive semiconductor layer. By providing a thick cap insulating film between the upper surface of the protrusive semiconductor layer and the gate electrode, a configuration allowing no channel to be formed on the upper surface of the protrusive semiconductor layer can be achieved. By providing an insulating film as thin as the gate insulating film provided on the side surface between the upper surface of the protrusive semiconductor layer and the gate electrode, a configuration allowing a channel on the upper surface of the protrusive semiconductor layer can be achieved. Here, the direction of a channel length is a longitudinal direction of the protrusive semiconductor layer 303, namely the direction of a gate length L. The source/drain region 306 is normally constituted by a diffusion layer with a high-concentration impurity introduced in portions of the protrusive semiconductor layer 303 on both sides of the gate electrode. Alternatively, the source/drain region may be composed of a metal to form a so-called schottky source/drain transistor.

The Fin type FET in the present invention may have a so-called multi-structure in which a plurality of protrusive semiconductor layers are arranged in parallel in one transistor, and a gate electrode is formed of a conductor wiring provided so as to straddle the protrusive semiconductor layers. An element structure associated with each protrusive semiconductor layer may be a structure similar to that described previously. The widths W (parallel to a substrate plane and vertical to the direction of the channel length) ate preferably mutually equal in terms of uniformity of element characteristics and processing accuracy.

The Fin type FET in the present invention preferably has main channels formed on facing opposite side surfaces of the protrusive semiconductor layer, and the width W of the protrusive semiconductor layer below the gate electrode is preferably a width such that the semiconductor layer is fully depleted by depletion layers formed opposite side surfaces thereof at the time of operation. Such a configuration is advantageous for improvement of a cutoff characteristic and carrier mobility and reduction of a substrate floating effect. For the element structure allowing such a configuration to be obtained, the width W of the protrusive semiconductor layer below the gate electrode is preferably equal to or less than twice as large as the height H of the semiconductor layer, or equal to or less than the gate length L. Specifically, the width W of the protrusive semiconductor layer below the gate electrode is set to preferably 5 nm or greater, more preferably 10 nm or greater in terms of processing accuracy and strength, while the width W is set to preferably 60 nm or less, more preferably 30 nm or less in terms of setting a channel made on the side surface of the semiconductor layer to a dominant channel and obtaining a fully depleted structure.

For specific dimension and the like of the Fin type FET in the present invention, for example, the width W of the protrusive semiconductor layer may be set in the range of 5 to 100 nm, the height H of the protrusive semiconductor layer may be set in the range of 20 to 200 nm, the gate length L may be set in the range of 10 to 100 nm, the thickness of the gate insulating film may be in the range of 1 to 5 nm (for $SiO_2$), the impurity concentration of the channel forming region may be set in the range of 0 to $1\times10^{19}$ cm$^{-3}$ and the impurity concentration of the source/drain region may be set in the range of $1\times10^{19}$ to $1\times10^{21}$ cm$^{-3}$ as appropriate. In this connection, the height H of the protrusive semiconductor layer refers to a length, in a direction vertical to a substrate plane, of the semiconductor layer portion protruding upward with respect to the surface of the insulating film. The channel forming region refers to a portion of the protrusive semiconductor layer below the gate electrode.

In the element structure described above, the material of the insulating film is not specifically limited as long as it has a desired insulation characteristic, and such materials may include, for example, $SiO_2$, $Si_3N_4$, AlN, metal oxides such as alumina and organic insulating materials.

For the protrusive semiconductor layer and the semiconductor substrate of the Fin type FET, monocrystalline silicon may be suitably used.

For the material of the gate electrode in the present invention, a conductor having a desired conductivity and a work function may be used, and such materials include, for example, impurity-introduced semiconductors such as polycrystalline silicon, polycrystalline SiGe, polycrystalline Ge and polycrystalline SiC in which an impurity is introduced, metals such as Mo, W and Ta, metal nitrides such as TiN and WN, silicide compounds such as cobalt silicide, nickel silicide, platinum silicide and erbium silicide. For the structure of the gate electrode, laminated structures such as a laminated film of a polycrystalline silicon film and a metal film, a laminated film of metal films and a laminated film of a polycrystalline silicon film and a silicide film may be used in addition to single-layer films.

For the gate insulating film in the present invention, a $SiO_2$ film and a SiON film may be used, and in addition, a so-called high-dielectric insulating film (High-K film) may be used. High-K films may include, for example, metal oxide films such as a $Ta_2O_5$ film, an $Al_2O_3$ film, an $La_2O_3$ film, an $HfO_2$ film and a $ZrO_2$ film and complex metal oxides represented by composition formulas of HfSiO, ZrSiO, HfAlO, ZrAlO and the like. The gate insulating film may have a laminated structure, and such laminated structures may include, for example, a laminated film prepared by forming a silicon-containing oxide film of $SiO_2$, HfSiO or the like on a semiconductor layer of silicon or the like, and providing a High-K film on the layer.

The main feature of the semiconductor device of the present invention comprising the Fin type FET described above is that the semiconductor device has, in a semiconductor substrate region isolated from another element forming region by an element isolation insulating film buried in a trench (groove) provided on a semiconductor substrate, a substrate flat surface formed by digging to a depth shallower than the bottom surface of the trench and deeper than the upper surface of the semiconductor substrate, and a semiconductor raised portion protruding with respect to the substrate flat surface and formed integrally with the semiconductor substrate, and a Fin type FET comprising a protrusive semiconductor layer constituted by the semiconductor raised portion is formed. On the substrate flat surface is provided an insulating layer so as to isolate semiconductor raised portions, and a portion protruding with respect to the upper surface of the insulating layer in the semiconductor raised portion is used as the protrusive semiconductor layer of the Fin type FET.

According to this structure, even when a deep trench for element isolation is formed on the semiconductor substrate, the semiconductor raised portion formed on the same semiconductor substrate can be formed in a necessary and sufficient size, and the aspect ratio of the semiconductor raised portion can be reduced. Therefore, the semiconductor substrate can be processed with high accuracy, and a highly reliable semiconductor device can be provided. Since the semiconductor substrate can be processed with high accuracy, a plurality of protrusive semiconductor layers can be mutually closely arranged, namely a gap between the protrusive semiconductor layers can be narrowed, and a highly reliable and dense semiconductor device can be provided. While the protrusive semiconductor layer of the Fin type FET can be thus formed in a desired size and pattern, the trench for element isolation can be formed sufficiently deeply, and the element isolation insulating film buried in the trench can be formed sufficiently thickly. Therefore, occurrence of a parasitic resistance in the element isolation insulating film region (isolation region) can be suppressed, and a semiconductor device having an excellent element characteristic can be provided.

Figure 5:
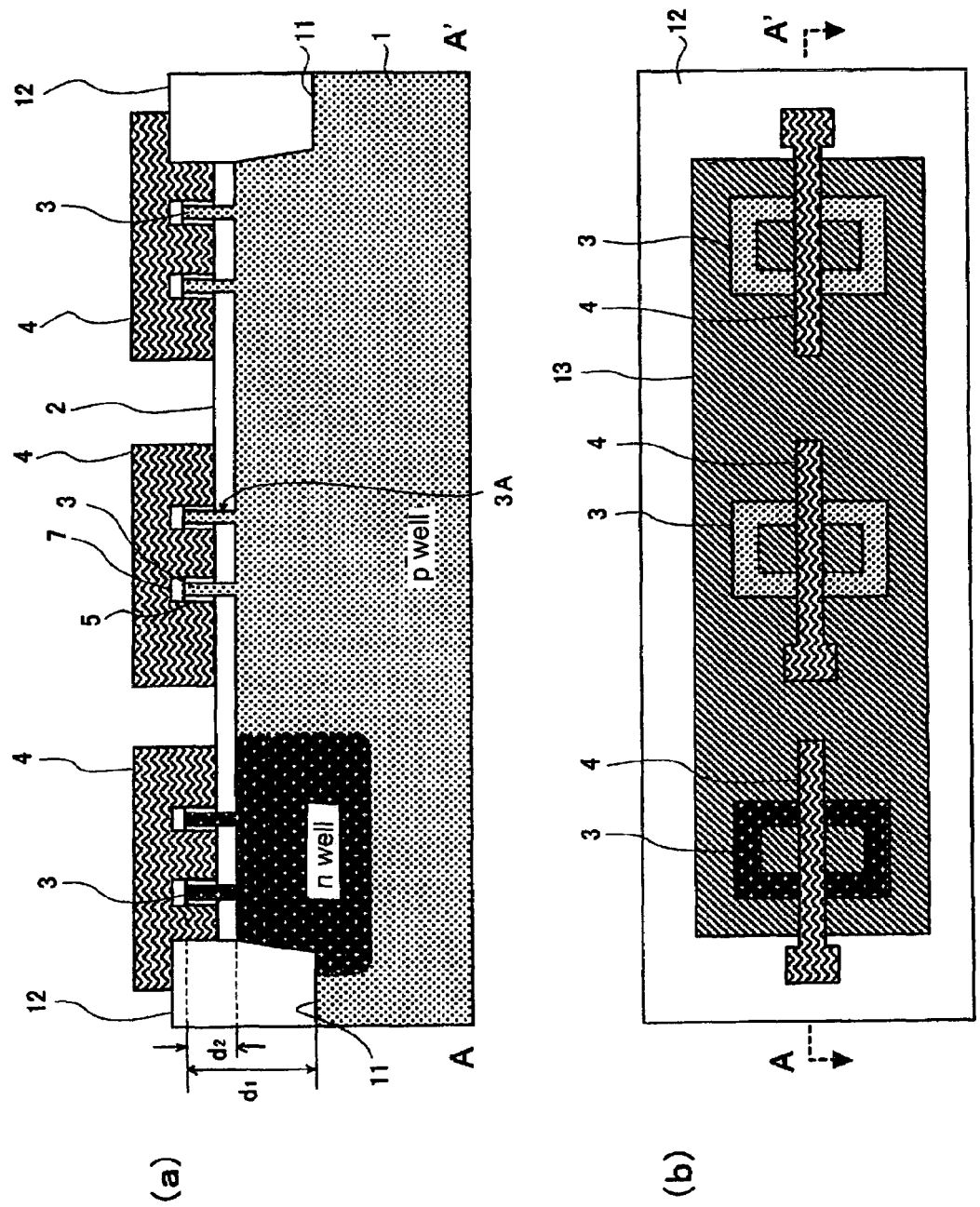
FIGS. 5(a) and 5(b) are explanatory views of a semiconductor device of the present invention.

One embodiment of the semiconductor device comprising a Fin type FET is shown in FIGS. 5(a) and 5(b). FIG. 5(a) is a sectional view taken along line A-A' of FIG. 5(b), and FIG. 5(b) is a partial plan view. In the figure, reference numeral 1 denotes a semiconductor substrate, reference numeral 2 denotes a Fin isolation insulating film, reference numeral 3 denotes a protrusive semiconductor layer, reference symbol 3A denotes a semiconductor raised portion, reference numeral 4 denotes a gate electrode, reference numeral 5 denotes a gate insulating film, reference numeral 7 denotes a cap insulating film, reference numeral 11 denotes a trench for element isolation, and reference numeral 12 denotes a element isolation insulating film. In this connection, in FIG. 5(*b*), a region 13 isolated by the element isolation insulating film 12 is shown by slant lines and at the same time, the position of the protrusive semiconductor layer 3 is shown.

The trench for element isolation 11 and the element isolation insulating film 12 buried in the trench are formed on the semiconductor substrate 1, and a plurality of Fin type FETs are formed in the semiconductor region 13 isolated by the element isolation insulating film 12. The upper surface of the semiconductor region 13 is formed by digging to a depth shallower than the bottom surface of the trench 11 for element isolation and deeper than the upper surface of the semiconductor substrate. The semiconductor raised portion 3A protruding with respect to the upper surface of the semiconductor region 13 is provided integrally with the semiconductor substrate 1. The semiconductor raised portions are isolated by the Fin isolation insulating film 2 provided on the upper surface of the semiconductor region 13, and a portion protruding upward from the Fin isolation insulating film 2 forms the protrusive semiconductor layer 3 of the Fin type FET. The gate electrode 4 is provided on the gate insulating film 5 and the cap insulating film 7 so as to straddle the protrusive semiconductor layer 3, and source and drain regions are provided in portions of the protrusive semiconductor layer on opposite sides of the gate electrode 4. In this embodiment, an example of using a Fin type FET having two protrusive semiconductor layers in one transistor is shown.

The depth of the trench for element isolation 11 and the height of the protrusive semiconductor layer 3 are appropriately set according to a desired element characteristic, but they are set preferably in the following range in terms of obtaining a desired effect by the invention of this application. Namely, the ratio of the length d2 in a direction vertical to the substrate flat surface from the upper surface of the shallow semiconductor region 13 to the upper end position of the protrusive semiconductor layer 3 to the length d1 in a direction vertical to the substrate flat surface from the bottom surface of the deep trench for element isolation 11 to the upper end position of the protrusive semiconductor layer 3 (d2/d1) is preferably 0.7 or less, more preferably 0.5 or less, especially preferably 0.4 or less. The ratio (d2/d1) is preferably 0.1 or greater, more preferably 0.2 or greater in terms of processing of the semiconductor substrate and the element characteristic of the Fin type FET. Typically, d1 may be set to 300 nm and d2 may be set to 100 nm, and the height H of the protrusive semiconductor layer (height from the surface of the Fin isolation insulating film 2 to the upper end of the protrusive semiconductor layer 3) may be set to 60 nm and the width W may be set to 20 nm. At this time, the thickness of the Fin isolation insulating film may be set to 40 nm and the gate length may be set to 40 nm.

Figure 6:
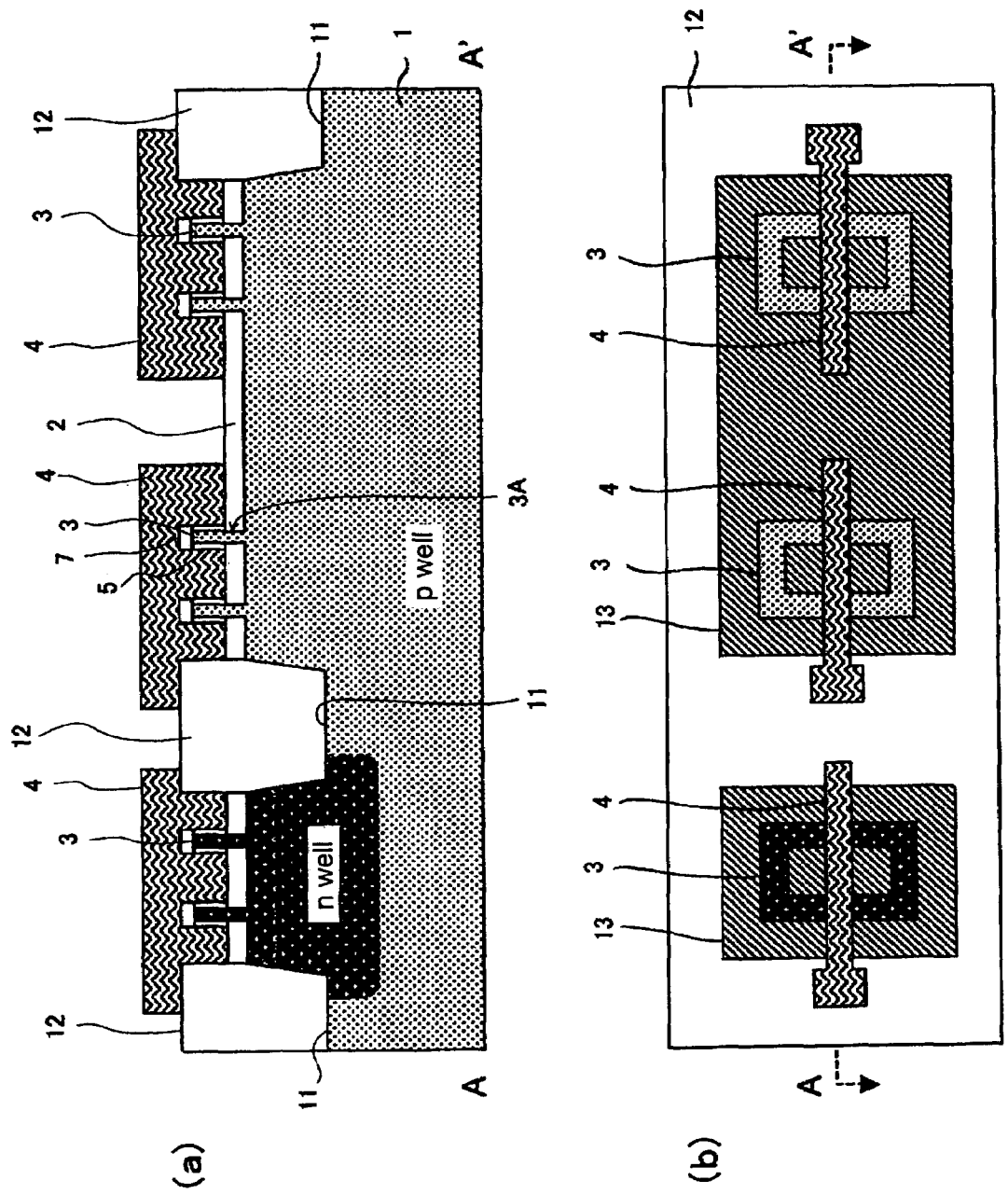
FIGS. 6(a) and 6(b) are explanatory views of a semiconductor device of the present invention.

Another embodiment of the semiconductor device of the present invention comprising a Fin type FET is shown in FIGS. 6(*a*) and 6(*b*). FIG. 6(*a*) is a sectional view taken along line A-A' of FIG. 6(*b*), and FIG. 6(*b*) is a partial plan view. In the figure, reference numeral 1 denotes a semiconductor substrate, reference numeral 2 denotes a Fin isolation insulating film, reference numeral 3 denotes a protrusive semiconductor layer, reference symbol 3A denotes a semiconductor raised portion, reference numeral 4 denotes a gate electrode, reference numeral 5 denotes a gate insulating film, reference numeral 7 denotes a cap insulating film, reference numeral 11 denotes a trench for element isolation, and reference numeral 12 denotes a element isolation insulating film. In this connection, in FIG. 6(*b*), a region 13 isolated by the element isolation insulating film 12 is shown by slant lines and at the same time, the position of the protrusive semiconductor layer 3 is shown.

In the configuration shown in FIGS. 6(*a*) and 6(*b*), the semiconductor device has a Fin type FET formed in an n well in one region isolated by the element isolation insulating film 12, and has a Fin type FET formed in a p well in the other region isolated by the element isolation 12. Namely, an element isolation region consisting of the deep trench 11 and the thick insulating film 12 is provided between Fin type FETs formed in wells of different conductivity types. According to this structure, the breakdown voltage of p-n separation can be improved. In this connection, in FIGS. 6(*a*) and 6(*b*), one Fin type FET is provided in an n well region surrounded by the element isolation insulating film, but a plurality of Fin type FETs may be provided in the n well region.

Figure 7:
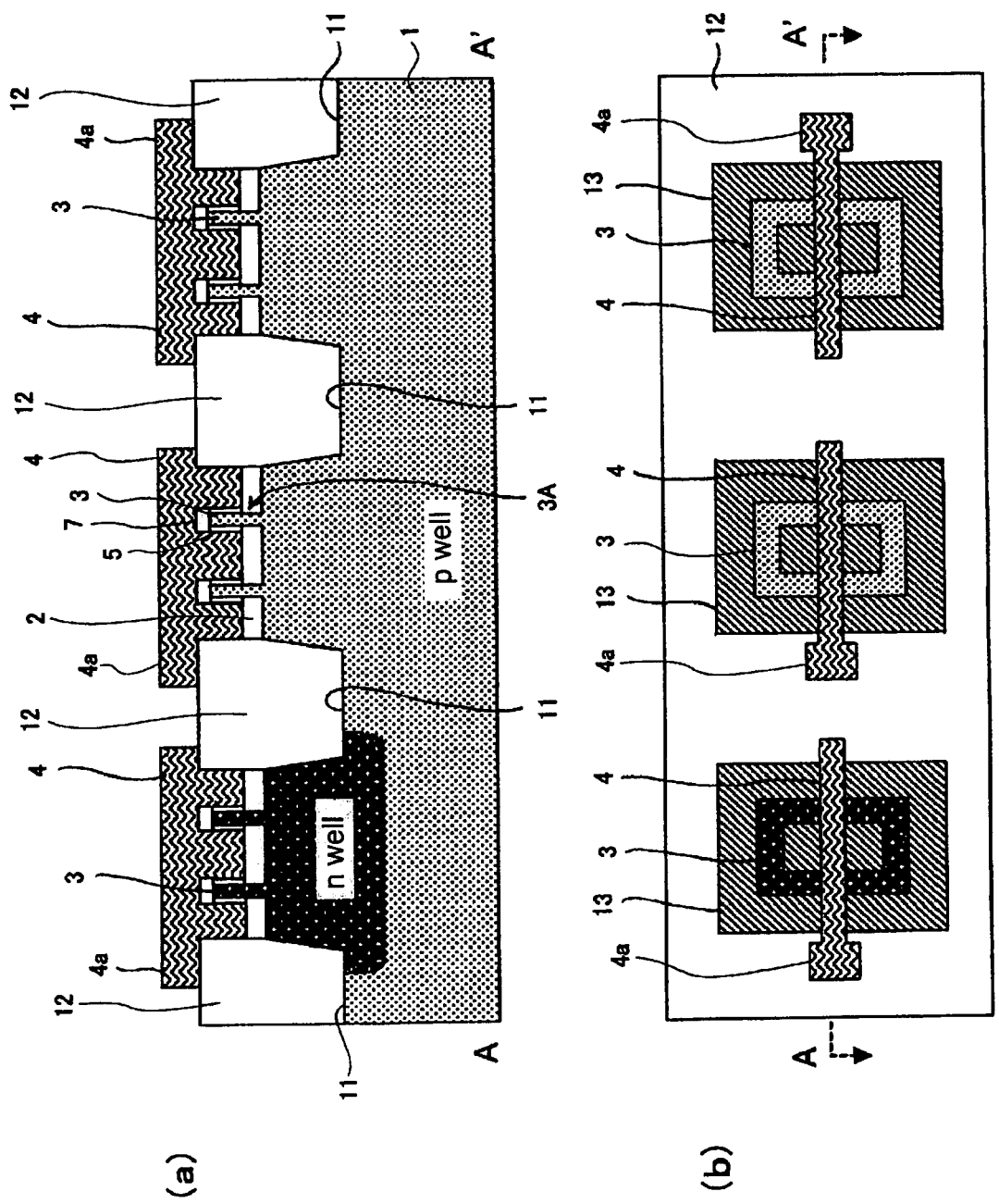
FIGS. 7(a) and 7(b) are explanatory views of a semiconductor device of the present invention.

Another embodiment of the semiconductor device of the present invention comprising a Fin type FET is shown in FIGS. 7(*a*) and 7(*b*). FIG. 7(*a*) is a sectional view taken along line A-A' of FIG. 7(*b*), and FIG. 7(*b*) is a partial plan view. In the figure, reference numeral 1 denotes a semiconductor substrate, reference numeral 2 denotes a Fin isolation insulating film, reference numeral 3 denotes a protrusive semiconductor layer, reference symbol 3A denotes a semiconductor raised portion, reference numeral 4 denotes a gate electrode, reference numeral 5 denotes a gate insulating film, reference numeral 7 denotes a cap insulating film, reference numeral 11 denotes a trench for element isolation, and reference numeral 12 denotes a element isolation insulating film. In this connection, in FIG. 7(*b*), a region 13 isolated by the element isolation insulating film 12 is shown by slant lines and at the same time, the position of the protrusive semiconductor layer 3 is shown.

In the aforementioned configuration shown in FIGS. 5(*a*) and 5(*b*), a plurality of Fin type FETs are provided in the region 13 isolated by the element isolation insulating film 12, whereas in the configuration shown in FIGS. 7(*a*) and 7(*b*), one Fin type FET in each region 13 isolated by the element isolation insulating film 12. Namely, each Fin type FET is isolated by an element isolating portion consisting of the deep trench 11 and the thick insulating film 12. According to this configuration, the breakdown voltage of separation between transistors is improved and in addition, a pad 4a of the gate electrode of each transistor can be placed on the thick element isolation insulating film 12 buried in the deep trench, thus making it possible to reduce a gate parasitic capacitance.

In any of the configurations described above, a planar type FET in which a channel is formed in a direction of the substrate flat surface may be provided in an active region other than the region 13 provided with the Fin type FET. The upper surface of the substrate in the active region may be situated in a plane at a position same as the upper end position of the protrusive semiconductor layer 3.

The semiconductor device of the present invention having the configuration described above can be produced by the following methods.

PRODUCTION EXAMPLE 1

One example of a production method of the present invention will be described using the drawings. In this production example, by using a thermally oxidized film for a Fin isolation insulating film 2 between protrusive semiconductor layers 3, the thickness controllability of the Fin isolation insulating film can be improved as compared to a case of using a CVD-oxidized film.

First, a pad oxide film 21 and a mask nitride film 22 are deposited on a silicon substrate 1 by a CVD method or the like. The thickness of the pad oxide film is typically 5 nm to 20 nm, and the thickness of the mask nitride film is typically 50 nm to 200 nm. Since this mask nitride film is a stopper for chemical-mechanical polishing (CMP) carried out subsequently, the mask may be formed with a material other than a nitride film as long as this purpose can be achieved.

Next, a resist mask is formed by a lithography technique, and using this mask, the mask nitride film 22 and the pad oxide film 21 are etched. Thereafter, the silicon substrate is subjected to anisotropic etching such as dry etching to form a trench for element isolation 11 (FIGS. 8(a-1) and 8(a-2)). Etching of the silicon substrate may be carried out using the aforementioned resist mask as a mask, or may be carried out using a mask nitride film as a mask after removing the resist mask. The depth of etching of the silicon substrate is typically 100 nm to 400 nm.

Next, a $SiO_2$ film is deposited on the entire surface using a CVD method or the like, and subsequently, CMP is carried out using the mask nitride film 22 as a mask to flatten the $SiO_2$ film, whereby the element isolation insulating film 12 buried in the trench 11 is formed on the silicon substrate (FIGS. 8(b-1) and 8(b-2)).

Figure 8:
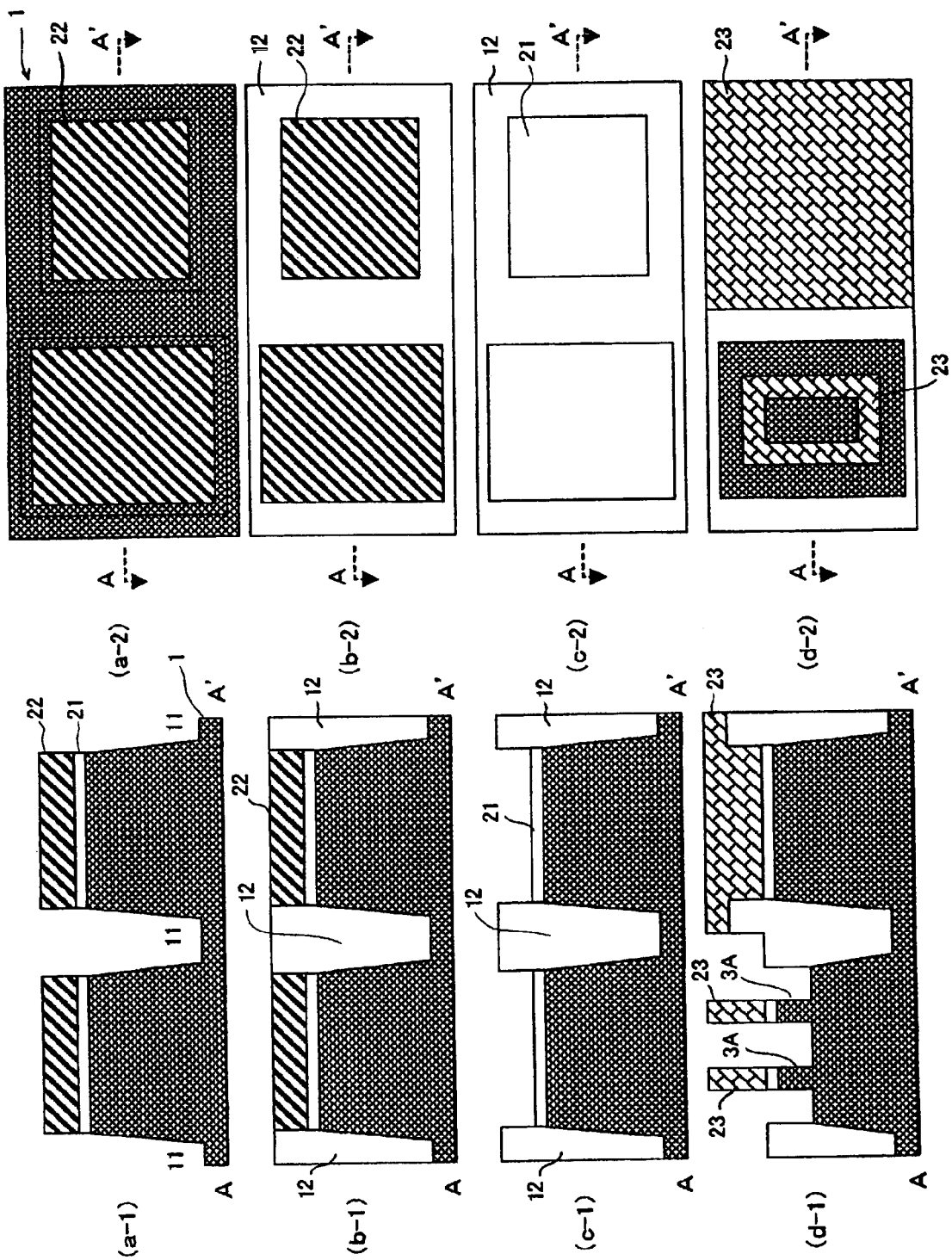
FIGS. 8(a-1), 8(a-2), 8(b-1), 8(b-2), 8(c-1), 8(c-2), 8(d-1) and 8(d-2) are explanatory views of a method for production of a semiconductor device according to the present invention.

Next, the mask nitride film 22 is selectively removed by wet etching with phosphoric acid or the like (FIGS. 8(c-1) and 8(c-2)). Although not shown in the figures, an nMOS region and a pMOS region may be subjected to ion implantation for formation of a well or ion implantation for adjustment of a threshold voltage after this step.

Next, a resist mask 23 is formed by a lithography technique. The resist mask is patterned so as to cover a region for formation of a semiconductor raised portion constituting a protrusive semiconductor layer and a pad portion for contact of a source/drain and so as to cover a planar region. Thereafter, anisotropic etching such as dry etching is carried out using the resist mask 23, and a semiconductor raised portion 3A constituting the projective semiconductor layer and the pad portion is formed (FIGS. 8(d-1) and 8(d-2)). The depth of etching of the silicon substrate at this time is made shallower than the trench for element isolation 11 formed earlier, whereby the aspect ratio of the semiconductor raised portion can be reduced, and a narrow protrusive semiconductor layer can be accurately formed. At this time, by using a condition in which the etching rate of $SiO_2$ is sufficiently low compared to silicon, etching of the element isolation insulating film 12 formed earlier can be suppressed.

Figure 9:
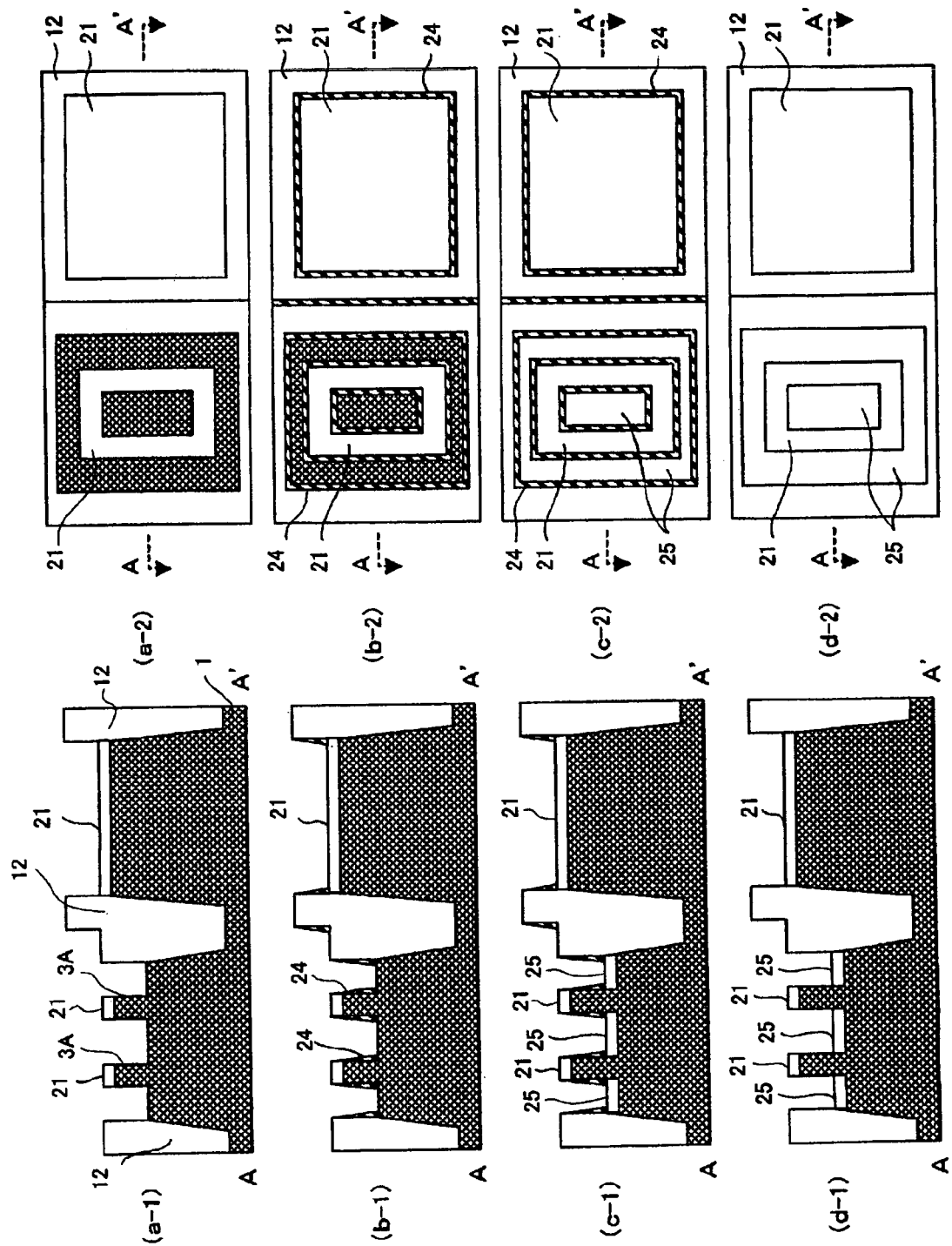
FIGS. 9(a-1), 9(a-2), 9(b-1), 9(b-2), 9(c-1), 9(c-2), 9(d-1) and 9(d-2) are explanatory views of the method for production of a semiconductor device according to the present invention.

Next, the resist mask 23 is removed (FIGS. 9(a-1) and 9(a-2)), and a nitride film is then deposited using a CVD method or the like. The thickness of the nitride film is typically 5 nm to 100 nm. The nitride film is intended for preventing thermal oxidization of the side surface of the semiconductor raised portion 3A, and the film may be a film composed of a material other than a nitride film as long as this purpose can be achieved. The nitride film is etched back by anisotropic etching to form a side wall nitride film 24 on the side surface of a step (FIGS. 9(b-1) and 9(b-2)).

Next, a thermally oxidized film 25 is formed on the silicon bottom surface between semiconductor raised portions 3A (FIGS. 9(c-1) and 9(c-2)). The thickness of the thermally oxidized film is typically 5 nm to 100 nm. If the thermally oxidized film is too thin, a parasitic capacitance between the gate and the substrate increases, and if the thermally oxidized film is too thick, the height of the protrusive semiconductor layer decreases, and therefore a sufficient current can be no longer obtained, or a bird's beak is formed below the nitride film.

Next, the side wall nitride film 24 is removed by wet etching using phosphoric acid or the like (FIGS. 9(d-1) and 9(d-2)).

Figure 10:
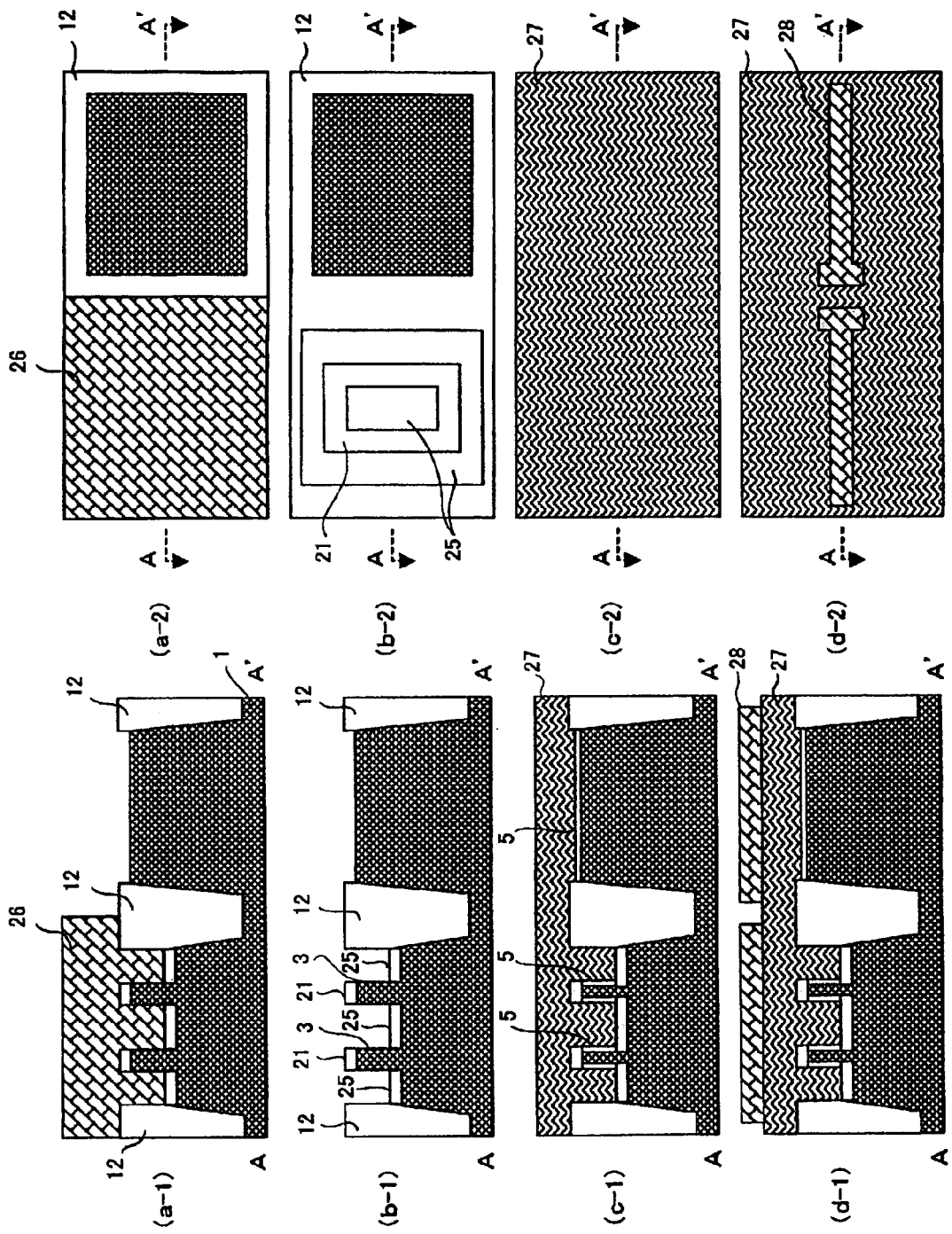
FIGS. 10(a-1), 10(a-2), 10(b-1), 10(b-2), 10(c-1), 10(c-2), 10(d-1) and 10(d-2) are explanatory views of the method for production of a semiconductor device according to the present invention.

Next, a resist mask 26 is formed on a Fin region by a lithography technique, and using this mask, the pad oxide film 21 on the planar region is removed (FIGS. 10(a-1) and 10(a-2)). At this time, a step between the Fin region on the isolation insulating film 12 and the planar region may also be removed. Thereafter, the resist mask 26 is removed to complete a protrusive semiconductor layer and an element isolation structure (FIGS. 10(b-1) and 10(b-2)). The thermally oxidized film 25 in the figure corresponds to the Fin isolation insulating film, the pad oxide film 21 corresponds to the cap insulating film, and a portion of the semiconductor raised portion 3A protruding from the thermally oxidized film 25 constitutes the protrusive semiconductor layer 3 of the Fin type FET.

Next, a gate oxide film 5 is formed on the side surface of the protrusive semiconductor layer and the active region of the planar region, and a polycrystalline silicon film 27 is then formed by a CVD method or the like (FIGS. 10(c-1) and 10(c-2)). Here, by a lithography technique and ion implantation, an nMOS region may be doped with an n type impurity (phosphorous, arsenic or the like) and a pMOS region may be doped with a p type impurity (boron or the like).

Figure 11:
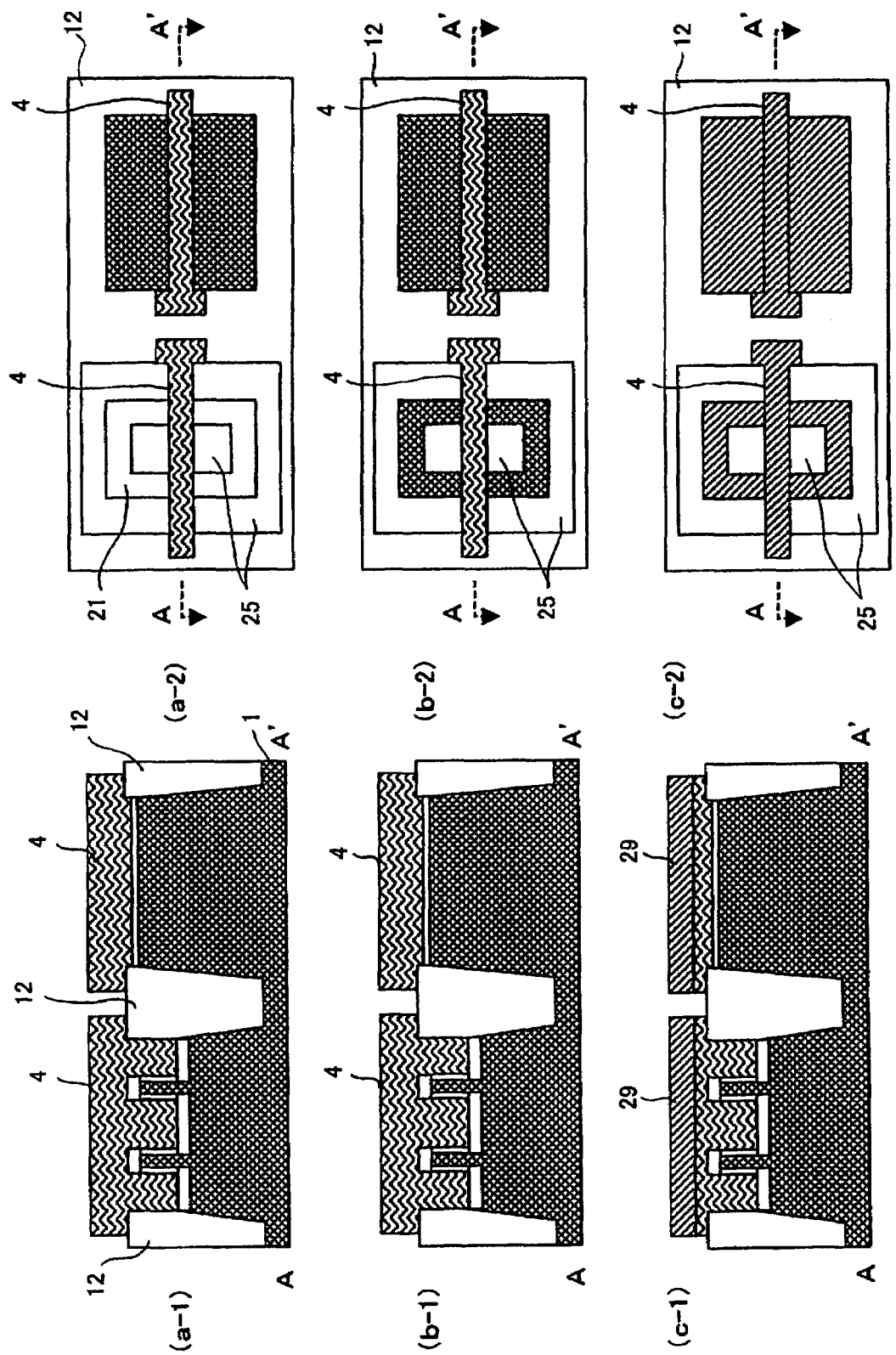
FIGS. 11(a-1), 11(a-2), 11(b-1), 11(b-2), 11(c-1) and 11(c-2) are explanatory views of the method for production of a semiconductor device according to the present invention.

Next, a resist mask 28 for forming a gate electrode is formed by a lithography technique (FIGS. 10(d-1) and 10(d-2)), and then using the resist mask 28, the polycrystalline silicon film 27 is patterned by anisotropic dry etching to form a gate electrode 4 (FIGS. 11(a-1) and 11(a-2)). After forming the gate electrode, the substrate flat surface is subjected to oblique ion implantation to introduce an impurity from the side surface of the protrusive semiconductor layer to form an extension dope region. Hollow implantation may be carried out before or after the ion implantation. Thereafter, although not shown in the figures, an insulating film such as an oxide film or a nitride film is deposited, and etch-back is carried out by anisotropic etching to form a gate side wall. Using the gate electrode and the gate side wall as a mask, an n type impurity (phosphorous, arsenic or the like) is ion-implanted into the nMOS region and a p type impurity (boron or the like) is ion-implanted into the pMOS region, and an activation treatment is carried out to form source and drain regions in the protrusive semiconductor layer. A so-called extension structure is formed by extension dope regions which do not overlap the source and drain regions. By making the extension dope region have a relatively low concentration, a so-called LDD (Lightly Doped Drain) structure is formed.

Next, the oxide film 21 on the semiconductor raised portion is removed by wet etching or dry etching (FIGS. 11(b-1) and 11(b-2)), a metal such as cobalt, titanium or nickel is then deposited and heat-treated to form a silicide layer 29 on the source and drain regions and the gate electrode (FIGS. 11(c-1) and 11(c-2)).

Figure 12:
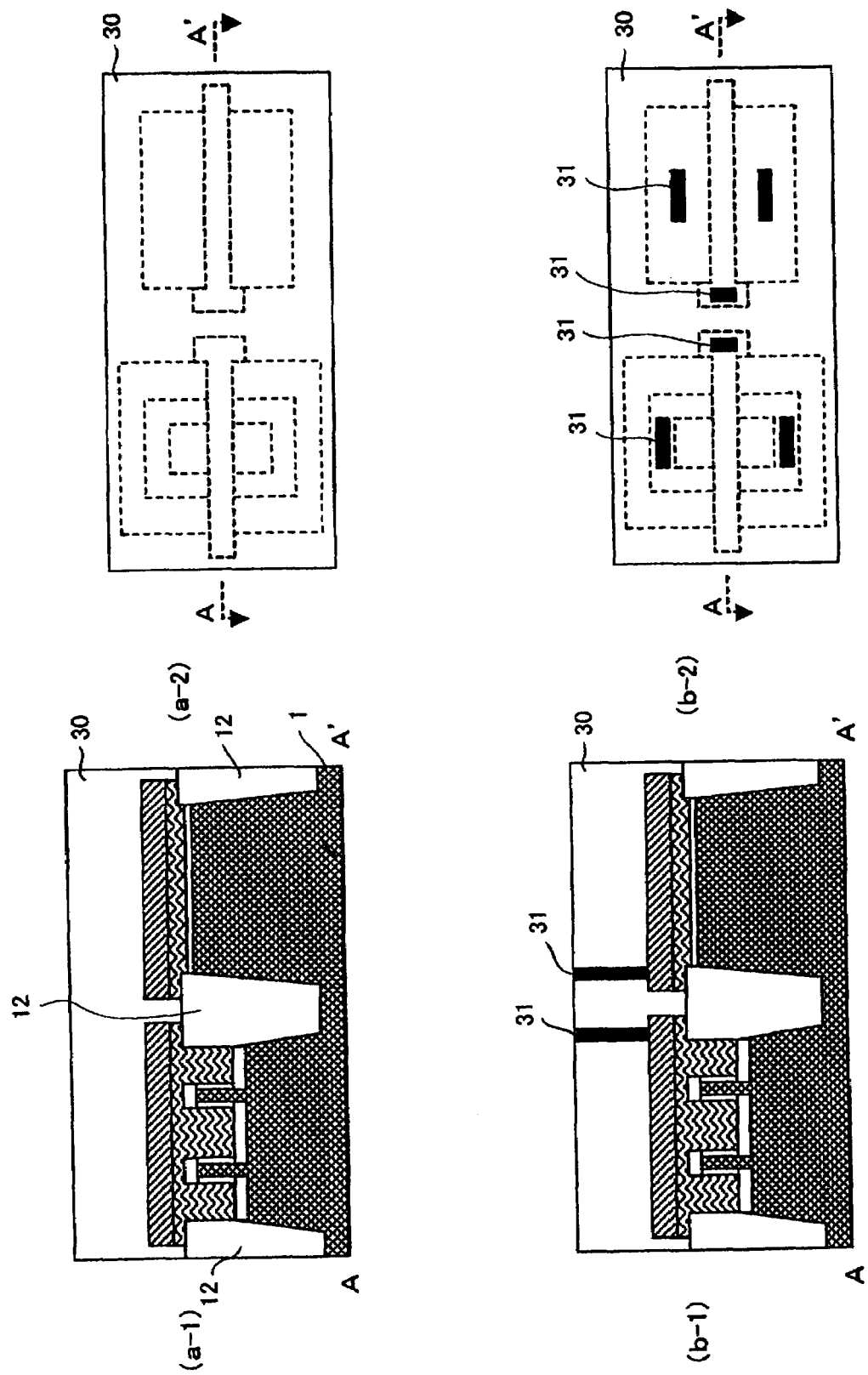
FIGS. 12(a-1), 12(a-2), 12(b-1) and 12(b-2) are explanatory views of the method for production of a semiconductor device according to the present invention.
Figure 13:
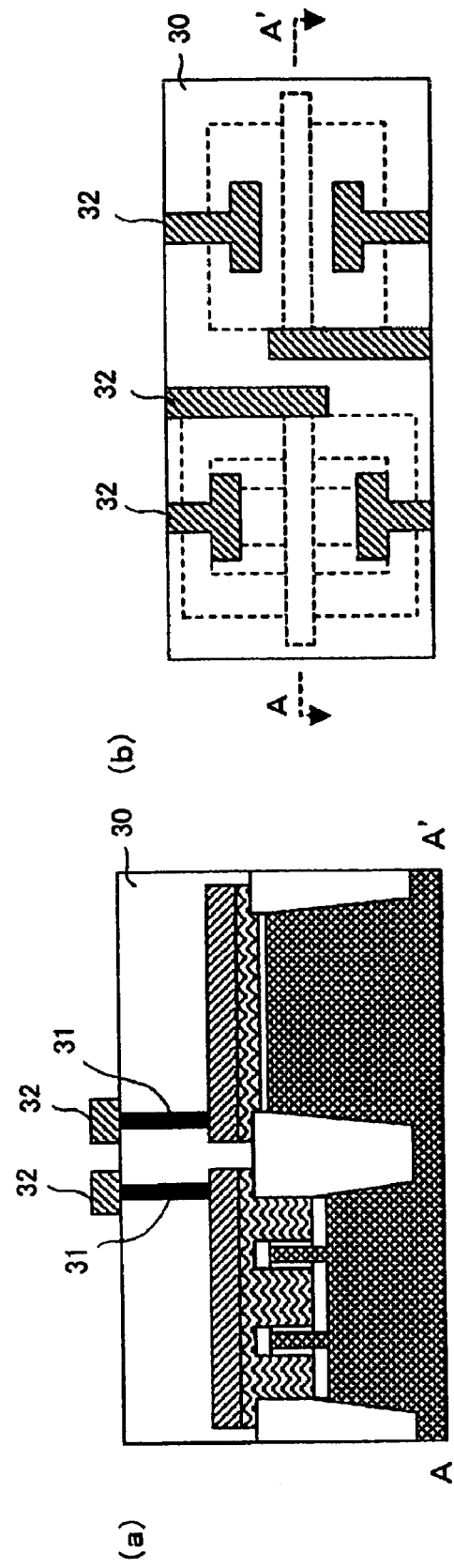
FIGS. 13(a) and 13(b) are explanatory views of the method for production of a semiconductor device according to the present invention.

Next, an interlayer insulating film 30 is formed on the entire surface, and flattened by CMP (FIGS. 12(a-1) and 12(a-2)), contact holes extending to a gate, a source and a drain are then formed, a conductive material is buried to form a contact plug 31 (FIGS. 12(b-1) and 12(b-2)), and a wiring 32 is then formed on the interlayer insulating film 30 (FIGS. 13(a) and 13(b)).

PRODUCTION EXAMPLE 2

Another example of the production method of the present invention will be described using the drawings. In this production example, a Fin isolation insulating film 2 between protrusive semiconductor layers 3 is formed by CVD, and the step of forming a side wall nitride film 24 in production example 1 may be omitted.

First, a pad oxide film 21 and a mask nitride film 22 are deposited on a silicon substrate 1 by a CVD method or the like. The thickness of the pad oxide film is typically 5 nm to 20 nm, and the thickness of the mask nitride film is typically 50 nm to 200 nm. Since the mask nitride film is a stopper of CMP which is carried out subsequently, the mask may be formed of a material other than a nitride film as long as this purpose can be achieved.

Next, a resist mask is formed by a lithography technique, and using this mask, the mask nitride film 22 and the pad oxide film 21 are etched. Thereafter, the silicon substrate is subjected to anisotropic etching such as dry etching to form a trench for element isolation 11 (FIGS. 14(a)). Etching of the silicon substrate may be carried out using the aforementioned resist mask as a mask, or may be carried out using a mask nitride film as a mask after detaching the resist mask. The depth of etching of the silicon substrate is typically 100 nm to 400 nm.

Next, a $SiO_2$ film is deposited on the entire surface using a CVD method or the like, and subsequently, CMP is carried out using the mask nitride film 22 as a mask to flatten the $SiO_2$ film, whereby the element isolation insulating film 12 buried in the trench 11 is formed on the silicon substrate (FIG. 14(b)). The steps described above are same as those of production example 1.

Figure 14:
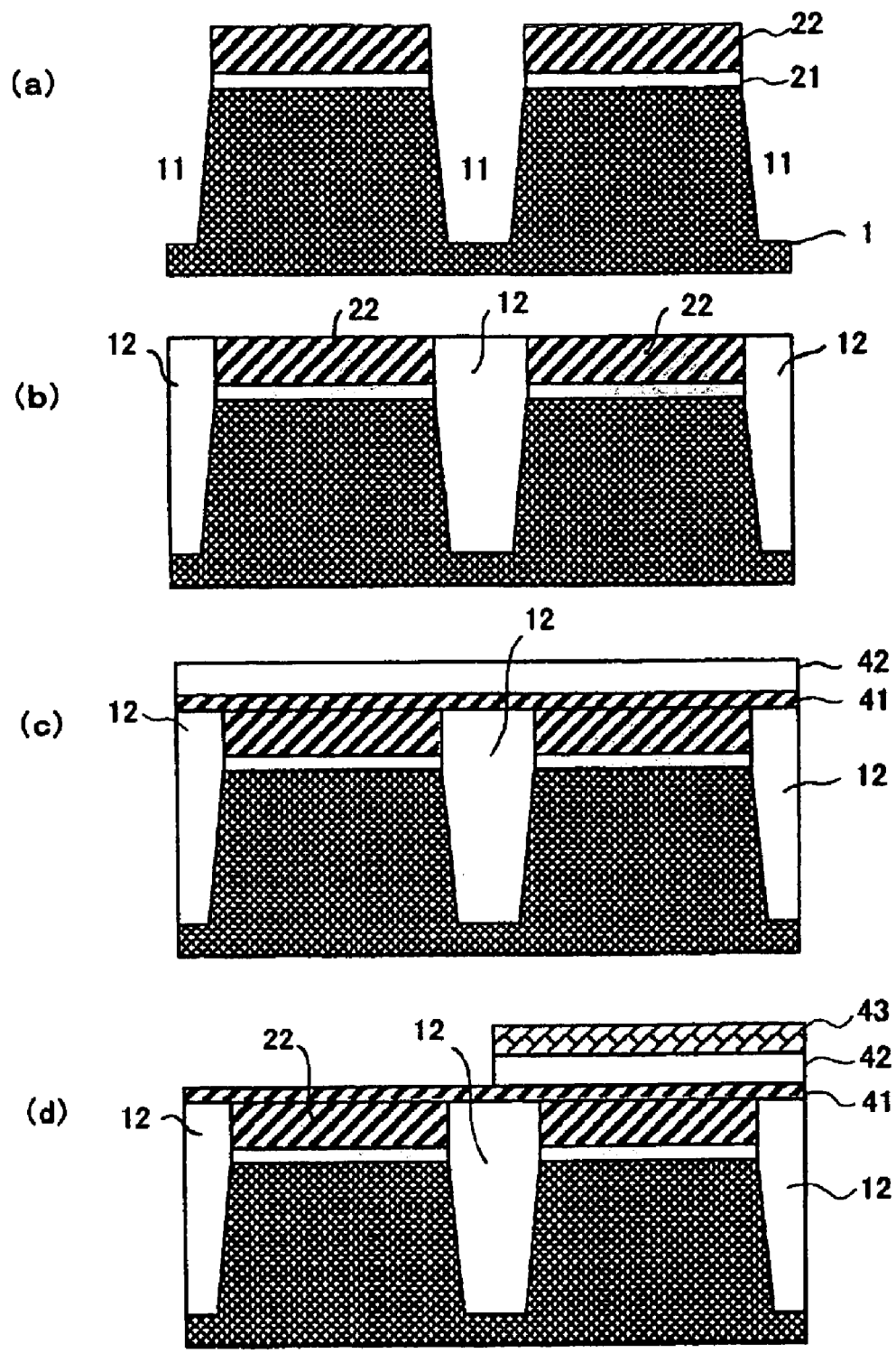
FIGS. 14(a) to 14(d) are explanatory views of a method for production of a semiconductor device according to the present invention.

Next, a mask nitride film 41 and a mask oxide film 42 are deposited by a CVD method or the like (FIG. 14(c)). The mask nitride film 41 is used as a protective film so that an element isolation insulating film 12 is not etched when the mask oxide film 42 is etched in a subsequent step shown in FIG. 14(d), and the thickness thereof is typically 5 nm to 100 nm. The mask oxide film 42 is used as a mask when mask nitride films 22 and 41 are wet-etched in a subsequent step shown in FIG. 15(a), and the thickness thereof is typically 5 nm to 100 nm.

Next, a resist mask 43 covering a planar region is formed by a lithography technique, and the mask oxide film 42 on a Fin region which is not covered with the resist mask 43 is removed by etching (FIG. 14(d)).

Figure 15:
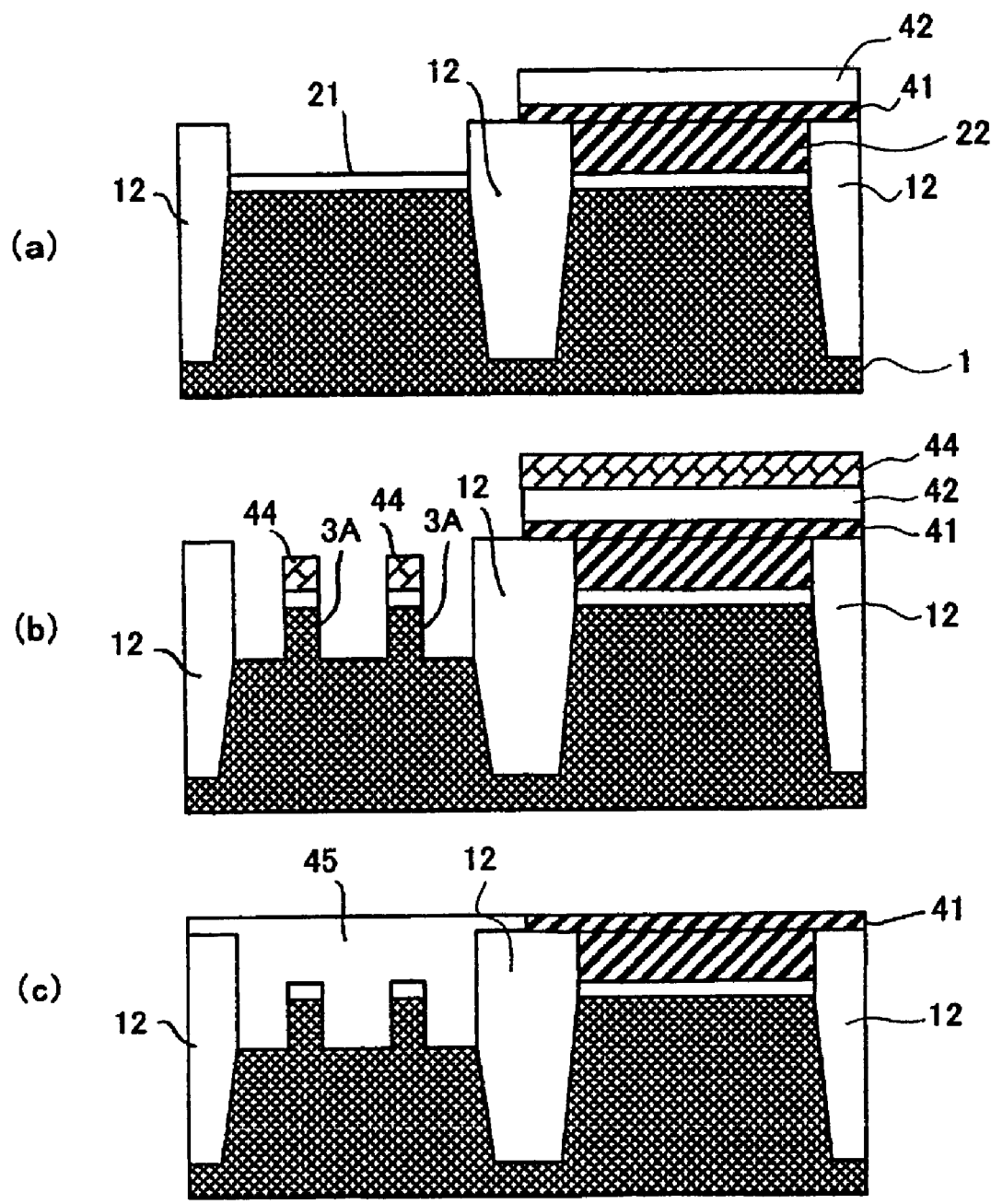
FIGS. 15(a) to 15(c) are explanatory views of the method for production of a semiconductor device according to the present invention.

Next, the mask nitride films 22 and 41 on the Fin region which is not covered with the mask oxide film 42 is selectively removed by wet etching with phosphoric acid or the like (FIG. 15(a)).

Next, a resist mask 44 is formed by a lithography technique. The resist mask is patterned so as to cover a region for formation of a semiconductor raised portion constituting a protrusive semiconductor layer and a pad portion for contact of a source/drain and so as to cover a planar region. Thereafter, anisotropic etching such as dry etching is carried out using the resist mask 44 to form a semiconductor raised portion 3A constituting the projective semiconductor layer and the pad portion (FIG. 15(b)). The depth of etching of the silicon substrate at this time is made shallower than the trench for element isolation 11 formed earlier, whereby the aspect ratio of the semiconductor raised portion can be reduced, and a narrow protrusive semiconductor layer can be accurately formed. At this time, by using a condition in which the etching rate of $SiO_2$ is sufficiently low compared to silicon, etching of the element isolation insulating film 12 formed earlier can be suppressed.

Next, the resist mask 44 is removed, and an oxide film for isolation 45 is then deposited using a CVD method or the like, and flattened by CMP (FIG. 15(c)).

Figure 16:
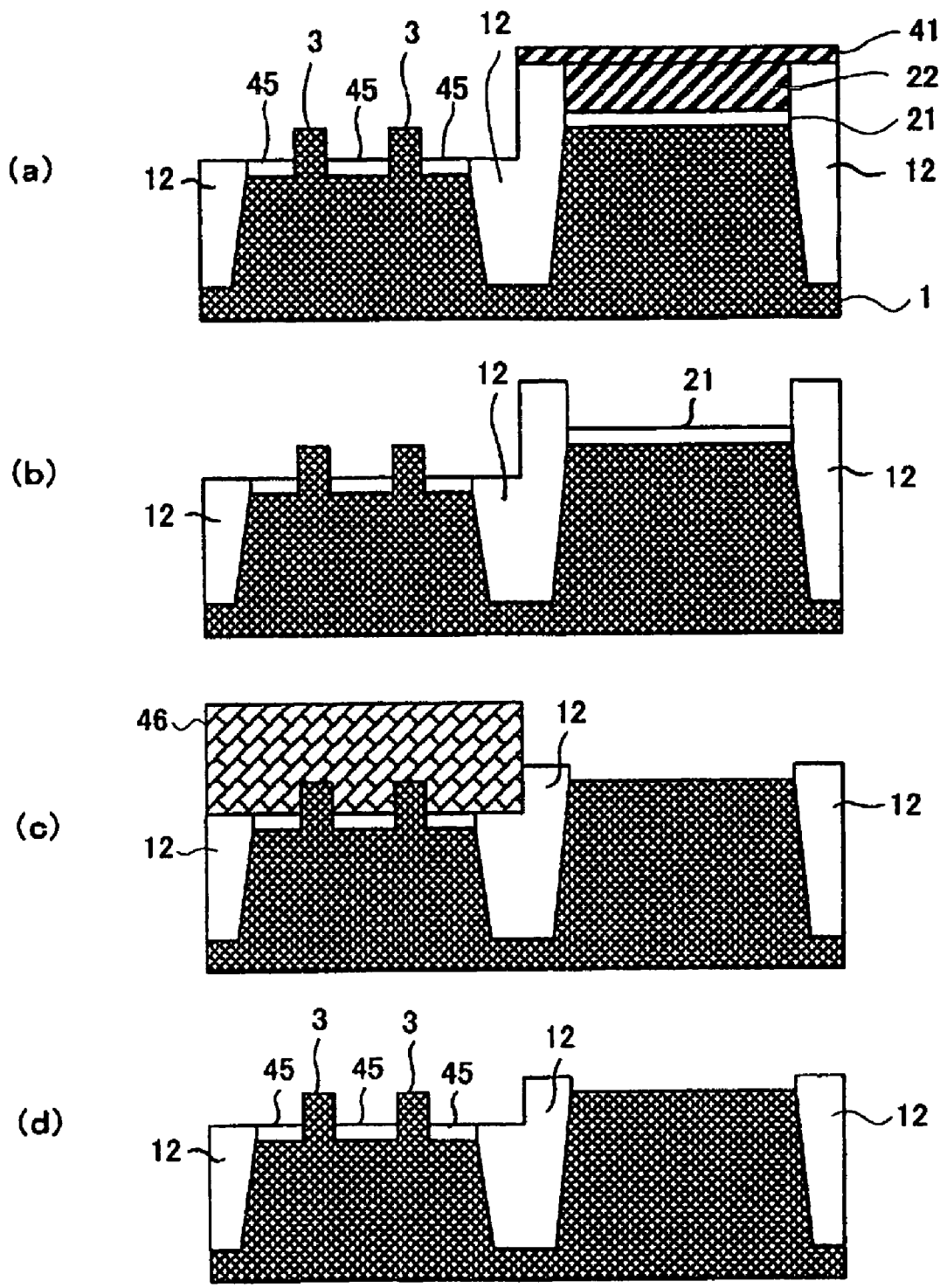
FIGS. 16(a) to 16(d) are explanatory views of the method for production of a semiconductor device according to the present invention.

Next, using the mask nitride film 41 on the planar region as a mask, the oxide film for isolation 45 on the Fin region is etched back (FIG. 16(a)). The amount of the etch-back determines the amount of protrusion of the semiconductor raised portion 3A from the isolation insulating film, namely the height H of the protrusive semiconductor layer 3.

Next, the mask nitride films 22 and 41 on the planar region are removed by wet etching (FIG. 16(b)). Although not shown in the figures, an nMOS region and a pMOS region may be subjected to ion implantation for formation of a well or ion implantation for adjustment of a threshold voltage after this step.

Next, a resist mask 46 is formed on the Fin region by a photolithography technique, and using the resist mask 46 as a mask, the oxide film 21 on the planar region is etched away (FIG. 16(c)). At the same time, the isolation insulating film 12 may be etched to reduce a difference in level between the Fin region and the isolation insulating film.

Next, the resist mask 46 is removed to complete a protrusive semiconductor layer and an element isolation structure (FIG. 16(d)). The oxide film 45 in the figure corresponds to the Fin isolation insulating film, and a portion of the semiconductor raised portion 3A protruding from the oxide film 45 constitutes the protrusive semiconductor layer 3 of the Fin type FET.

Figure 17:
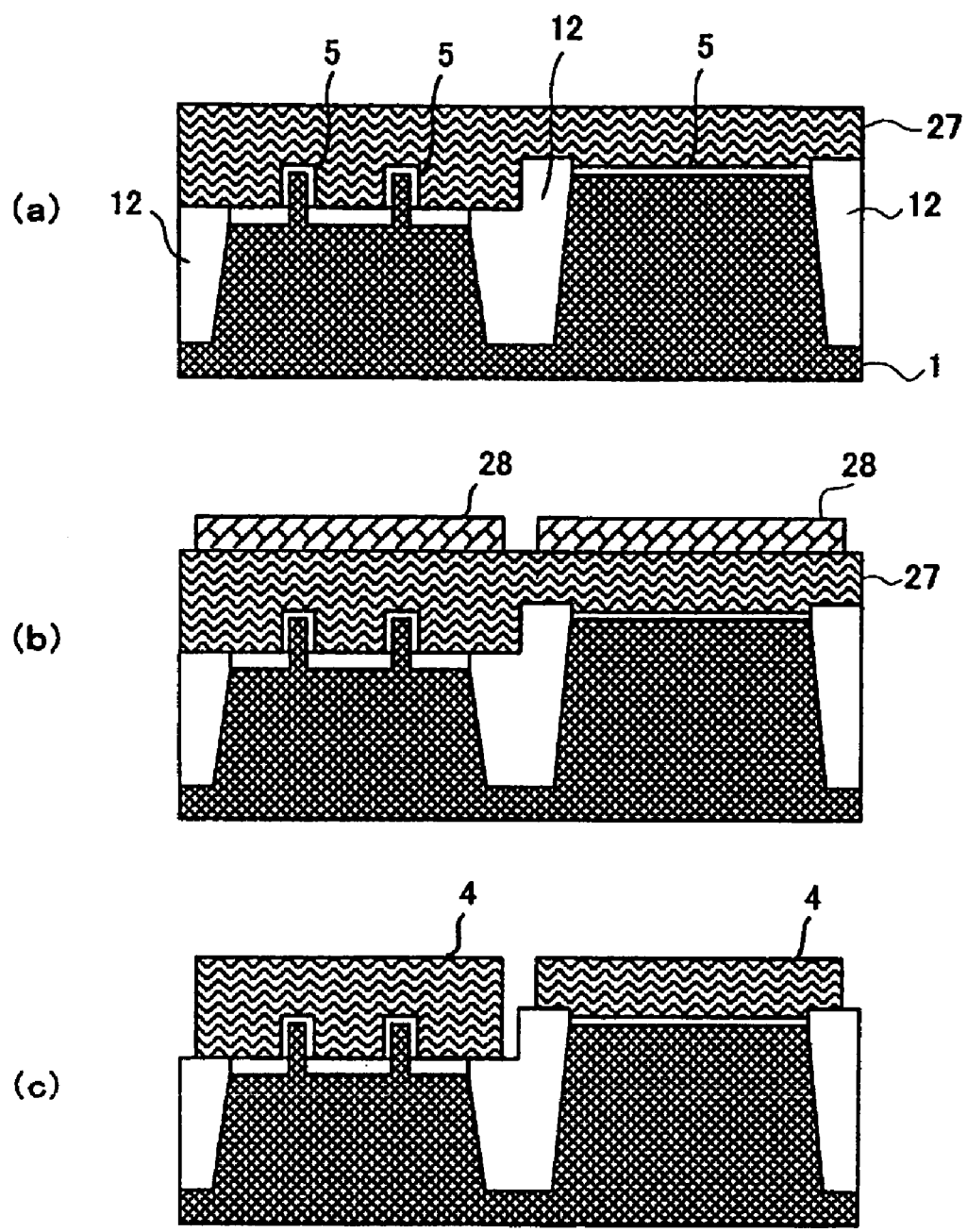
FIGS. 17(a) to 17(c) are explanatory views of the method for production of a semiconductor device according to the present invention.

Next, a gate oxide film is formed on the side surface of the protrusive semiconductor layer and the active region of the planar region, and a polycrystalline silicon film 27 is then formed by a CVD method or the like (FIG. 17(a)). Here, by a lithography technique and ion implantation, an nMOS region may be doped with an n type impurity (phosphorous, arsenic or the like) and a pMOS region may be doped with a p type impurity (boron or the like).

Next, a resist mask 28 for forming a gate electrode is formed by a lithography technique (FIG. 17(b)), and then using the resist mask 28, the polycrystalline silicon film 27 is patterned by anisotropic dry etching to form a gate electrode 4 (FIG. 17(c)). After forming the gate electrode, the substrate flat surface is subjected to oblique ion implantation to introduce an impurity from the side surface of the protrusive semiconductor layer to form an extension dope region. Hollow implantation may be carried out before or after the ion implantation. Thereafter, although not shown in the figures, an insulating film such as an oxide film or a nitride film is deposited, and etch-back is carried out by anisotropic etching to form a gate side wall. Using the gate electrode and the gate side wall as a mask, an n type impurity (phosphorous, arsenic or the like) is ion-implanted into the nMOS region and a p type impurity (boron or the like) is ion-implanted into the pMOS region, and an activation treatment is carried out to form source and drain regions on the protrusive semiconductor layer. A so-called extension structure is formed by extension dope regions which do not overlap the source and drain regions. By making the extension dope region have a relatively low concentration, a so-called LDD (Lightly Doped Drain) structure is formed.

Figure 18:
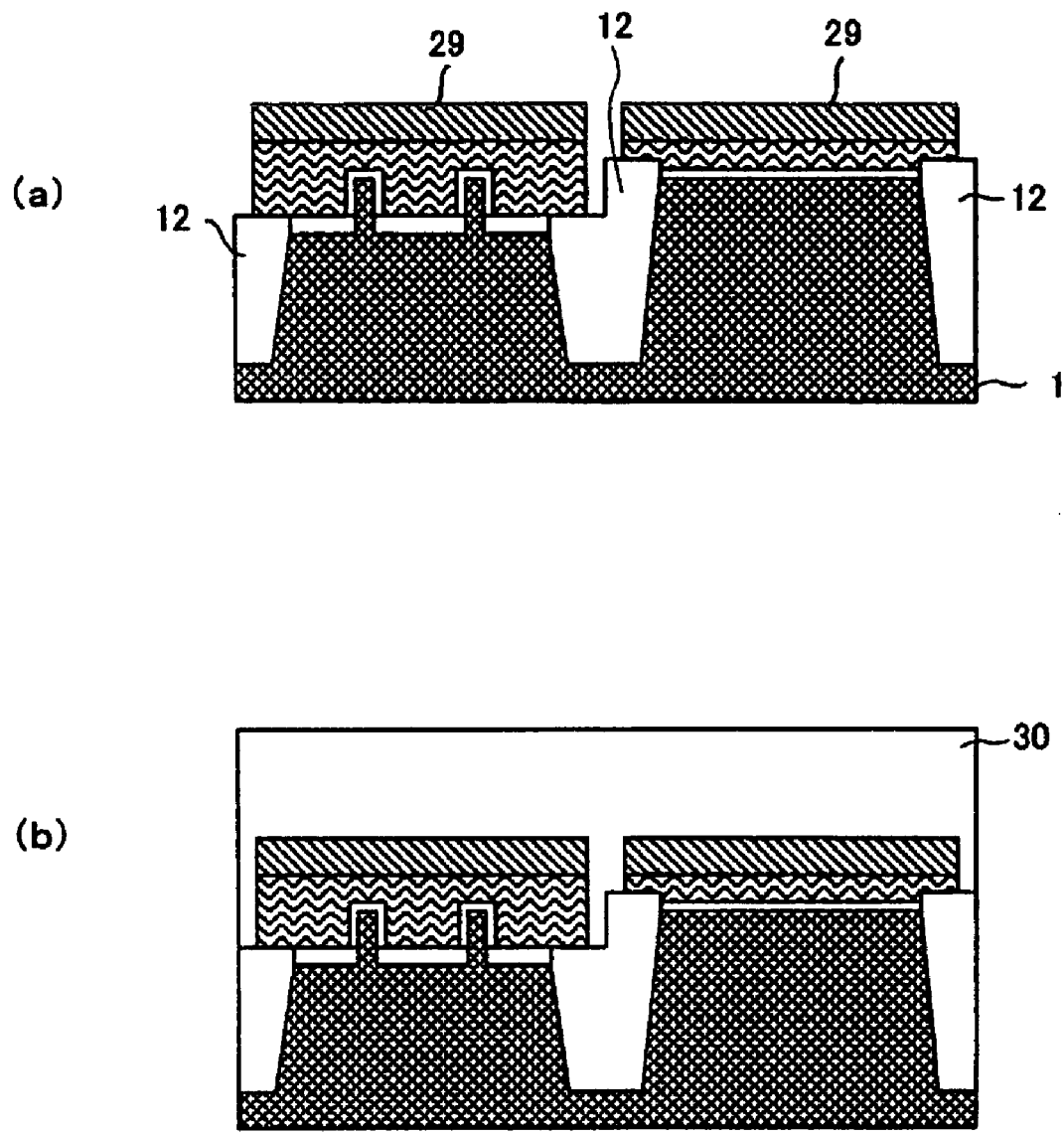
FIGS. 18(a) and 18(b) are explanatory views of the method for production of a semiconductor device according to the present invention.

Next, the oxide film on the semiconductor raised portion is removed by wet etching or dry etching, a metal such as cobalt, titanium or nickel is then deposited and heat-treated to form a silicide layer 28 on the source and drain regions and the gate electrode (FIG. 18(a)).

Figure 19:
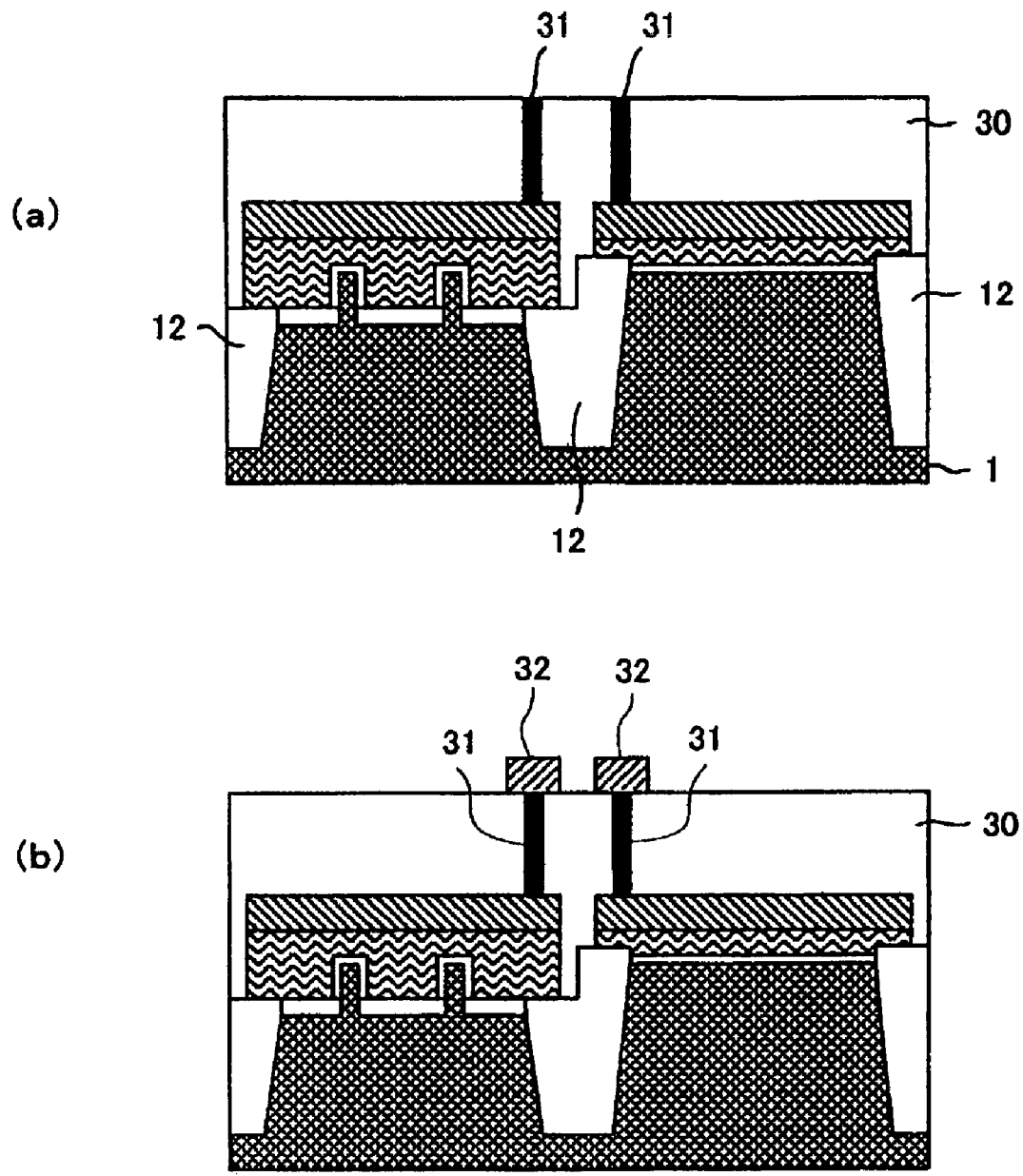
FIGS. 19(a) and 19(b) are explanatory views of the method for production of a semiconductor device according to the present invention.

Next, an interlayer insulating film 30 is formed on the entire surface, and flattened by CMP (FIG. 18(b)), contact holes extending to a gate, a source and a drain are then formed, a conductive material is buried to form a contact plug 31 (FIG. 19(a)), and a wiring 32 is then formed on the interlayer insulating film 30 (FIG. 19(b)).

PRODUCTION EXAMPLE 3

Another example of the production method of the present invention will be described using the drawings. In this production example, a Fin isolation insulating film 2 is formed by CVD as in production example 2, and the step of forming a side wall nitride film 24 in production example 1 may be omitted. This production example is different from production example 2 in that a step of removing a mask nitride film is not conducted, but when a silicon substrate is etched to form a semiconductor raised portion 3A, the mask nitride film is also etched. The aspect ratio increases by the thickness of the mask nitride film, but the number of steps can be reduced, and dishing at the time of CMP can be suppressed because there is a stopper on the semiconductor raised portion.

First, a pad oxide film 21 and a mask nitride film 22 are deposited on a silicon substrate 1 by a CVD method or the like. The thickness of the pad oxide film is typically 5 nm to 20 nm, and the thickness of the mask nitride film is typically 50 nm to 200 nm. Since the mask nitride film is a stopper of CMP which is carried out subsequently, the mask may be formed of a material other than a nitride film as long as this purpose can be achieved.

Next, a resist mask is formed by a lithography technique, and using this mask, the mask nitride film 22 and the pad oxide film 21 are etched. Thereafter, the silicon substrate is subjected to anisotropic etching such as dry etching to form a trench for element isolation 11 (FIG. 20(a)). Etching of the silicon substrate may be carried out using the aforementioned resist mask as a mask, or may be carried out using a mask nitride film as a mask after removing the resist mask. The depth of etching of the silicon substrate is typically 100 nm to 400 nm.

Next, a $SiO_2$ film is deposited on the entire surface using a CVD method or the like, and subsequently, CMP is carried out using the mask nitride film 22 as a mask to flatten the $SiO_2$ film, whereby the element isolation insulating film 12 buried in the trench 11 is formed on the silicon substrate (FIG. 20(b)). The steps described above are same as those of production examples 1 and 2.

Figure 20:
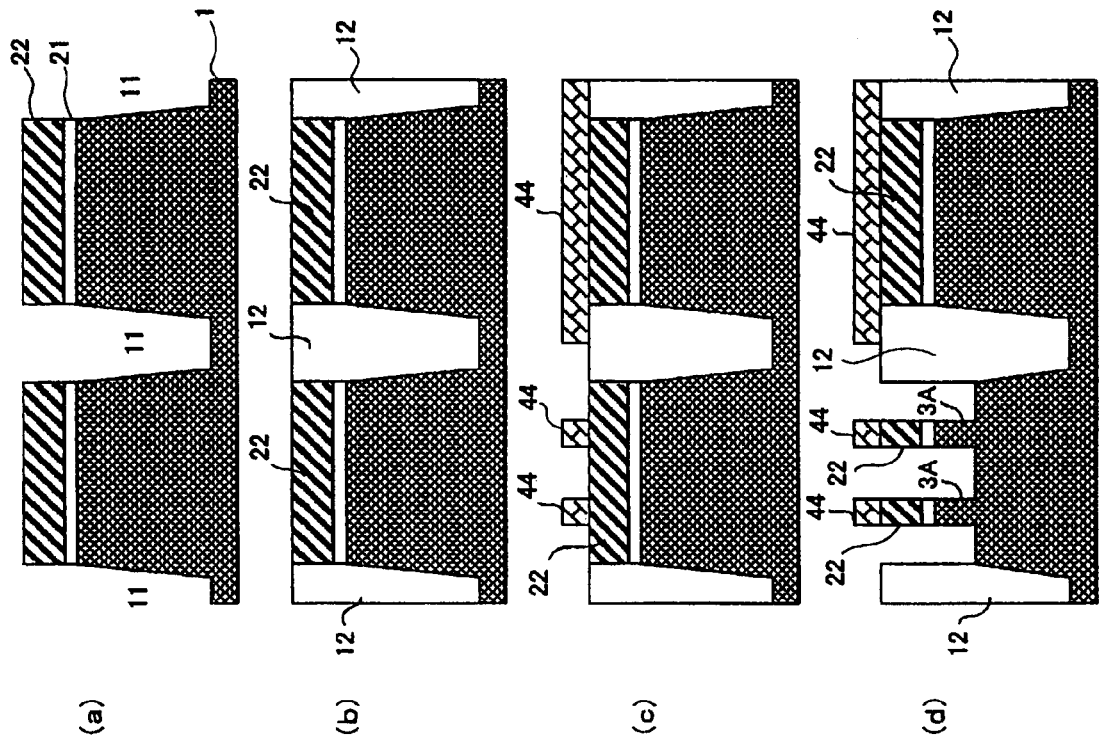
FIGS. 20(a) to 20(d) are explanatory views of a method for production of a semiconductor device according to the present invention.

Next, a resist mask 44 is formed by a lithography technique (FIG. 20(c)). The resist mask is patterned so as to cover a region for formation of a semiconductor raised portion constituting a protrusive semiconductor layer and a pad portion for contact of a source/drain and so as to cover a planar region. Thereafter, anisotropic etching such as dry etching is carried out using the resist mask 44 to pattern the mask nitride film 22 on the Fin region. Subsequently, using the resist mask 44 as a mask, or using the mask nitride film 22 as a mask after removing the resist mask 44, anisotropic etching of the semiconductor substrate is carried out to form a semiconductor raised portion 3A constituting the protrusive semiconductor layer and the pad portion (FIG. 20(d)). The depth of etching of the silicon substrate at this time is made shallower than the trench for element isolation 11 formed earlier, whereby the aspect ratio of the semiconductor raised portion can be reduced, and a narrow protrusive semiconductor layer can be accurately formed. At this time, by using a condition in which the etching rate of $SiO_2$ is sufficiently low compared to silicon, etching of the element isolation insulating film 12 formed earlier can be suppressed.

Figure 21:
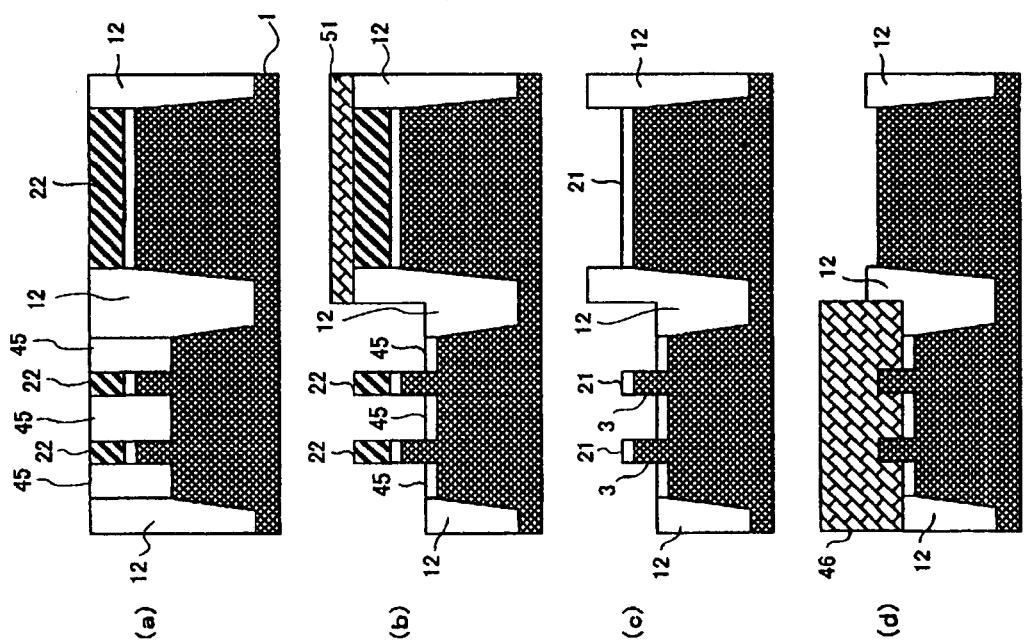
FIGS. 21(a) to 21(d) are explanatory views of the method for production of a semiconductor device according to the present invention.

Next, the resist mask 44 is removed, and an oxide film for isolation 45 is then deposited using a CVD method or the like, and flattened by CMP (FIG. 21(a)). At this time, the nitride film functioning as a stopper exists on the semiconductor raised portion 3A, and therefore dishing in the Fin region is prevented.

Next, a resist mask 51 is formed on the planar region by a lithography technique, and using the resist mask 51 and the mask nitride film 22 of the Fin region as a mask, the oxide film for isolation 45 in the Fin region is etched back (FIG. 21(b)). The amount of the etch-back determines the amount of protrusion of the semiconductor raised portion 3A from the isolation insulating film, namely the height H of the protrusive semiconductor layer 3.

Next, the resist mask and the mask nitride film are removed by wet etching (FIG. 21(c)). Although not shown in the figures, an nMOS region and a pMOS region may be subjected to ion implantation for formation of a well or ion implantation for adjustment of a threshold voltage after this step.

Next, a resist mask 46 is formed on the Fin region by a photolithography technique, and using the resist mask 46 as a mask, the oxide film 21 on the planar region is etched away (FIG. 21(d)). At the same time, the isolation insulating film 12 may be etched to reduce a difference in level between the Fin region and the isolation insulating film.

Figure 22:
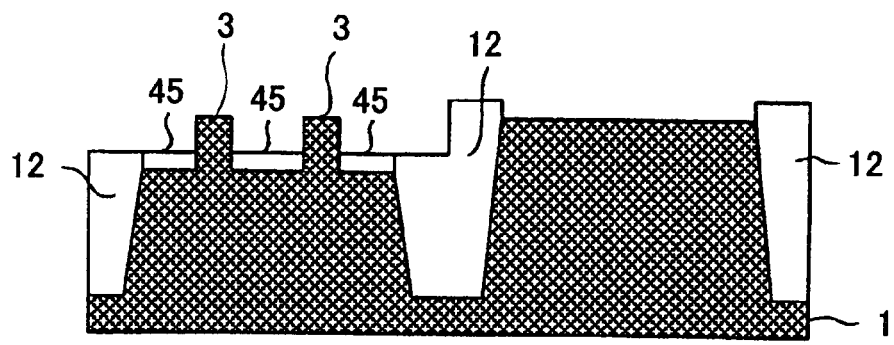
FIG. 22 is an explanatory view of the method for production of a semiconductor device according to the present invention.

Next, the resist mask 46 is removed to complete a protrusive semiconductor layer and an element isolation structure (FIG. 22). The oxide film 45 in the figure corresponds to the Fin isolation insulating film, and a portion of the semiconductor raised portion 3A protruding from the oxide film 45 constitutes the protrusive semiconductor layer 3 of the Fin type FET.

After the steps described above, a Fin type FET, an interlayer insulating film, a contact plug and a wiring can be formed in the same manner as in production examples 1 and 2.

PRODUCTION EXAMPLE 4

Another example of the production method of the present invention will be described using the drawings. In this production example, a Fin isolation insulating film 2 is formed by CVD as in production examples 2 and 3, and the step of forming a side wall nitride film 24 in production example 1 may be omitted. This production example is different from production example 3 in that when a silicon substrate is etched to form a semiconductor raised portion 3A, a mask nitride film is also etched in production example 3, whereas the silicon substrate is etched after the mask nitride film is removed in this production example. This production example is different from production example 2 in that removal of the mask nitride film of the Fin region before the step of etching the silicon substrate for forming the semiconductor raised portion 3A is performed by wet etching (phosphoric acid or the like) using an oxide film as a mask in production example 2, whereas it is performed by dry etching using a resist mask in this production example.

First, a pad oxide film 21 and a mask nitride film 22 are deposited on a silicon substrate 1 by a CVD method or the like. The thickness of the pad oxide film is typically 5 nm to 20 nm, and the thickness of the mask nitride film is typically 50 nm to 200 nm. Since the mask nitride film is a stopper of CMP which is carried out subsequently, the mask may be formed of a material other than a nitride film as long as this purpose can be achieved.

Next, a resist mask is formed by a lithography technique, and using this mask, the mask nitride film 22 and the pad oxide film 21 are etched. Thereafter, the silicon substrate is subjected to anisotropic etching such as dry etching to form a trench for element isolation 11 (FIG. 23(a)). Etching of the silicon substrate may be carried out using the aforementioned resist mask as a mask, or may be carried out using a mask nitride film as a mask after removing the resist mask. The depth of etching of the silicon substrate is typically 100 nm to 400 nm.

Next, a $SiO_2$ film is deposited on the entire surface using a CVD method or the like, and subsequently, CMP is carried out using the mask nitride film 22 as a mask to flatten the $SiO_2$ film, whereby the element isolation insulating film 12 buried in the trench 11 is formed on the silicon substrate (FIG. 23(*b*)). The steps described above are same as those of production example 1.

Figure 23:
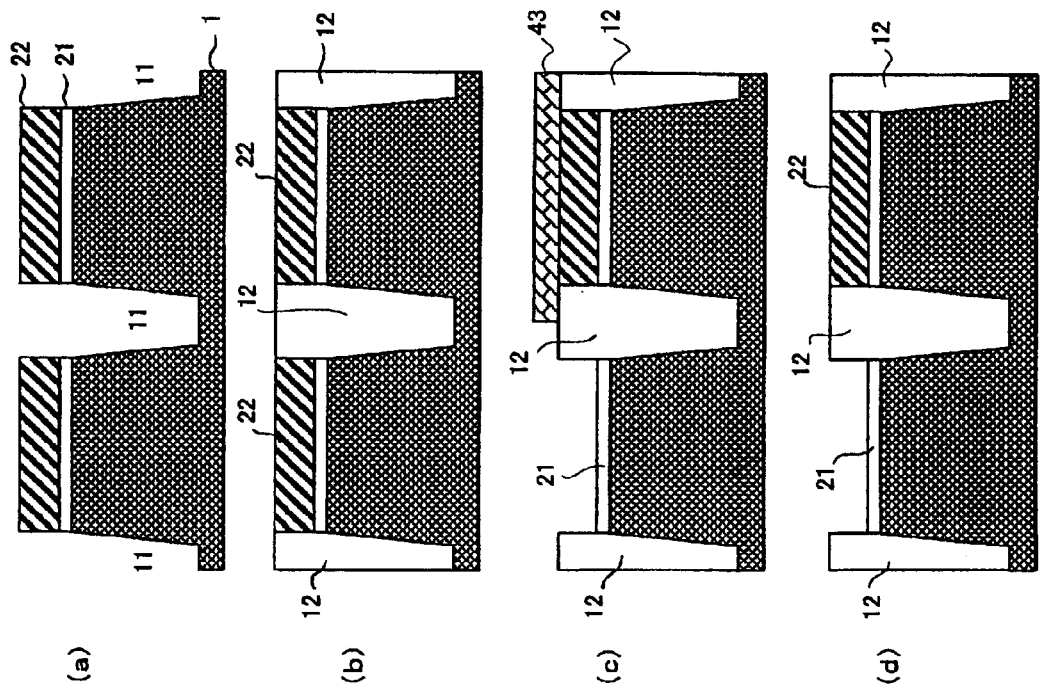
FIGS. 23(a) to 23(d) are explanatory views of a method for production of a semiconductor device according to the present invention.

Next, a resist mask 43 covering a planar region is formed by a lithography technique, and the mask nitride film 22 on a Fin region which is not covered with the resist mask 43 is removed by dry etching (FIG. 23(*c*)).

Figure 24:
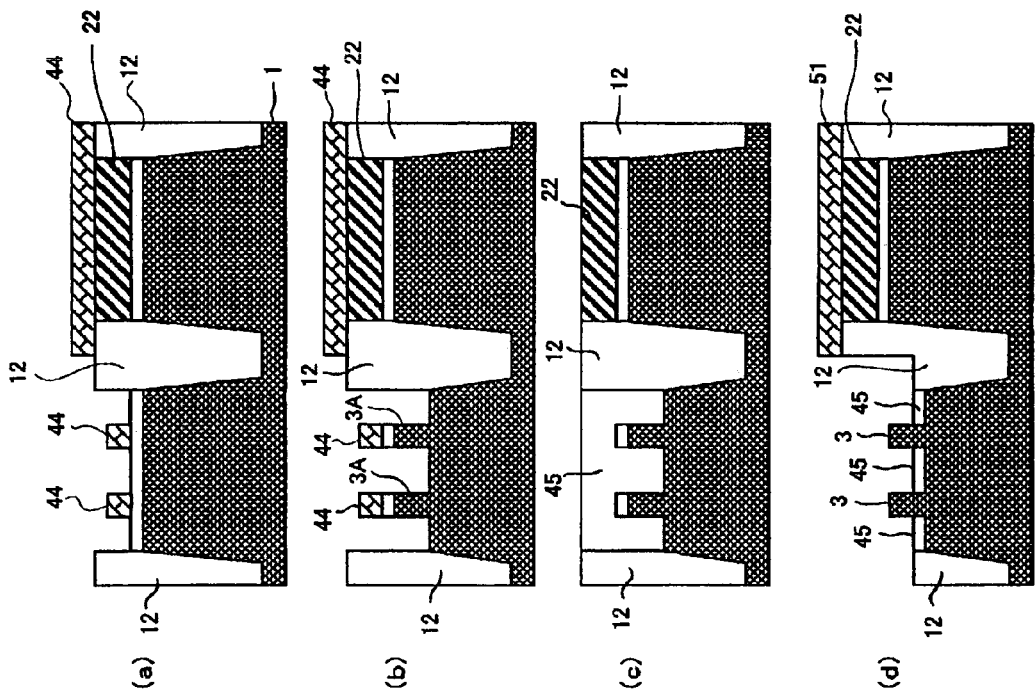
FIGS. 24(a) to 24(d) are explanatory views of the method for production of a semiconductor device according to the present invention.

Next, the resist mask 43 is removed (FIG. 23(*d*)), and a resist mask 44 is then formed by a lithography technique (FIG. 24(*a*)). The resist mask is patterned so as to cover a region for formation of a semiconductor raised portion constituting a protrusive semiconductor layer and a pad portion for contact of a source/drain and so as to cover a planar region. Thereafter, anisotropic etching such as dry etching is carried out using the resist mask 44 to form a semiconductor raised portion 3A constituting the projective semiconductor layer and the pad portion (FIG. 24(*b*)). The depth of etching of the silicon substrate at this time is made shallower than the trench for element isolation 11 formed earlier, whereby the aspect ratio of the semiconductor raised portion can be reduced, and a narrow protrusive semiconductor layer can be accurately formed. At this time, by using a condition in which the etching rate of $SiO_2$ is sufficiently low compared to silicon, etching of the element isolation insulating film 12 formed earlier can be suppressed.

Next, the resist mask 44 is removed, and an oxide film for isolation 45 is then deposited using a CVD method or the like, and flattened by CMP (FIG. 24(*c*)).

Next, a resist mask 51 is formed on the planar region by a lithography technique, and using the resist mask 51 as mask, the oxide film for isolation 45 in the Fin region is etched back (FIG. 24(*d*)). The amount of the etch-back determines the amount of protrusion of the semiconductor raised portion 3A from the isolation insulating film, namely the height H of the protrusive semiconductor layer 3.

Figure 25:
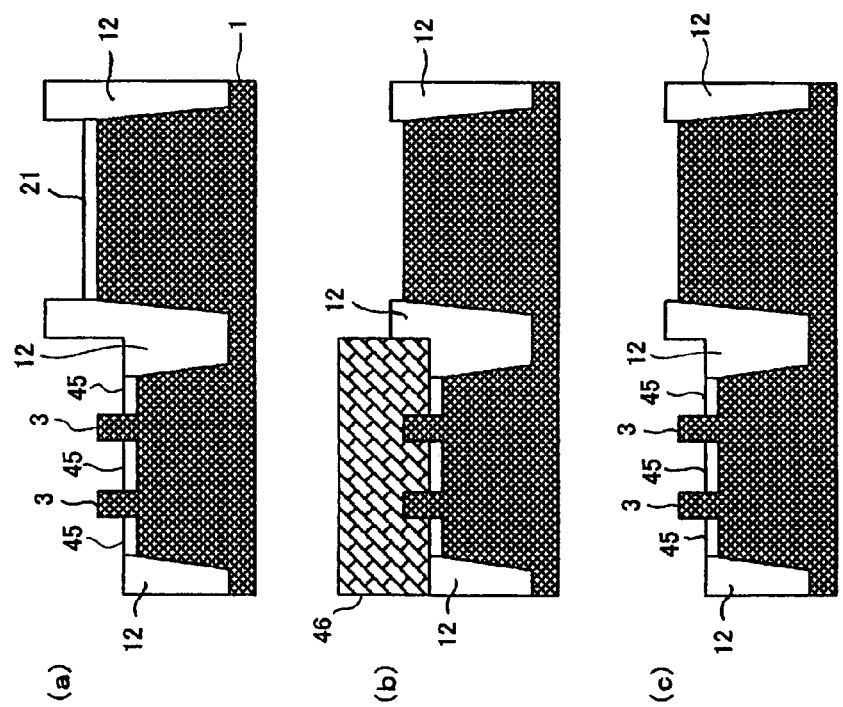
FIGS. 25(a) to 25(c) are explanatory views of the method for production of a semiconductor device according to the present invention.

Next, the resist mask 51 of the planar region and the mask nitride film 22 are removed by wet etching (FIG. 25(*a*)). Although not shown in the figures, an nMOS region and a pMOS region may be subjected to ion implantation for formation of a well or ion implantation for adjustment of a threshold voltage after this step.

Next, a resist mask 46 is formed on the Fin region by a lithography technique, and using the resist mask 46 as a mask, the oxide film 21 on the planar region is etched away (FIG. 25(*b*)). At this time, the isolation insulating film 12 may be etched to reduce a difference in level between the Fin region and the isolation insulating film.

Next, the resist mask 46 is removed to complete a protrusive semiconductor layer and an element isolation structure (FIG. 25(*c*)). The oxide film 45 in the figure corresponds to the Fin isolation insulating film, and a portion of the semiconductor raised portion 3A protruding from the oxide film 45 constitutes the protrusive semiconductor layer 3 of the Fin type FET.

After the steps described above, a Fin type FET, an interlayer insulating film, a contact plug and a wiring can be formed in the same manner as in production examples 1 and 2.

PRODUCTION EXAMPLE 5

Another example of the production method of the present invention will be described using the drawings. In this production example, a Fin isolation insulating film 2 is formed by CVD, and the step of forming a side wall nitride film 24 in production example 1 may be omitted. This production example is different from production examples 1 to 4 in that a semiconductor raised portion 3A is formed before formation of a deep trench 11 of a isolation region. Since the step of burying an oxide film and the step of CMP may be carried out only once, the number of steps can be reduced.

First, a pad oxide film 21 and a mask nitride film 22 are deposited on a silicon substrate 1 by a CVD method or the like. The thickness of the pad oxide film is typically 5 nm to 20 nm, and the thickness of the mask nitride film is typically 50 nm to 200 nm. Since the mask nitride film is a stopper of CMP which is carried out subsequently, the mask may be formed of a material other than a nitride film as long as this purpose can be achieved.

Next, a resist mask is formed by a lithography technique, and using the resist mask, a mask nitride film 22 and a pad oxide film 21 are etched. Thereafter, the silicon substrate is subjected to anisotropic etching such as dry etching to form a trench shallower than a trench for element isolation 11 which is subsequently formed (FIG. 26(*a*)). Consequently, a semiconductor raised portion 3A is formed in a Fin region. At this time, etching of the silicon substrate may be carried out using the aforementioned resist mask as a mask, or may be carried out using a mask nitride film as a mask after detaching the resist mask. The depth of etching of the silicon substrate is typically 100 nm to 400 nm.

Figure 26:
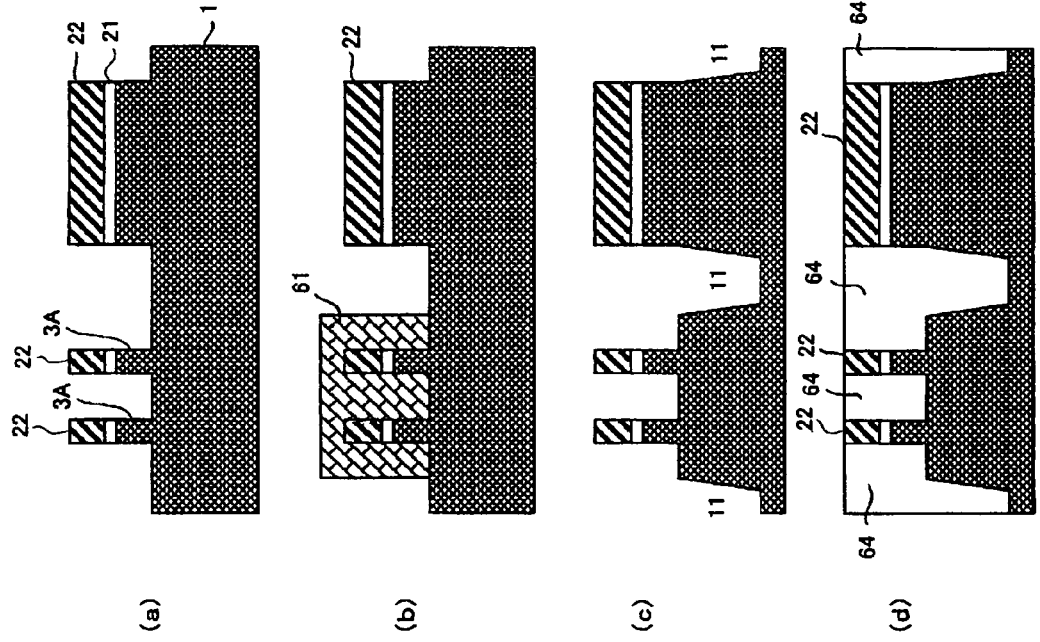
FIGS. 26(a) to 26(d) are explanatory views of a method for production of a semiconductor device according to the present invention.

Next, by a lithography technique, a resist mask 61 is formed on the Fin region so as to cover the semiconductor raised portion 3A (FIG. 26(*b*)).

Next, using the resist mask 61 and the mask nitride film 22 as a mask, the silicon substrate is etched to form a deep trench for element isolation 11 (FIG. 26(*c*)).

Next, a $SiO_2$ film is deposited on the entire surface by a CVD method or the like, CMP is subsequently carried out using the mask nitride film as a stopper to flatten the $SiO_2$ film, and a buried oxide film 64 made of $SiO_2$ that is buried in the trench formed by etching the silicon substrate is formed (FIG. 26(*d*)). At this time, the nitride film functioning as a stopper exists on the semiconductor raised portion 3A, and therefore dishing in the Fin region is prevented.

Figure 27:
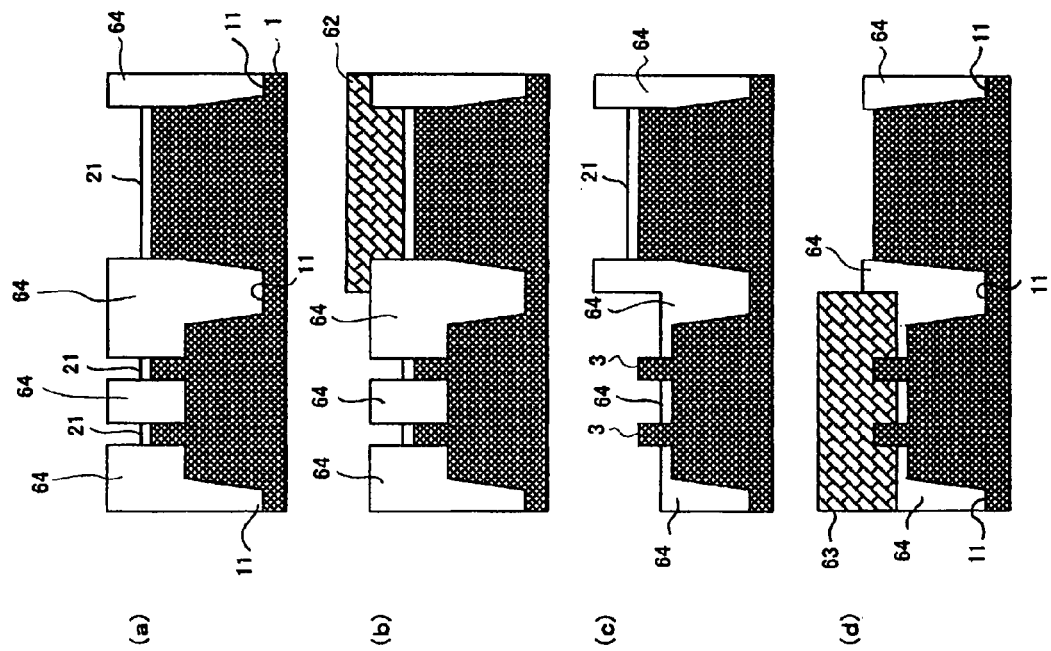
FIGS. 27(a) to 27(d) are explanatory views of the method for production of a semiconductor device according to the present invention.

Next, the mask nitride film 22 is removed by wet etching (FIG. 27(*a*)), and a resist mask 62 is then formed on a planar region (FIG. 27(*b*)).

Next, the buried oxide film 64 of the Fin region is etched back using the resist mask 62, and the resist mask 62 is then removed (FIG. 27(*c*)). The amount of the etch-back determines the amount of protrusion of the semiconductor raised portion 3A from the insulating film, namely the height H of the protrusive semiconductor layer 3. Although not shown in the figures, an nMOS region and a pMOS region may be subjected to ion implantation for formation of a well or ion implantation for adjustment of a threshold voltage after this step.

Next, a resist mask 63 is formed on the Fin region by a lithography technique, and using the resist mask 63 as a mask, the oxide film 21 on the planar region is etched away (FIG. 27(*d*)). At the same time, the buried insulating film 64 of the isolation region may be etched to reduce a difference in level between the Fin region and the isolation insulating film.

Figure 28:
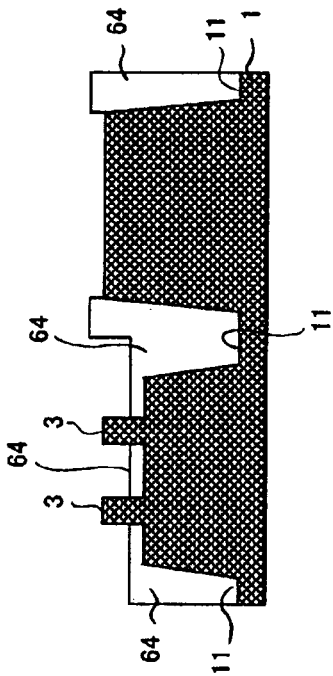
FIG. 28 is an explanatory view of the method for production of a semiconductor device according to the present invention.

Next, the resist mask 63 is removed to complete a protrusive semiconductor layer and an element isolation structure (FIG. 28). The oxide film 64 in the trench 11 corresponds to the element isolation insulating film, the oxide film 64 on the periphery of the semiconductor raised portion 3A of the Fin region corresponds to the Fin isolation insulating film, and the semiconductor raised portion protruding from the oxide film 64 constitutes the protrusive semiconductor layer 3 of the Fin type FET.

After the steps described above, a Fin type FET, an interlayer insulating film, a contact plug and a wiring can be formed in the same manner as in production examples 1 and 2.

PRODUCTION EXAMPLE 6

Another example of the production method of the present invention will be described using the drawings. In this production example, a Fin isolation insulating film 2 is formed by CVD, and the step of forming a side wall nitride film 24 in production example 1 may be omitted. This production example is different from production examples 1-4 in that a semiconductor raised portion 3A is formed before formation of a deep trench 11 of a isolation region. Since the step of burying an oxide film and the step of CMP may be carried out only once, the number of steps can be reduced. This production example is different from production example 5 in that since a mask nitride film is removed before etching of a silicon substrate for forming the semiconductor raised portion, the aspect ratio can be reduced by the thickness of the nitride film, and a narrow protrusive semiconductor layer can be accurately formed.

First, a pad oxide film 21 and a mask nitride film 22 are deposited on a silicon substrate 1 by a CVD method or the like. The thickness of the pad oxide film is typically 5 nm to 20 nm, and the thickness of the mask nitride film is typically 50 nm to 200 nm. Since the mask nitride film is a stopper of CMP which is carried out subsequently, the mask may be formed of a material other than a nitride film as long as this purpose can be achieved.

Figure 29:
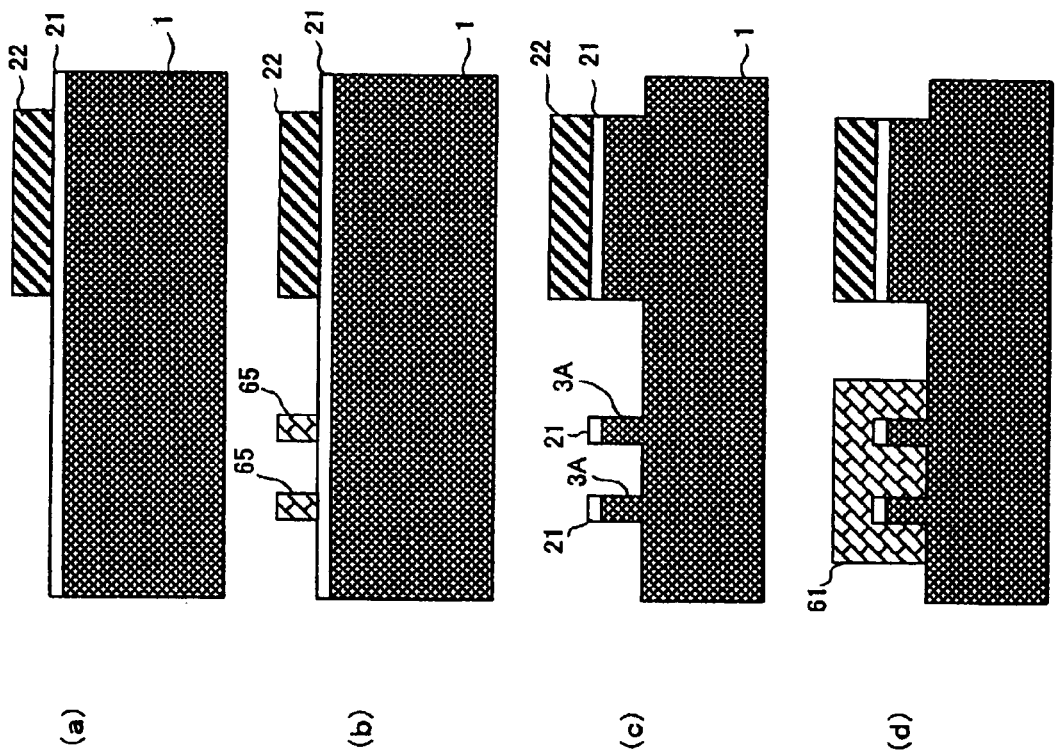
FIGS. 29(a) to 29(d) are explanatory views of a method for production of a semiconductor device according to the present invention.

Next, a resist mask covering an active region in a planar region is formed by a lithography technique, and using this resist mask, the mask nitride film 22 is etched, and the nitride film 22 other than the active region in the planar region is removed (FIG. 29(a)).

Next, a resist mask 65 is formed on the Fin region by a lithography technique (FIG. 29(b)). The resist mask is patterned so as to cover a region for formation of a semiconductor raised portion constituting a protrusive semiconductor layer and a pad portion for contact of a source/drain. Thereafter, anisotropic etching such as dry etching is carried out using the resist mask 65 and the mask nitride film 22 to form the semiconductor raised portion 3A constituting the protrusive semiconductor layer and the pad portion (FIG. 29(c)). The depth of etching of the silicon substrate at this time is made shallower than the trench for element isolation 11 which is subsequently formed, whereby the aspect ratio of the semiconductor raised portion can be reduced, and a narrow protrusive semiconductor layer can be accurately formed. The depth of etching of the silicon substrate is typically 40 nm to 100 nm.

Next, by a photolithography technique, a resist mask 61 is formed on the Fin region so as to cover the semiconductor raised portion 3A (FIG. 29(d)).

Figure 30:
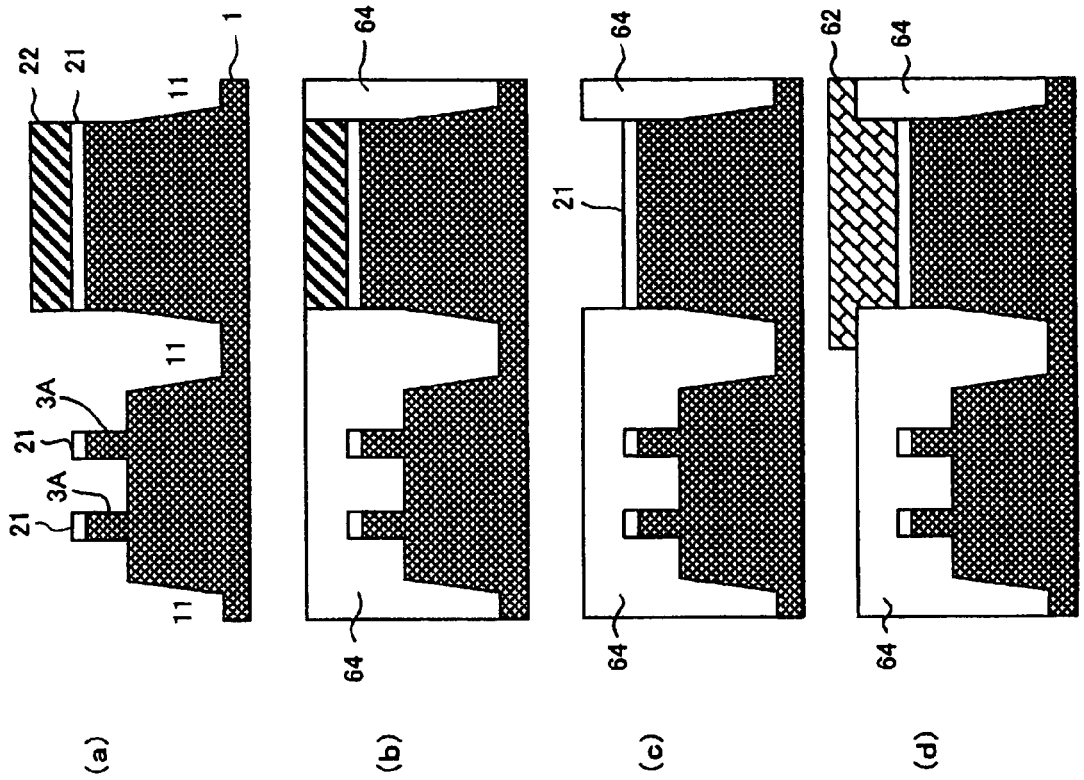
FIGS. 30(a) to 30(d) are explanatory views of the method for production of a semiconductor device according to the present invention.

Next, using the resist mask 61 and the mask nitride film 22 as a mask, the silicon substrate is etched to a deep trench for element isolation 11 (FIG. 30(a)).

Next, a SiO$_2$ film is deposited on the entire surface by a CVD method or the like, CMP is subsequently carried out using the mask nitride film as a stopper to flatten the SiO$_2$ film, and a buried oxide film 64 made of SiO$_2$ that is buried in the trench formed by etching the silicon substrate is formed (FIG. 30(b)).

Next, the mask nitride film 22 is removed by wet etching (FIG. 30(c)), and a resist mask 62 is then formed on a planar region (FIG. 30(d)).

Figure 31:
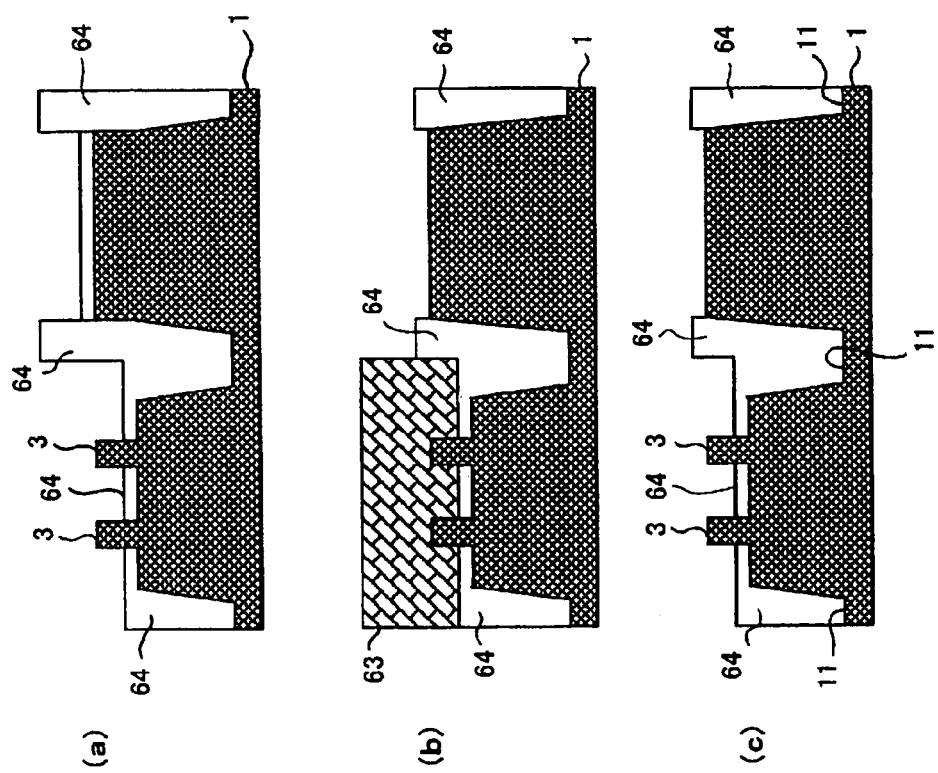
FIGS. 31(a) to 31(c) are explanatory views of the method for production of a semiconductor device according to the present invention.

Next, the buried oxide film 64 of the Fin region is etched back using the resist mask 62, and the resist mask 62 is then removed (FIG. 31(a)). The amount of the etch-back determines the amount of protrusion of the semiconductor raised portion 3A from the insulating film, namely the height H of the protrusive semiconductor layer 3. Although not shown in the figures, an nMOS region and a pMOS region may be subjected to ion implantation for formation of a well or ion implantation for adjustment of a threshold voltage after this step.

Next, a resist mask 63 is formed on the Fin region by a lithography technique, and using the resist mask 63 as a mask, the oxide film 21 on the planar region is etched away (FIG. 31(b)). At the same time, the buried insulating film 64 of the isolation region may be etched to reduce a difference in level between the Fin region and the isolation insulating film.

Next, the resist mask 63 is removed to complete a protrusive semiconductor layer and an element isolation structure (FIG. 31(c)). The oxide film 64 in the trench 11 corresponds to the element isolation insulating film, the oxide film 64 on the periphery of the semiconductor raised portion 3A of the Fin region corresponds to the Fin isolation insulating film, and the semiconductor raised portion protruding from the oxide film 64 constitutes the protrusive semiconductor layer 3 of the Fin type FET.

After the steps described above, a Fin type FET, an interlayer insulating film, a contact plug and a wiring can be formed in the same manner as in production examples 1 and 2.

PRODUCTION EXAMPLE 7

Another example of the production method of the present invention will be described using the drawings.

First, a first pad oxide film 402 and a first mask nitride film 403 (thinner than a second mask nitride film described later) are deposited on a silicon substrate 401 by a CVD method or the like (FIGS. 32(a) and 32(b)). The thickness of the first pad oxide film is typically 5 nm to 20 nm, and the thickness of the first mask nitride film is typically 30 nm to 80 nm. Since the first mask nitride film and the second mask nitride film are a stopper of CMP, the masks may be formed of a material other than a nitride film as long as this purpose can be achieved.

Next, a resist mask is formed by a lithography technique, and using the resist mask, the first mask nitride film 403 and the pad oxide film 402 are etched at a location (an in-transistor Fin isolation region 413 of FIGS. 40(a) and 40(b) described later) that corresponds to a portion between Fins to be formed. Thereafter, the silicon substrate 401 is shallowly etched to form a shallow trench. The depth of the shallow trench is typically 20 nm to 100 nm. The etching of the silicon substrate may be carried out using the aforementioned resist mask as a mask, or may be carried out using the first mask nitride film as a mask after removing the resist mask.

Next, a first SiO$_2$ film 404 is deposited on the entire surface by CVD, the first SiO$_2$ film is subsequently flattened by CMP using the first mask nitride film 403 as a mask, and the first SiO$_2$ film 404 is buried in the shallow trench between Fins (FIGS. 33(a) and 33(b)). In this connection, the first SiO$_2$ film may be another insulating film capable of CMP. Before deposition of the first SiO₂ film, a protective insulating film such as a thermally oxidized film may be provided on the side surface and the bottom surface of the silicon substrate in the trench wherein the surfaces are exposed by etching. An element isolation region between Fin type FETs (which corresponds to a region denoted by reference numeral 412 in FIG. 40(*a*) described later) is not etched but is left as a dummy region 425 at this time.

Figure 34:
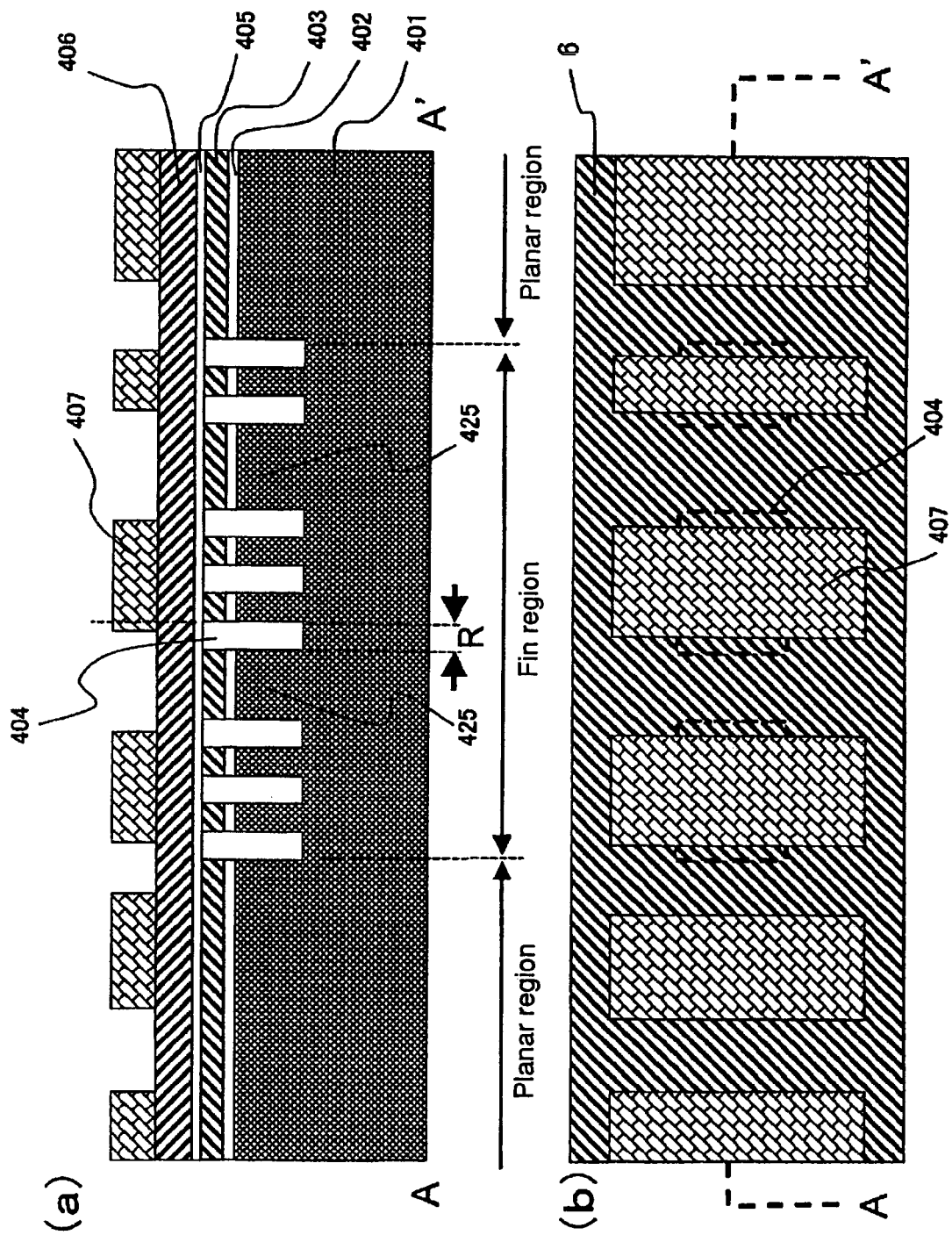
FIGS. 34(a) and 34(b) are explanatory views of the method for production of a semiconductor device according to the present invention.

Next, a second pad oxide film 405 and a second mask nitride film 406 are deposited by a CVD method. A resist mask 407 for forming an element region (which is a region consisting of source, drain, channel and extension regions, etc. that constitute a transistor) of a transistor is formed by a lithography technique (FIGS. 34(*a*) and 34(*b*)). At this time, the resist mask 407 is provided so as to extend over a part of the outermost shallow trench (which is a location at which the first SiO₂ film 404 is buried) of the Fin type FET. The second mask nitride film 406 is thicker than the first mask nitride film 403 and typically has a thickness of 80 nm to 200 nm. In this connection, the width (width R in the figure) of the outermost shallow trench of the Fin type FET may be set greater than the width of another shallow trench (central trench covered with a resist mask in FIG. 34(*a*)). By increasing the width of the trench in this way, a large allowance for alignment can be provided when the resist mask is provided so as to cover a part of the outermost shallow trench of the Fin type FET.

Figure 35:
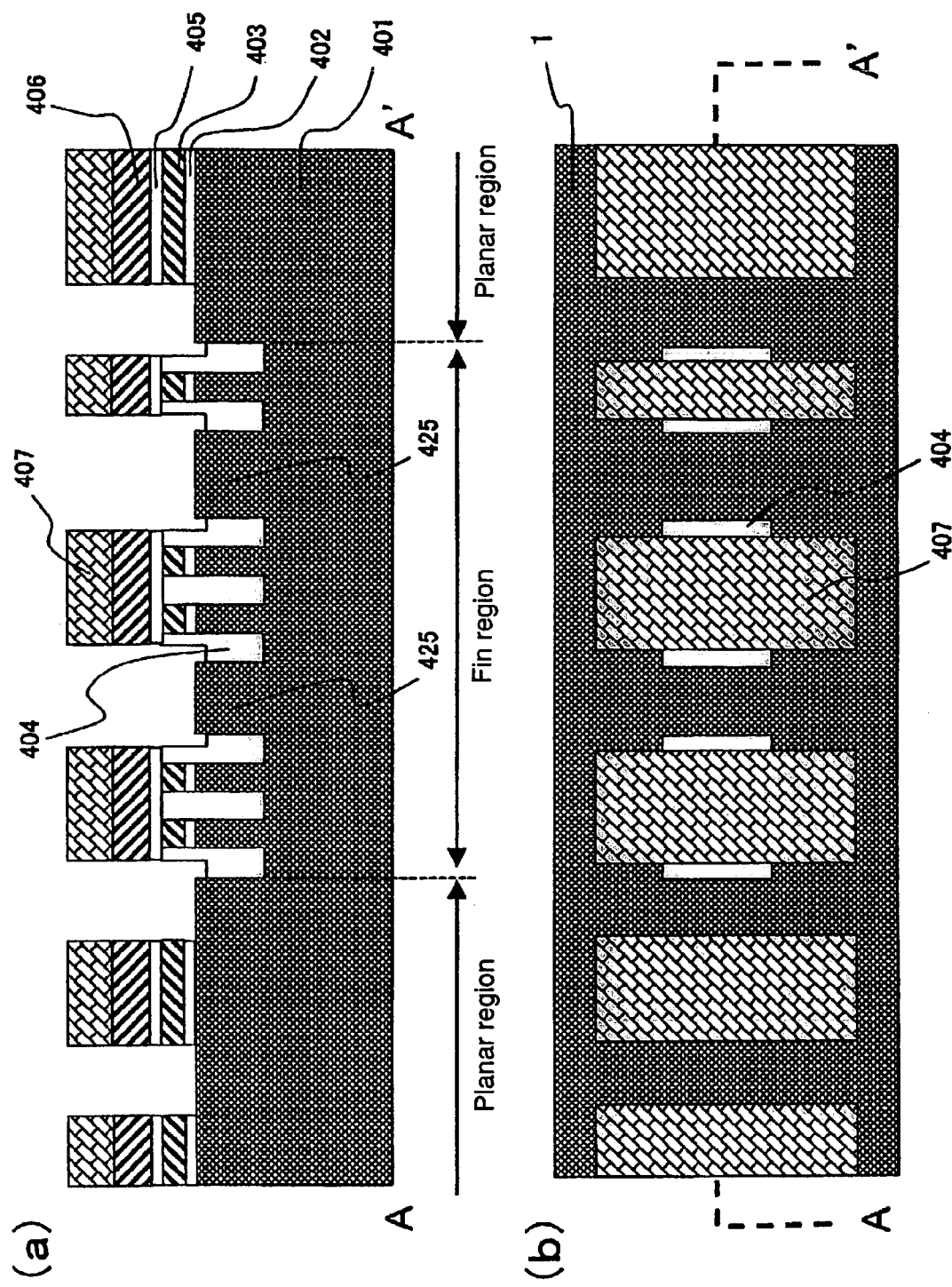
FIGS. 35(a) and 35(b) are explanatory views of the method for production of a semiconductor device according to the present invention.

Next, the second mask nitride film 406, the second pad oxide film 405, the first mask nitride film 403, the first pad oxide film 402 and the first SiO₂ film 404 are etched using the resist mask 407 as a mask (FIGS. 35(*a*) and 35(*b*)). Due to this step, the silicon substrate 401 is exposed at portions (which do not form an element region and are denoted by reference numerals 410, 411 and 412 in FIG. 40(*a*) described later) that form an element isolation region. In this connection, at this time, there is no problem even though the end of the resist mask 407 is deviated from an area over the shallow trench to the element isolation region side (deviated to the dummy region 425 side in FIGS. 34(*a*) and 34(*b*)) if subsequent silicon etching is carried out under a somewhat isotropic condition.

Figure 36:
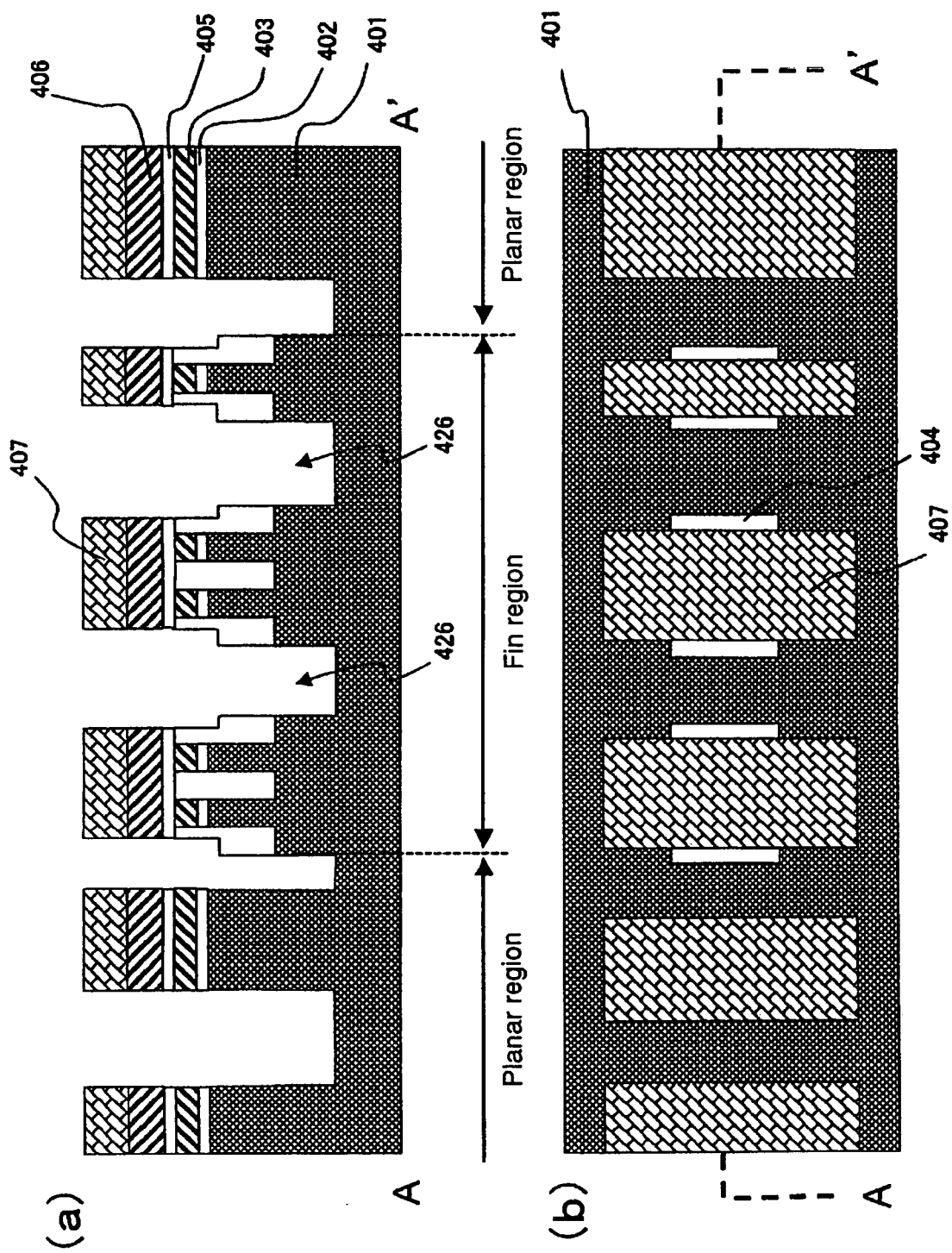
FIGS. 36(a) and 36(b) are explanatory views of the method for production of a semiconductor device according to the present invention.

The silicon substrate 401 exposed at the element isolation region is etched to form a deep trench (FIGS. 36(*a*) and 36(*b*)). The depth of the deep trench is typically 150 nm to 300 nm. In this connection, a portion denoted by reference numeral 426 in the figure represents a region (deep trench) where the dummy region 425 is removed.

Figure 37:
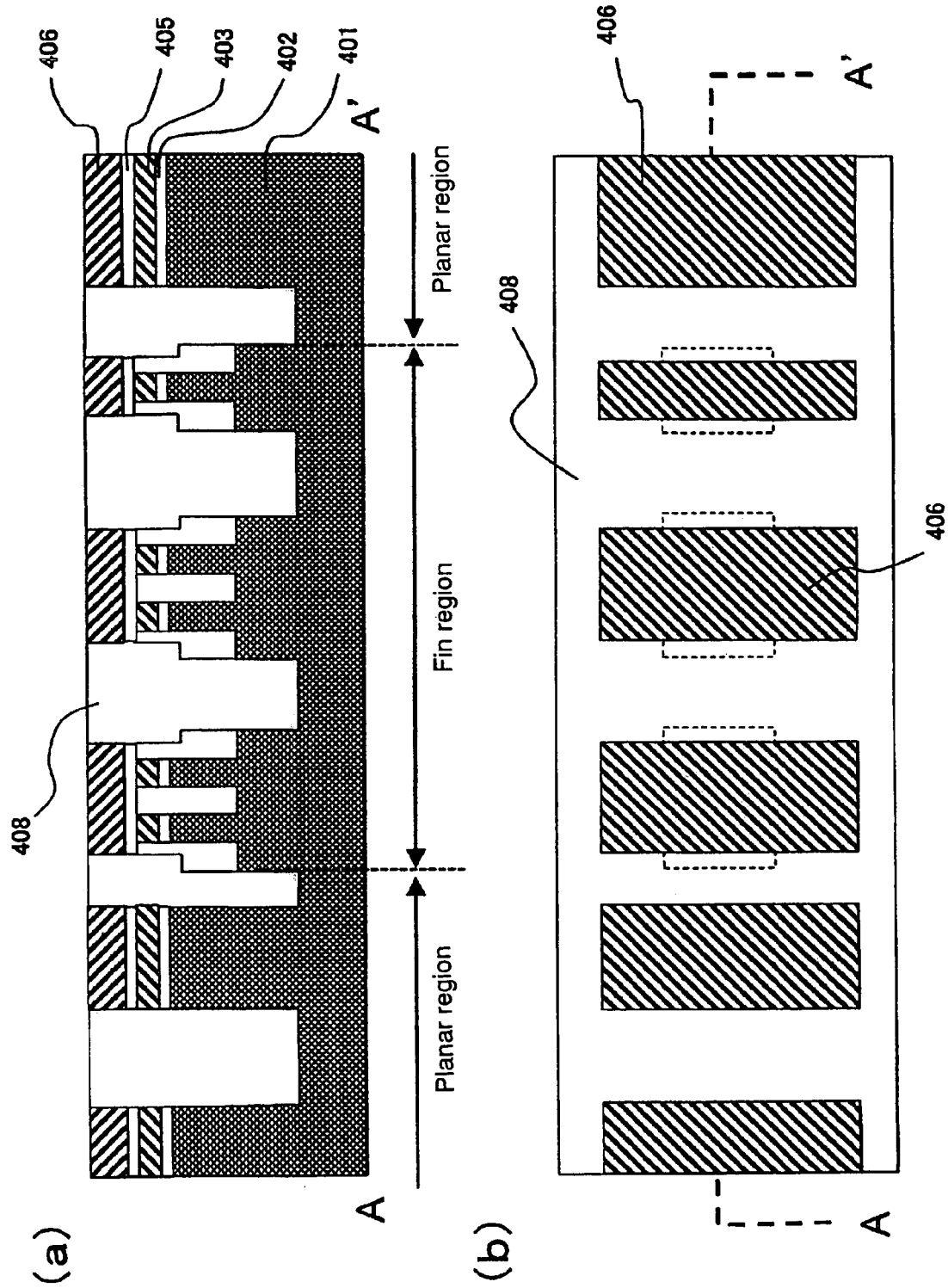
FIGS. 37(a) and 37(b) are explanatory views of the method for production of a semiconductor device according to the present invention.

Next, a second SiO₂ film 408 is deposited on the entire surface by a CVD or the like, the second SiO₂ film is subsequently flattened by CMP using the second mask nitride film 406 as a mask, and the second SiO₂ film 408 is buried in the deep trench (FIGS. 37(*a*) and 37(*b*)). In this connection, the second SiO₂ film may be another insulating film capable of CMP. Before deposition of the second SiO₂ film, a protective insulating film such as a thermally oxidized film may be provided on the side surface and the bottom surface of the silicon substrate in the trench wherein the surfaces are exposed by etching.

Figure 38:
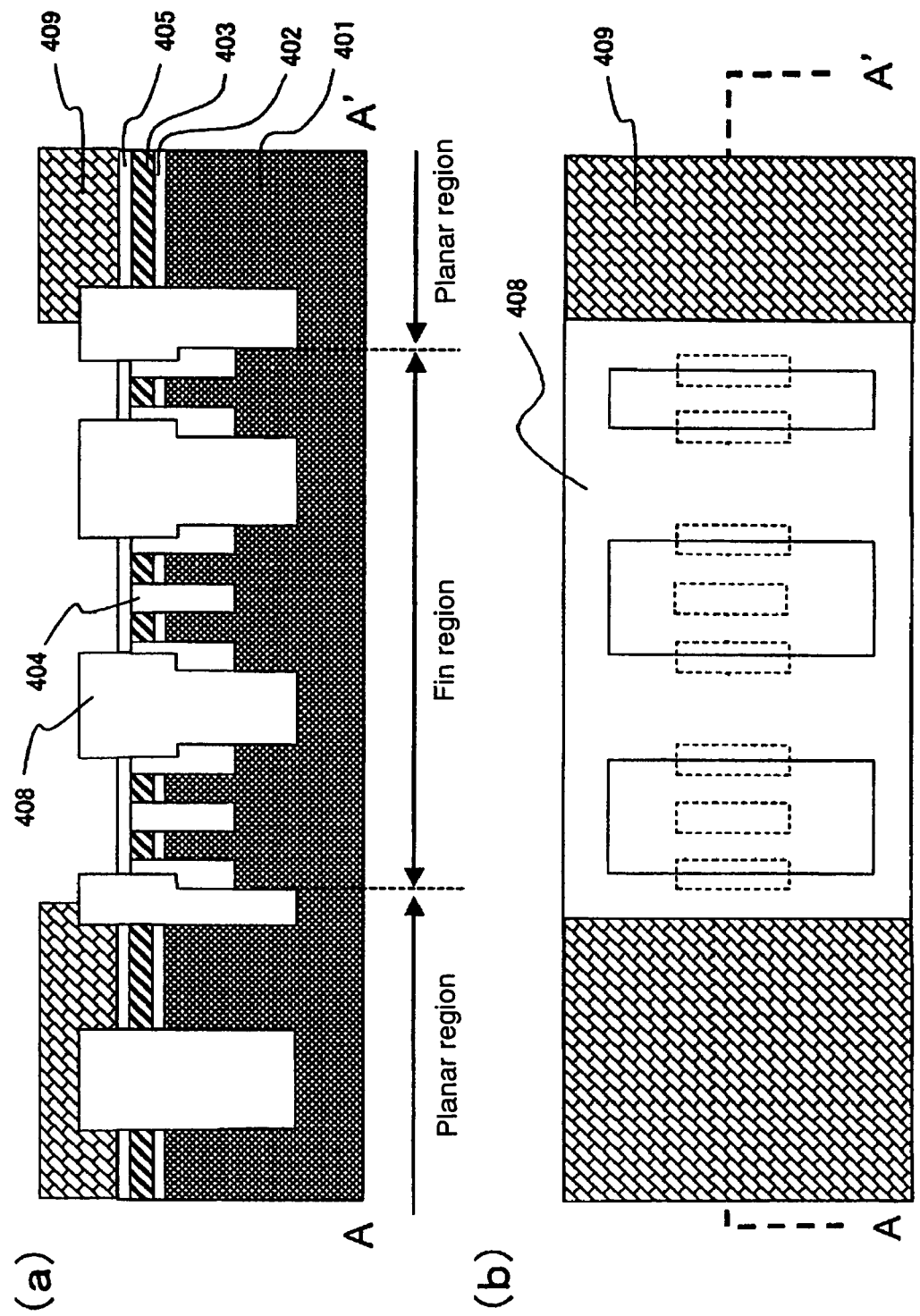
FIGS. 38(a) and 38(b) are explanatory views of the method for production of a semiconductor device according to the present invention.

Next, the second mask nitride film 406 is removed, and a resist mask 409 is then formed so as to cover a planar region by a lithography technique (FIGS. 38(*a*) and 38(*b*)). In this connection, a layer (second pad oxide film 405 here) made of a material different from the material of each of a first mask film and a second mask film is inserted between the first mask film (first mask nitride film 403 here) and the second mask film (second nitride mask film 406 here), and the inserted layer is used as a stopper when only the second mask film is selectively etched (wet etching with phosphoric acid or the like, or selective etching such as RIE in which an oxygen partial pressure is increased).

Figure 39:
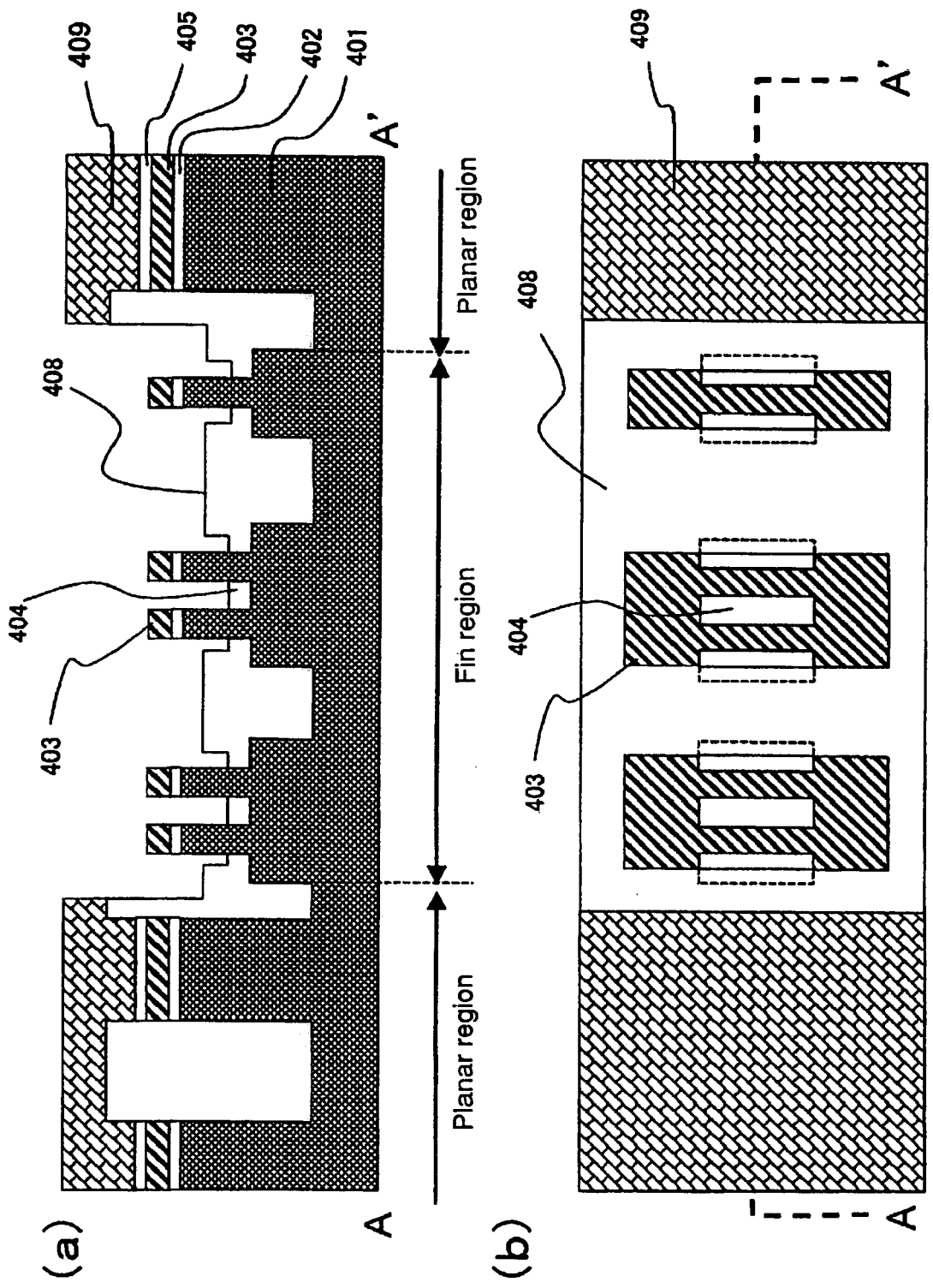
FIGS. 39(a) and 39(b) are explanatory views of the method for production of a semiconductor device according to the present invention.

Next, the insulating film (first SiO₂ film 404 and second SiO₂ film 408) of the Fin region is etched back so that a part of the side surface of the silicon region that forms a Fin is exposed (FIGS. 39(*a*) and 39(*b*)). However, the first SiO₂ film 404 over the shallow trench between Fins is not fully removed, but is partly left.

Figure 40:
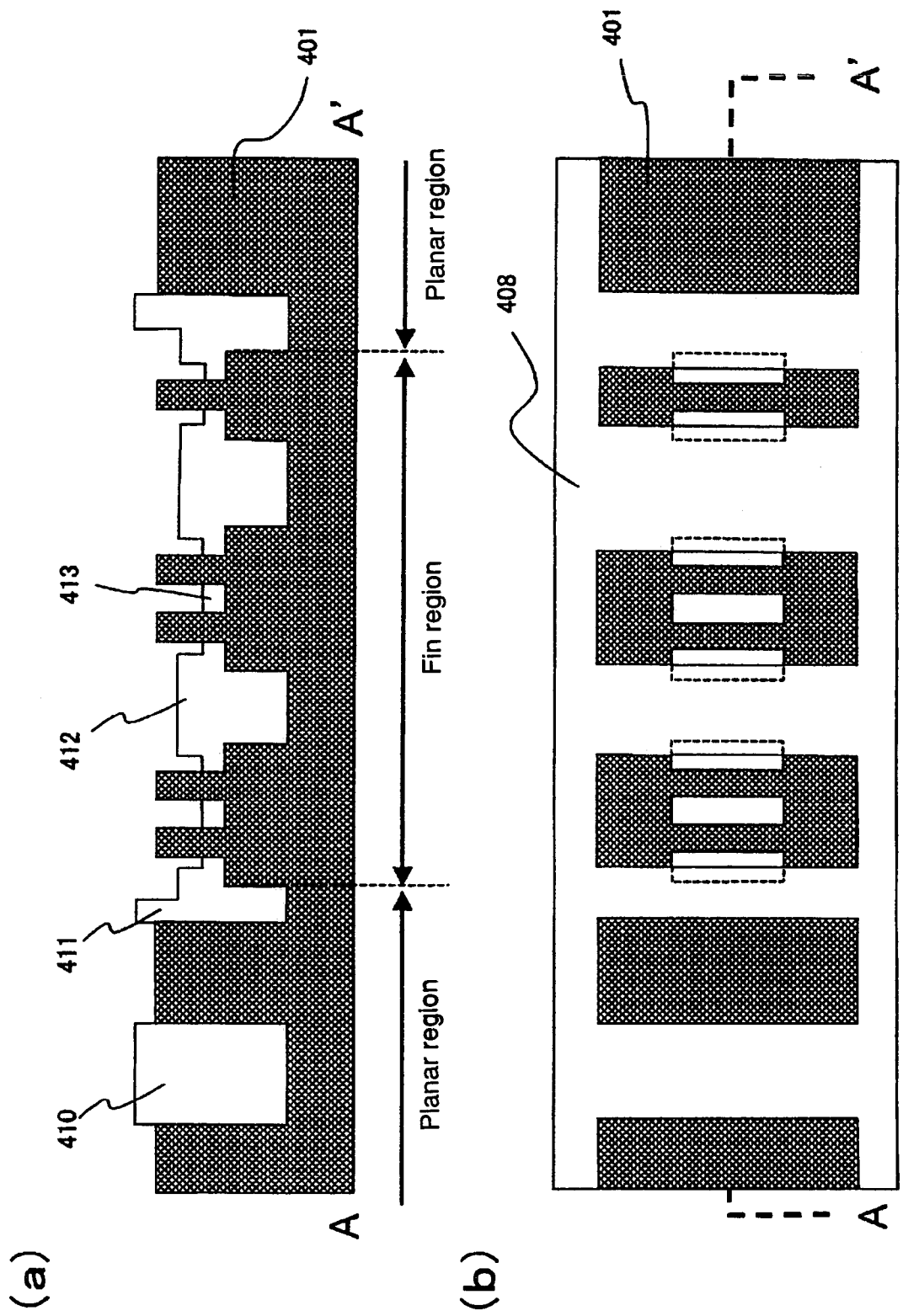
FIGS. 40(a) and 40(b) are explanatory views of the method for production of a semiconductor device according to the present invention.

Next, the resist mask 409, the second pad oxide film 405, the first mask nitride film 403 and the first pad oxide film 402 are removed, and finally, a separation region 410 between planar type FETs, a separation region 411 between planar type FET and Fin type FET, a separation region 412 between Fin type FETs and an in-transistor Fin separation 413, and an element region isolated by those regions are formed (FIGS. 40(*a*) and 40(*b*)).

Figure 41:
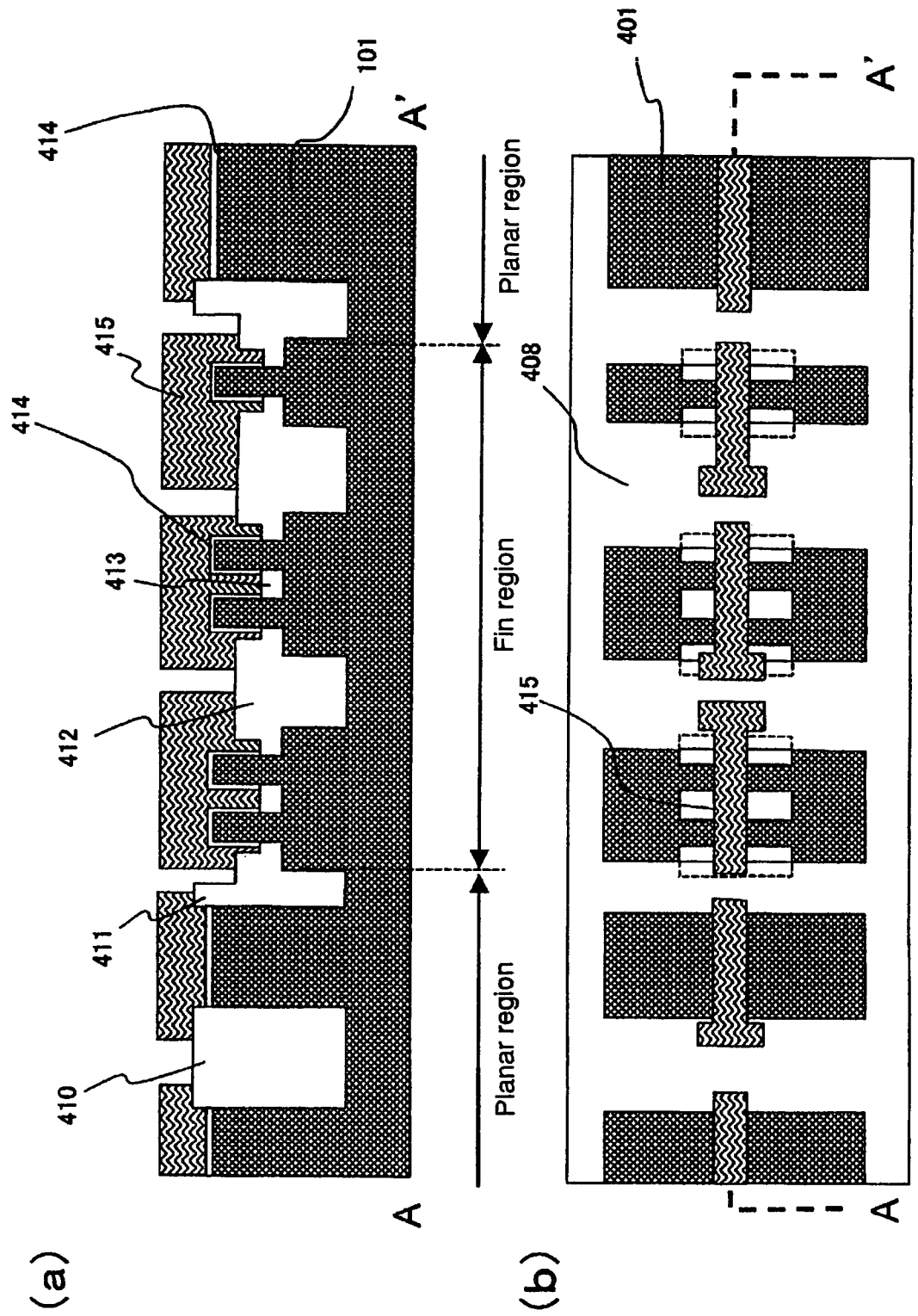
FIGS. 41(a) and 41(b) are explanatory views of the method for production of a semiconductor device according to the present invention.

Subsequently, in the same manner as in production example 2, a gate insulating film 414, a gate electrode 415, source and drain regions, a silicide layer 416, an interlayer insulating film 417, a contact plug 418, a wiring 419 and the like are formed as shown in FIGS. 41(*a*) and 41(*b*), FIG. 42 and FIG. 43 to form a semiconductor device having a Fin type FET and a normal planar type transistor together.

In this connection, deep trenches are used for the separation regions 412 between Fin type FETs in this production example, but a part or all of the separation regions 412 between Fin type FETs may be formed by a shallow trench (having a depth same as that of the in-transistor Fin separation region).

If at least a part of the separation regions 412 between Fin type FETs is formed by a shallow trench, a configuration in which only the Fin type FET separation region 412 between an n channel Fin type FET and a p channel Fin type FET is formed by a deep trench can be achieved. Owing to this configuration, a sufficient well isolating capability can be secured (see FIGS. 6(*a*) and 6(*b*) and relevant descriptions).

If at least a part or all of the separation regions 412 between Fin type FETs is formed by a shallow trench, a shallow trench may be provided as in the case of the in-transistor Fin separation region 413, without leaving the dummy region 425 at a location where the shallow trench is provided. In this case, the width of the shallow trench of the separation region 412 between Fin type FETs may be larger than the width of the in-transistor Fin separation region 413. The shallow trench of the separation region 412 between Fin type FETs may be provided so as to surround the source and drain regions.

FIGS. 44 to 47 are plan views in a plane same as that of FIG. 41(*b*), wherein a region 441 on which a shallow trench is formed is shown by hatchings (slant lines).

Figure 32:
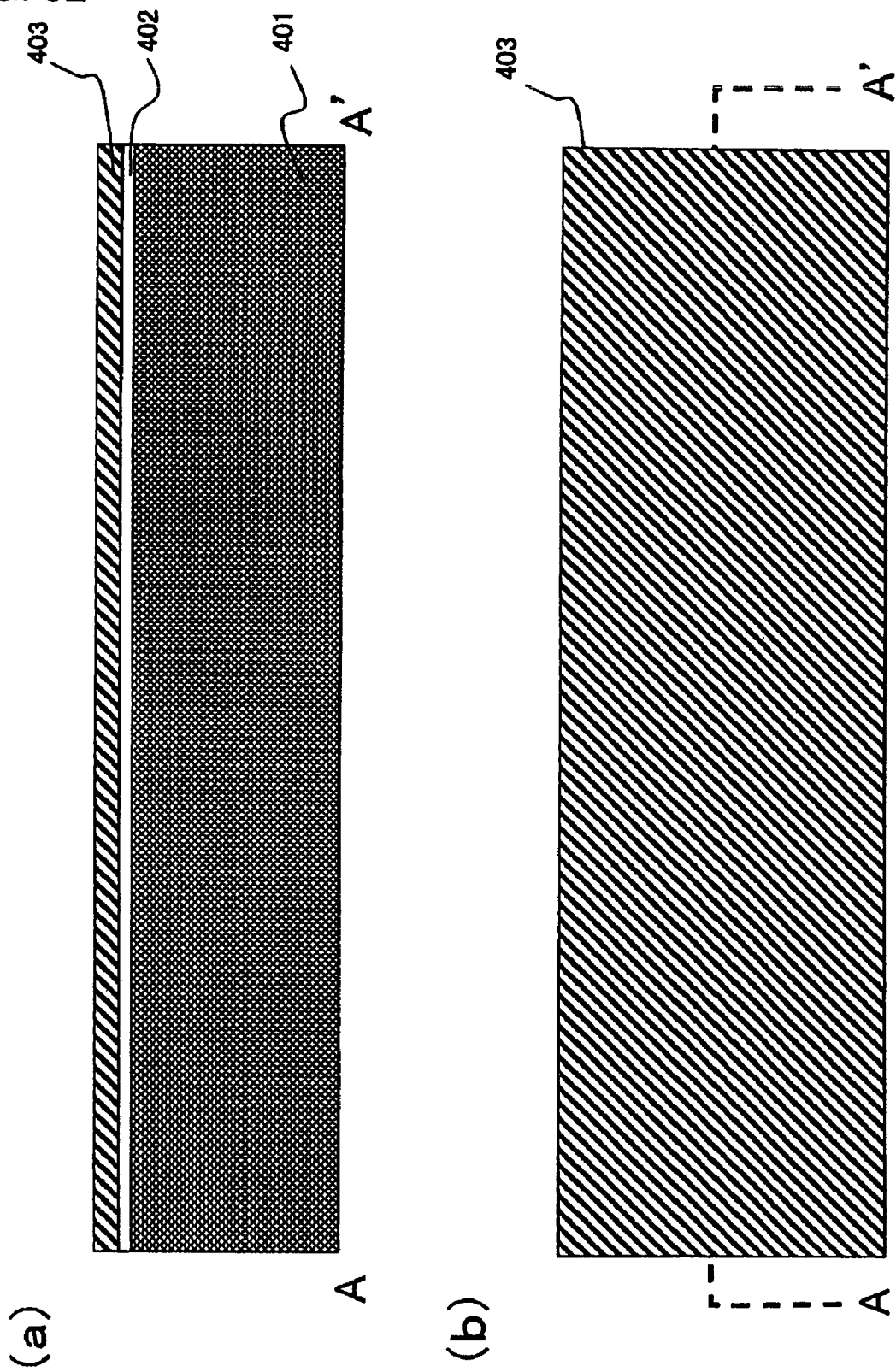
FIGS. 32(a) and 32(b) are explanatory views of a method for production of a semiconductor device according to the present invention.
Figure 44:
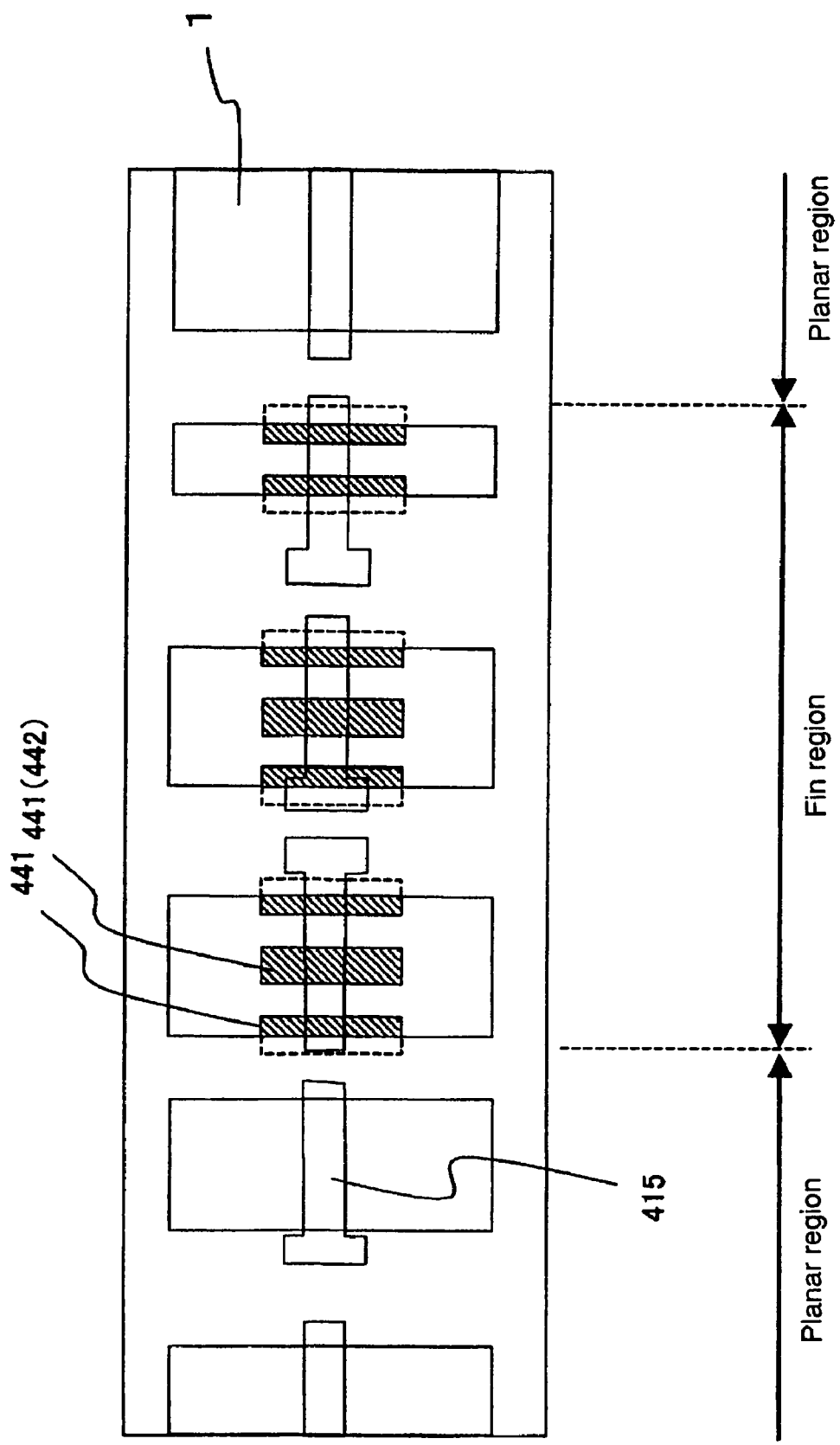
FIG. 44 is an explanatory view of the method for production of a semiconductor device according to the present invention.

FIG. 44 shows a case where the production method described referring to FIGS. 32(*a*) and 32(*b*), 33(*a*) and 33(*b*), 34(*a*) and 34(*b*), 35(*a*) and 35(*b*), 36(*a*) and 36(*b*), 37(*a*) and 37(*b*), 38(*a*) and 38(*b*), 39(*a*) and 39(*b*), 40(*a*) and 40(*b*), 41(*a*) and 41(*b*), 42 and 43 is carried out truly, wherein the in-transistor Fin separation region 413 is formed by a shallow trench 442 and the separation region 412 between Fin type FETs is formed by a deep trench (corresponding to FIGS. 41(*a*) and 41(*b*) and FIGS. 7(*a*) and 7(*b*)).

Figure 45:
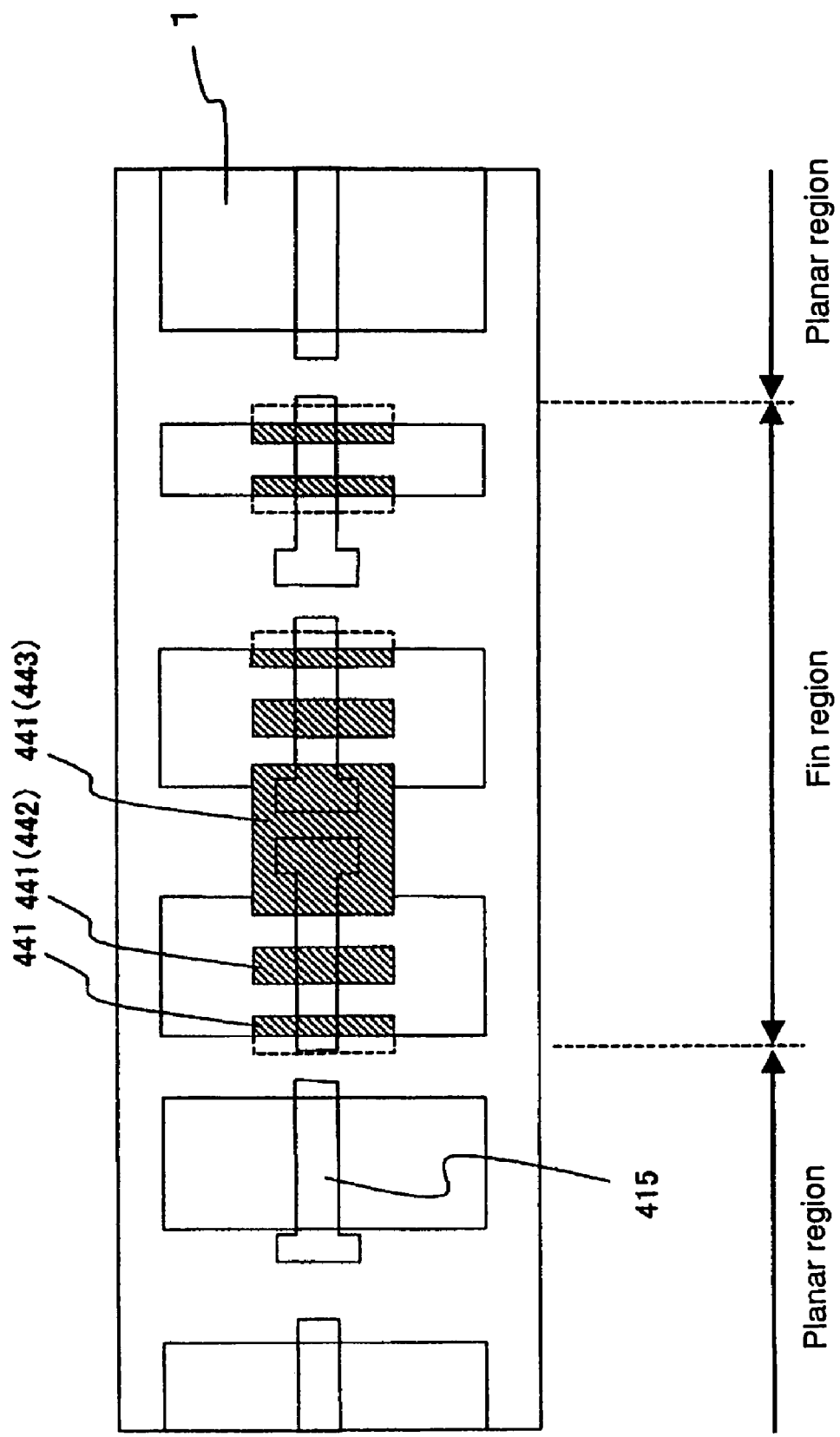
FIG. 45 is an explanatory view of the method for production of a semiconductor device according to the present invention.

In FIG. 45, the in-transistor Fin separation region 413 is formed by the shallow trench 442, and a portion between Fins of adjacent transistors is formed of a shallow trench 443 in the separation region 412 between Fin type FETs. This structure can be formed in the step shown in, for example, FIGS. 33(*a*) and 33(*b*), by etching the first mask nitride film 403, the first pad oxide film 402 and the silicon substrate 401 in a region of the shallow trench 443 of the separation region between Fin type FETs (which region corresponds to a region of a combination of the dummy region 425 sandwiched between Fins of adjacent transistors and regions of shallow trenches adjacent to opposite sides of the dummy region 425) to form a shallow trench (typically 20 nm to 100 nm) on the silicon substrate 401, and subsequently burying the first $SiO_2$ film 404 in the shallow trench. This method is advantageous when the spacing between Fin type FETs is small, especially when the spacing between Fins between Fin type FETs is equal to the spacing between in-transistor Fins, or the former is equal to or less than twice as large as the latter. In this case, the spacing of the trench is uniform (or relatively uniform), variations in Fin width by a proximity effect at the time of exposure and a loading effect at the time of etching can be sufficiently prevented or suppressed.

Figure 33:
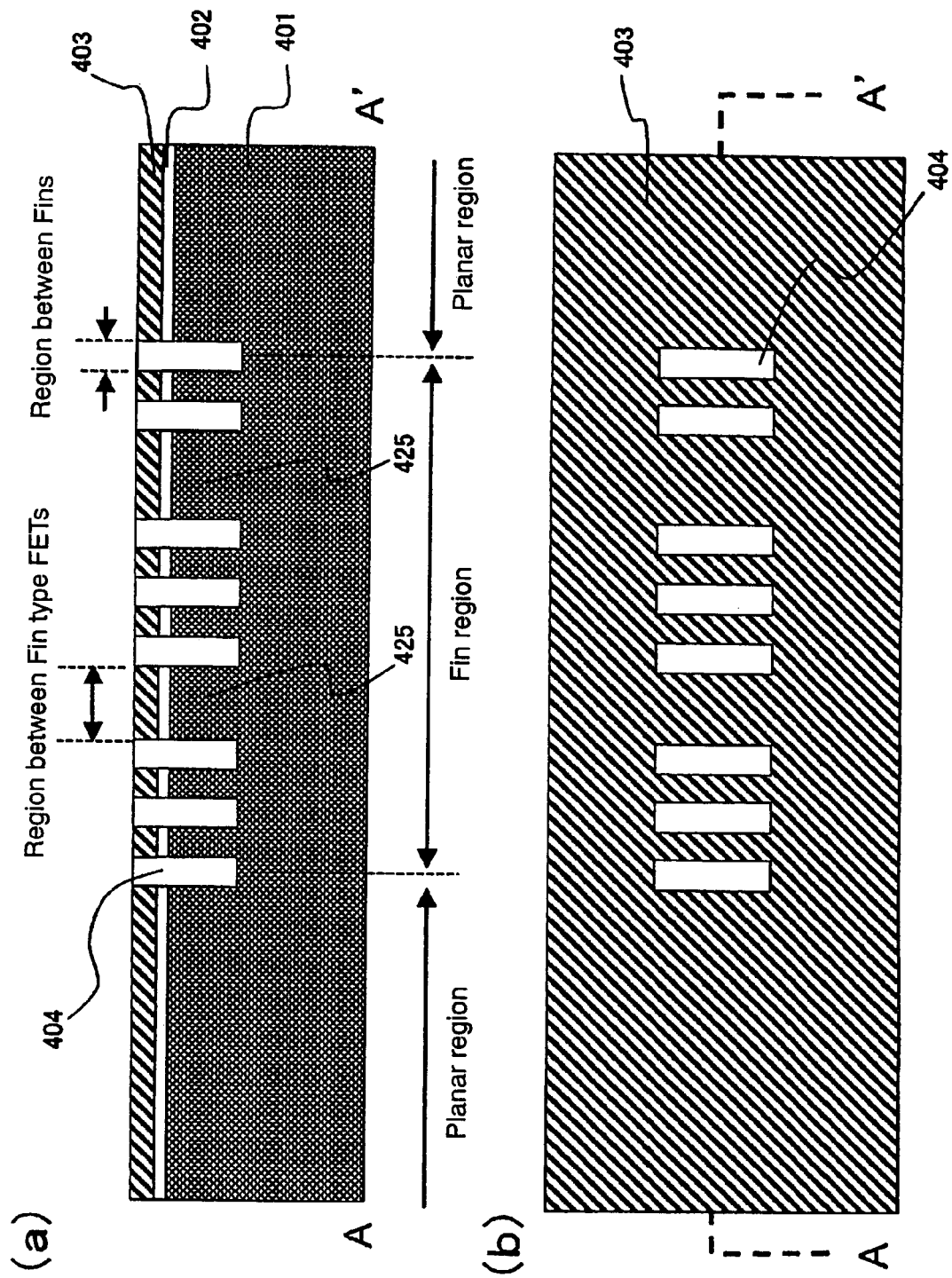
FIGS. 33(a) and 33(b) are explanatory views of the method for production of a semiconductor device according to the present invention.

This structure may also be formed by forming the structure shown in FIGS. 33(*a*) and 33(*b*) on a temporary basis, then forming a resist mask again, etching the first mask nitride film 403, the first pad oxide film 402 and the silicon substrate 401 using the resist mask in a region where the shallow trench 443 of the separation region between Fin type FETs is to be formed (which region corresponds to the dummy region 425 sandwiched between Fins of adjacent transistors, and does not include regions in which shallow trenches are already formed adjacently to the dummy region 425) to form a shallow trench (typically 20 nm to 100 nm) on the silicon substrate 401, and subsequently burying the first $SiO_2$ film 404 in the shallow trench. In this case, it is not necessary that the depth of the shallow trench in the in-transistor Fin separation region 413 should be perfectly equal to the depth of the shallow trench 443 of the separation region between Fin type FETs. In this method, the spacing of the trench when forming the trench for the in-transistor Fin separation region 413 is uniform because only the trench for the in-transistor Fin separation region 413 is formed on a temporary basis, and therefore variations in Fin width by a proximity effect at the time of exposure and a loading effect at the time of etching can be sufficiently prevented.

If the width of the dummy region 425 is very small (typically equal to or less than twice as large as the Fin width), and the etching technique cannot sufficiently cope with a structure of a high aspect ratio, a configuration in which the depth of the trench is small in a region where the Fin spacing is narrow may be resultantly formed when carrying out the steps of FIGS. 32(*a*) and 32(*b*), 33(*a*) and 33(*b*), 34(*a*) and 34(*b*), 35(*a*) and 35(*b*), 36(*a*) and 36(*b*), 37(*a*) and 37(*b*), 38(*a*) and 38(*b*), 39(*a*) and 39(*b*), 40(*a*) and 40(*b*), 41(*a*) and 41(*b*), 42, 43 and 44. In this case, the surface of the insulating film buried in the shallow trench formed resultantly is at a level same as that of the surface of the insulating film of the deep trench.

Figure 46:
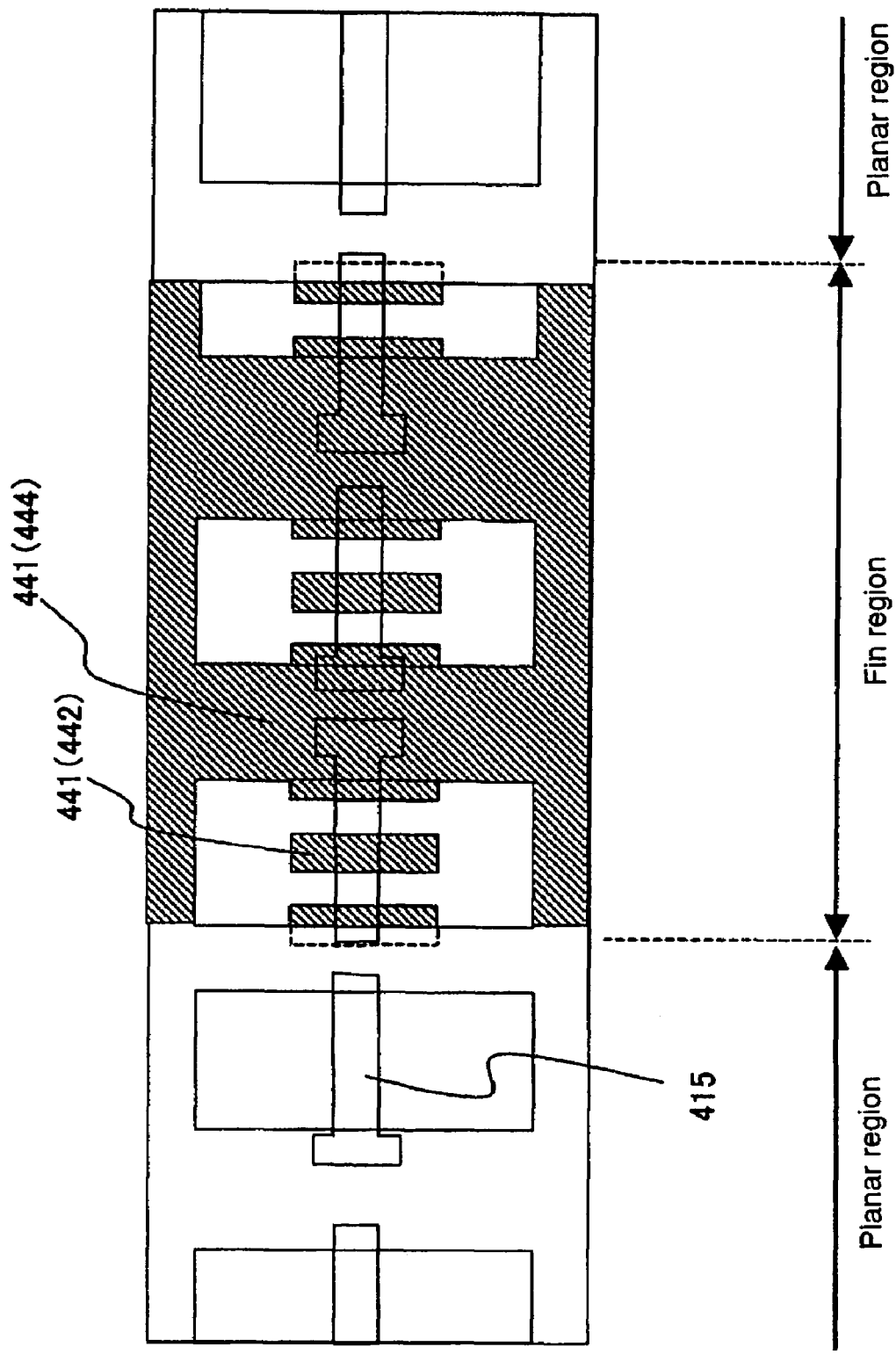
FIG. 46 is an explanatory view of the method for production of a semiconductor device according to the present invention.

FIG. 46 shows a structure in which, on the separation region 412 between Fin type FETs, a shallow trench 444 is provided so as to surround the source and drain regions of the transistor (which structure corresponds to a structure in FIGS. 5(*a*) and 5(*b*)). This structure can be formed in the same manner as in the method for formation of the structure shown in FIG. 45 except that the region of formation of the shallow trench is different. Namely, the structure can be formed by etching the first mask nitride film 403, the first pad oxide film 402 and the silicon substrate 401 in the region of the shallow trench 444 surrounding the Fin type FET (which region corresponds to a region of a combination of the dummy region 425 surrounding a transistor and regions of shallow trenches adjacent to opposite sides of the dummy region 425 between transistors) to form a shallow trench (typically 20 nm to 100 nm) on the silicon substrate 401, and subsequently burying the first $SiO_2$ film 404 in the shallow trench. This structure may also be formed by forming the structure shown in FIGS. 33(*a*) and 33(*b*) on a temporary basis, then forming a resist mask again, etching the first mask nitride film 403, the first pad oxide film 402 and the silicon substrate 401 using the resist mask in a region where the shallow trench 444 surrounding the Fin type FET is formed (which region corresponds to dummy region 425 surrounding the transistor, and does not include regions in which shallow trenches are already formed adjacently to the dummy region 425) to form a shallow trench (typically 20 nm to 100 nm) on the silicon substrate 401, and subsequently burying the first $SiO_2$ film 404 in the shallow trench. The advantage of each production method is same as that of the method for formation of the structure shown in FIG. 45.

Figure 47:
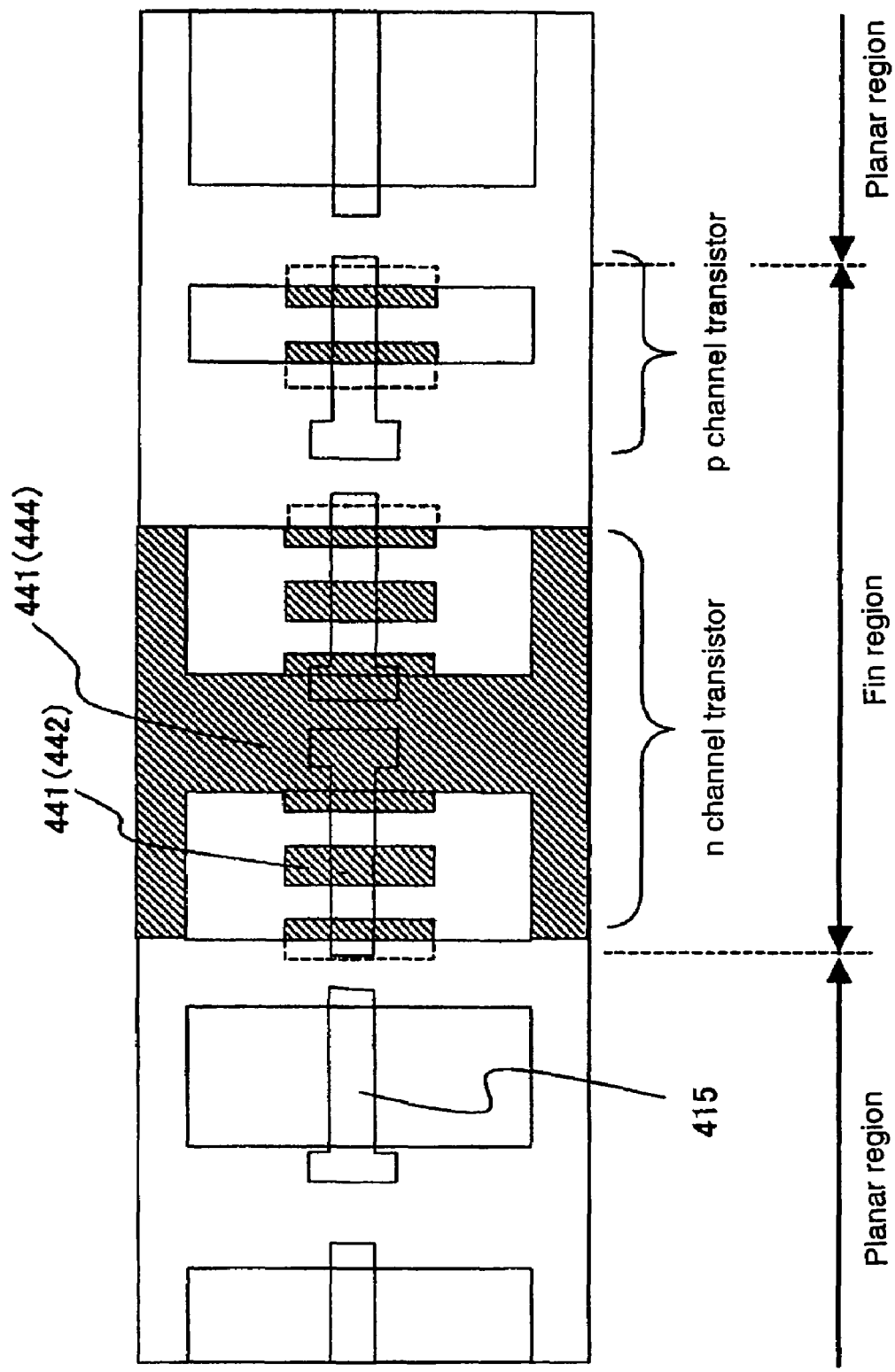
FIG. 47 is an explanatory view of the method for production of a semiconductor device according to the present invention.

FIG. 47 shows a structure in which a shallow trench is provided for separation between Fin type FETs of the same channel type, and a deep trench is provided between Fin type FETs of different channel types (between n channel transistor and p channel transistor) (which structure corresponds to a structure in FIGS. 6(*a*) and 6(*b*)). The method for formation of a shallow trench between transistors is similar to the method for formation of the structure shown in FIGS. 45 and 46 described previously.

According to this production method, a structure having a shallow trench and a deep trench together can be easily produced, and further, the following advantageous effects can be obtained.

Figure 42:
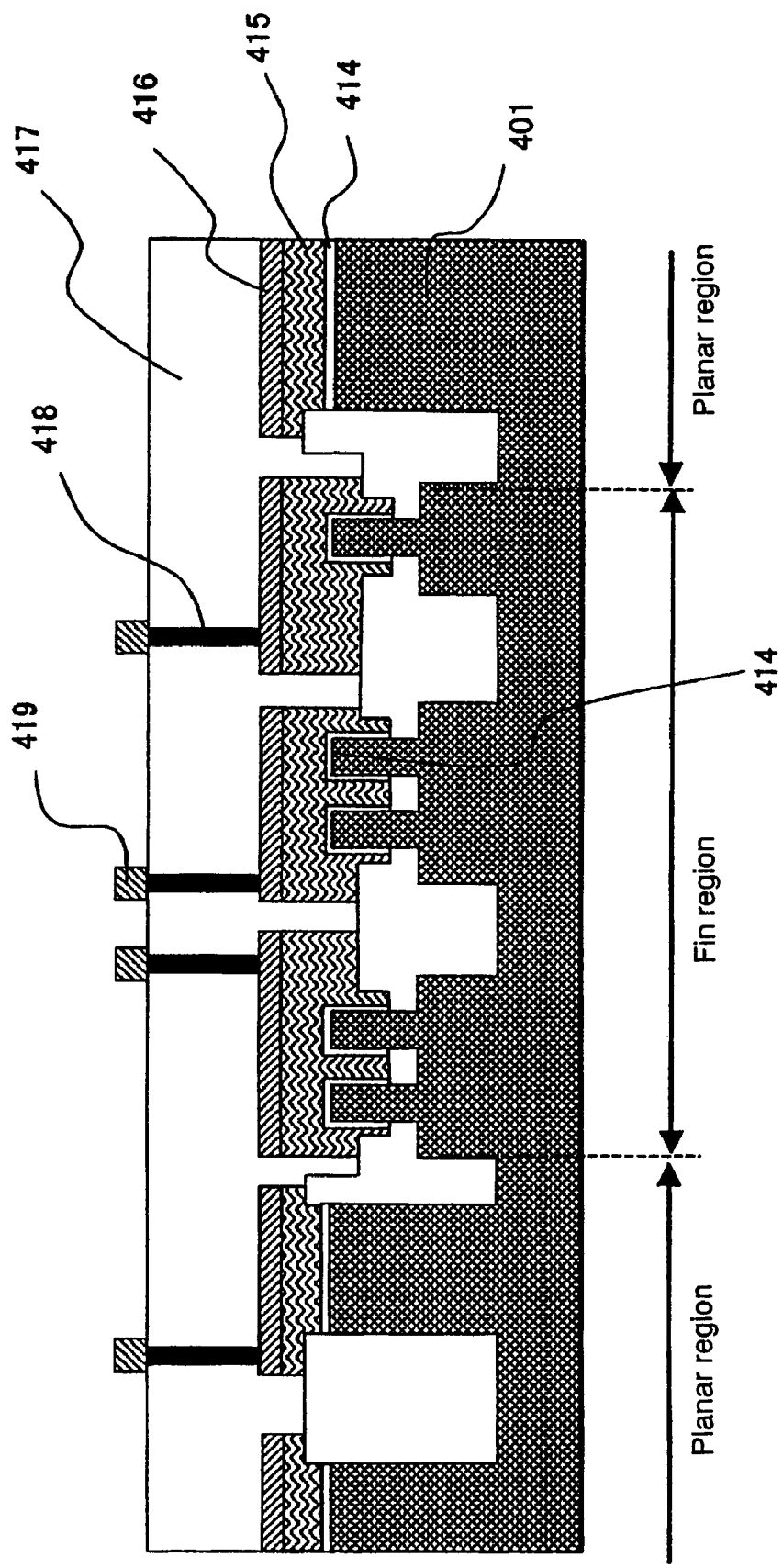
FIG. 42 is an explanatory view of the method for production of a semiconductor device according to the present invention.
Figure 43:
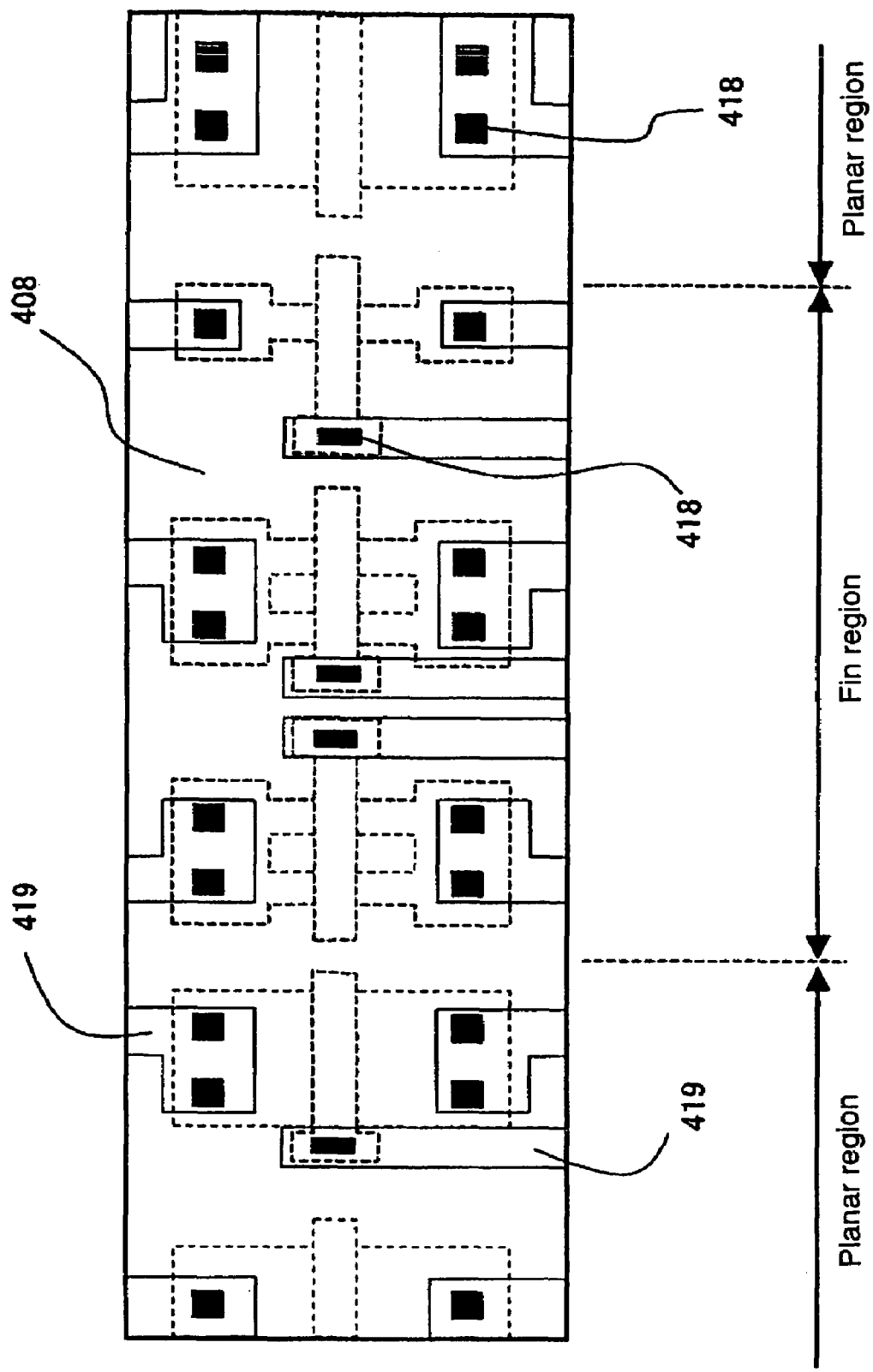
FIG. 43 is an explanatory view of the method for production of a semiconductor device according to the present invention.

A fin contacting a wide element isolation region, among Fins constituting the Fin type FET, in the production process, has its dimension (Fin width W, i.e. the width of a silicon layer forming a Fin in the lateral direction in FIG. 42) varied by a proximity effect at the time of exposure and a loading effect at the time of etching, as compared to a Fin which does not contact the wide element isolation region. In order to prevent such variations in Fin width, a dummy region (denoted by reference numeral 425 in FIGS. 33(*a*) and 33(*b*)) consisting of a silicon layer which is not etched like a silicon layer constituting the Fin is provided in at least a portion of the wide element isolation region that is adjacent to the Fin. The element isolation region in the form of sufficiently digging the substrate is desirable in terms of allowing the reduction of a parasitic capacitance between a gate or wiring provided on the region and the substrate, since the element isolation insulating film can be made sufficiently thick. However, the dummy region occupying a part of the element isolation region consists of a protrusive silicon layer like the Fin region, and therefore there is a problem of increasing such a parasitic capacitance. In this production method, a dummy region is formed together with a Fin, followed by etching the dummy region to form a trench, and therefore the dummy region is converted in a self-aligned manner to a form of digging the substrate. As a result, the problem of increasing the parasitic capacitance is solved together with the problem of variations in Fin width.

In this production method, a mask film (first mask nitride film 403) for CMP is required on the Fin when an insulating film (first $SiO_2$ film 404) is buried in Fins. Generally, the trench for element isolation which is used for a planar type transistor is so deep that it is necessary to flatten the thick insulating film buried in the trench, and therefore the mask film for CMP is generally formed thickly. This is because prolonged CMP is required for flattening the thick insulating film, and during the CMP, a loss in thickness of the mask film by CMP is large. When a protrusive semiconductor layer as a Fin is formed, the silicon substrate and the mask film on the upper part thereof are etched, but if the mask film is thick at this time, the amount of etching of the silicon substrate and mask film increases. If the amount of etching is large, processing accuracy for the protrusive semiconductor layer as a Fin is deteriorated. In this production method, a first mask nitride film having a small thickness is used for formation of a shallow trench and a second mask nitride film having a large thickness is used for formation of a deep trench, and therefore at the time when etching is carried out for formation of a Fin, the mask film (first mask nitride film) on the silicon substrate is thin, and processing accuracy for the semiconductor layer is improved.

When an insulating film in a shallow trench portion is etched back in the step shown in FIGS. 39(a) and 39(b), the amount of the etching increases and the amount of variations in etching increases if the mask nitride film (first mask nitride film 403) is thick, but because the first mask nitride film is thin, the amount of etching decreases and the amount of variations in etching decreases.

PRODUCTION EXAMPLE 8

In production example 7, two mask films, i.e. the first mask nitride film 403 and the second mask nitride film 406 are used as a mask for CMP, but in this production example, a single mask nitride film is used as a mask for CMP.

Figure 48:
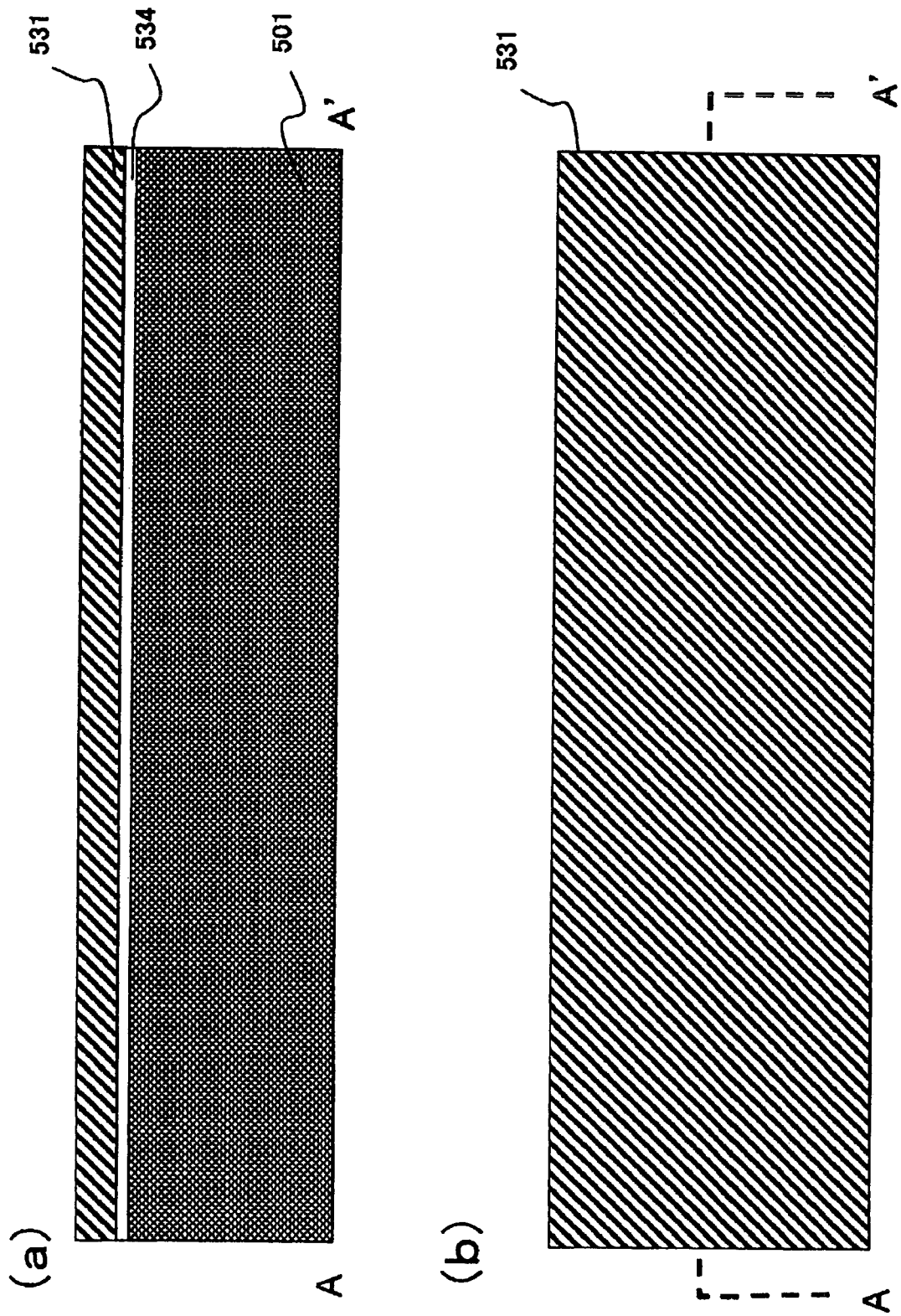
FIGS. 48(a) and 48(b) are explanatory views of a method for production of a semiconductor device according to the present invention.

First, a pad oxide film 534 and a mask nitride film 531 are deposited on a silicon substrate 501 by a CVD method or the like (FIGS. 48(a) and 48(b)). The thickness of the pad oxide film is typically 5 nm to 20 nm, and the thickness of the mask nitride film 531 is typically 80 nm to 200 nm. Since the mask nitride film 531 is a stopper for CMP, the mask may be formed of a material other than a nitride film as long as this purpose can be achieved.

Next, a resist mask is formed by a lithography technique, and using the resist mask, the mask nitride film 531, the pad oxide film 534 and the silicon substrate 501 are etched at a location (which corresponds to in-transistor Fin separation region 413 of FIGS. 40(a) and 40(b)) that corresponds to a portion between Fins to be formed to form a shallow trench on the silicon substrate 50. The depth of the shallow trench is typically 20 nm to 100 nm. The etching of the silicon substrate may be carried out using the aforementioned resist mask as a mask, or may be carried out using the mask nitride film as a mask after removing the resist mask.

Next, a first $SiO_2$ film 504 is deposited on the entire surface by CVD, the first $SiO_2$ film 504 is subsequently flattened by CMP using the mask nitride film 531 as a mask, and the first $SiO_2$ film 504 is buried in the shallow trench between Fins (FIGS. 49(a) and 49(b)). In this connection, the first $SiO_2$ film 504 may be another insulating film capable of CMP. Before deposition of the first $SiO_2$ film, a protective insulating film such as a thermally oxidized film may be provided on the side surface and the bottom surface of the silicon substrate in the trench wherein the surfaces are exposed by etching. An element isolation region between Fin type FETs (corresponding to a region denoted by reference numeral 412 in FIG. 40(a)) is not etched but is left as a dummy region 525 at this time.

Figure 49:
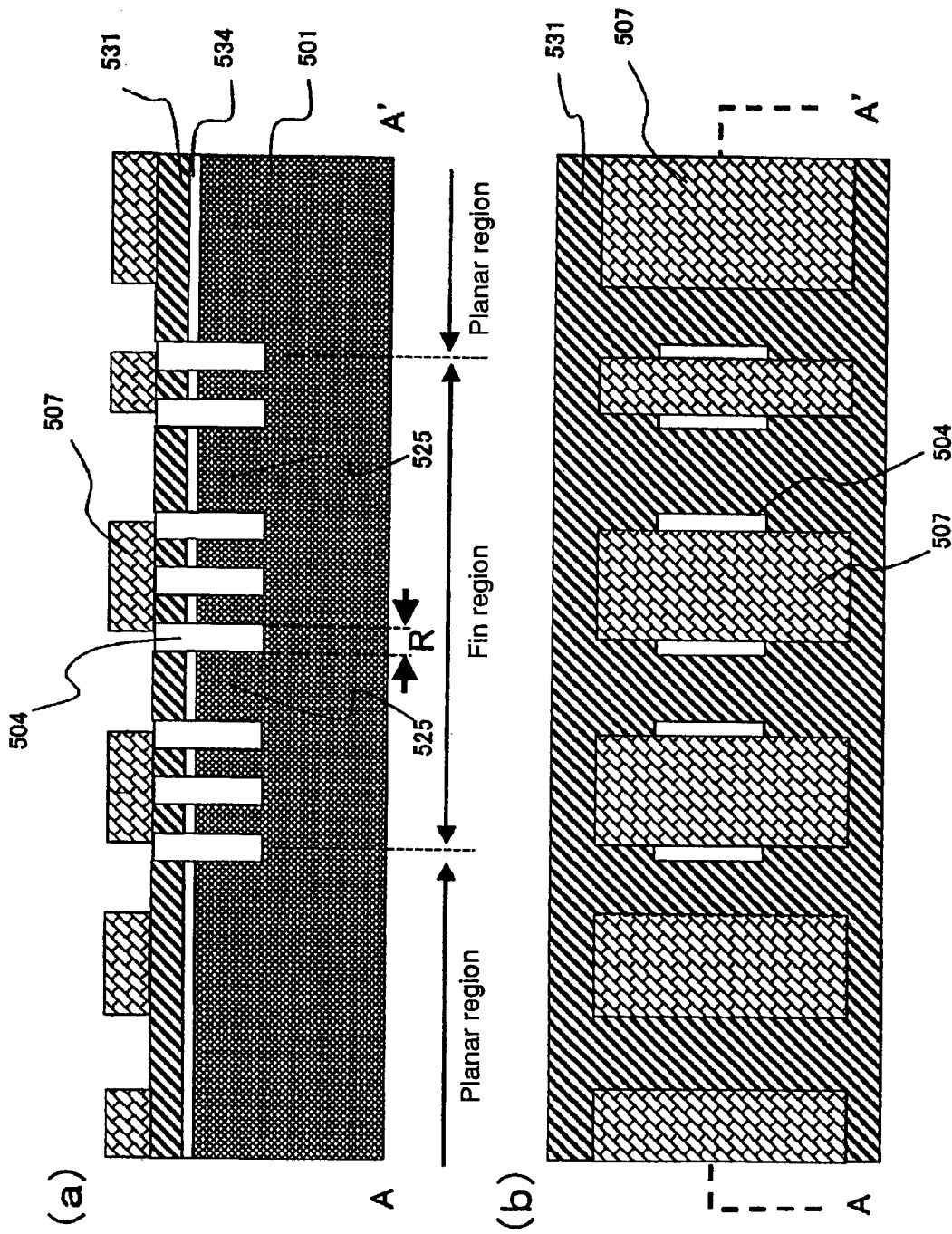
FIGS. 49(a) and 49(b) are explanatory views of the method for production of a semiconductor device according to the present invention.

Next, a resist mask 507 for forming an element region (which is a region consisting of source, drain, channel and extension regions, etc. that constitute a transistor) of a transistor is formed by a lithography technique (FIGS. 49(a) and 49(b)). At this time, the resist mask 507 is provided so as to extend over a part of the outermost shallow trench (which is a location at which the first $SiO_2$ film 504 is buried) of the Fin type FET. In this connection, the width (width R in the figure) of the outermost shallow trench of the Fin type FET may be set greater than the width of another shallow trench (central trench covered with a resist mask in FIG. 49(a)). By increasing the width of the trench in this way, a large allowance for alignment can be provided when the resist mask is provided so as to cover a part of the outermost shallow trench of the Fin type FET.

Figure 50:
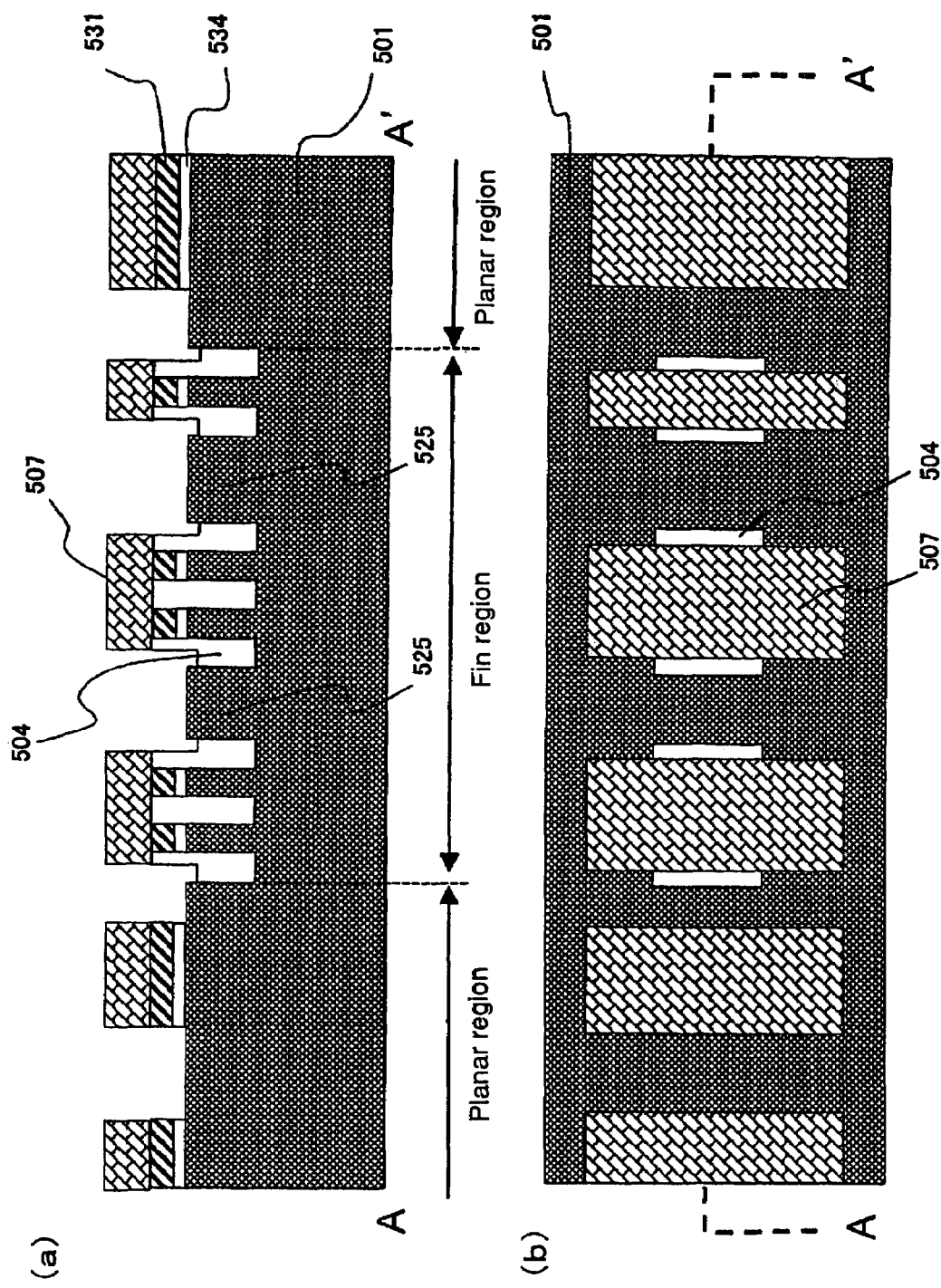
FIGS. 50(a) and 50(b) are explanatory views of the method for production of a semiconductor device according to the present invention.

Next, the mask nitride film 531, the pad oxide film 534 and first $SiO_2$ film 504 are etched using the resist mask 507 as a mask (FIGS. 50(a) and 50(b)). Due to this step, the silicon substrate 501 is exposed at portions (which do not form an element region and are denoted by reference numerals 410, 411 and 412 in FIG. 40(a)) that form an element isolation region. In this connection, at this time, there is no problem even though the end of the resist mask 507 is deviated from an area over the shallow trench to the element isolation region side (deviated to the dummy region 525 side in FIGS. 49(a) and 49(b)) if subsequent silicon etching is carried out under a somewhat isotropic condition.

Figure 51:
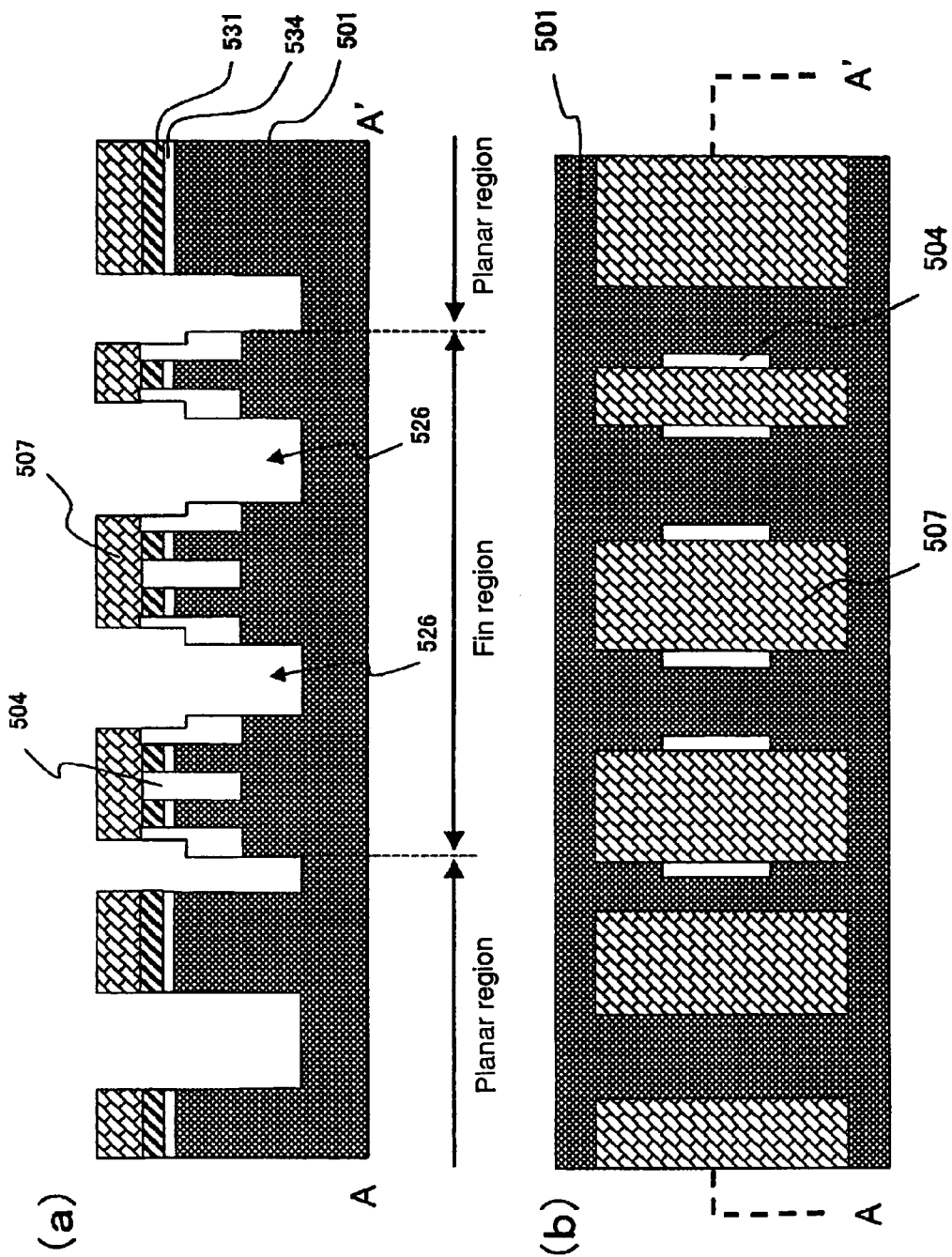
FIGS. 51(a) and 51(b) are explanatory views of the method for production of a semiconductor device according to the present invention.

Subsequently, the silicon substrate 501 exposed at the element isolation region is etched to form a deep trench (FIGS. 51(a) and 51(b)). The depth of the deep trench is typically 150 nm to 300 nm. In this connection, a portion denoted by reference numeral 526 in the figure represents a region (deep trench) where the dummy region 525 is removed.

Figure 52:
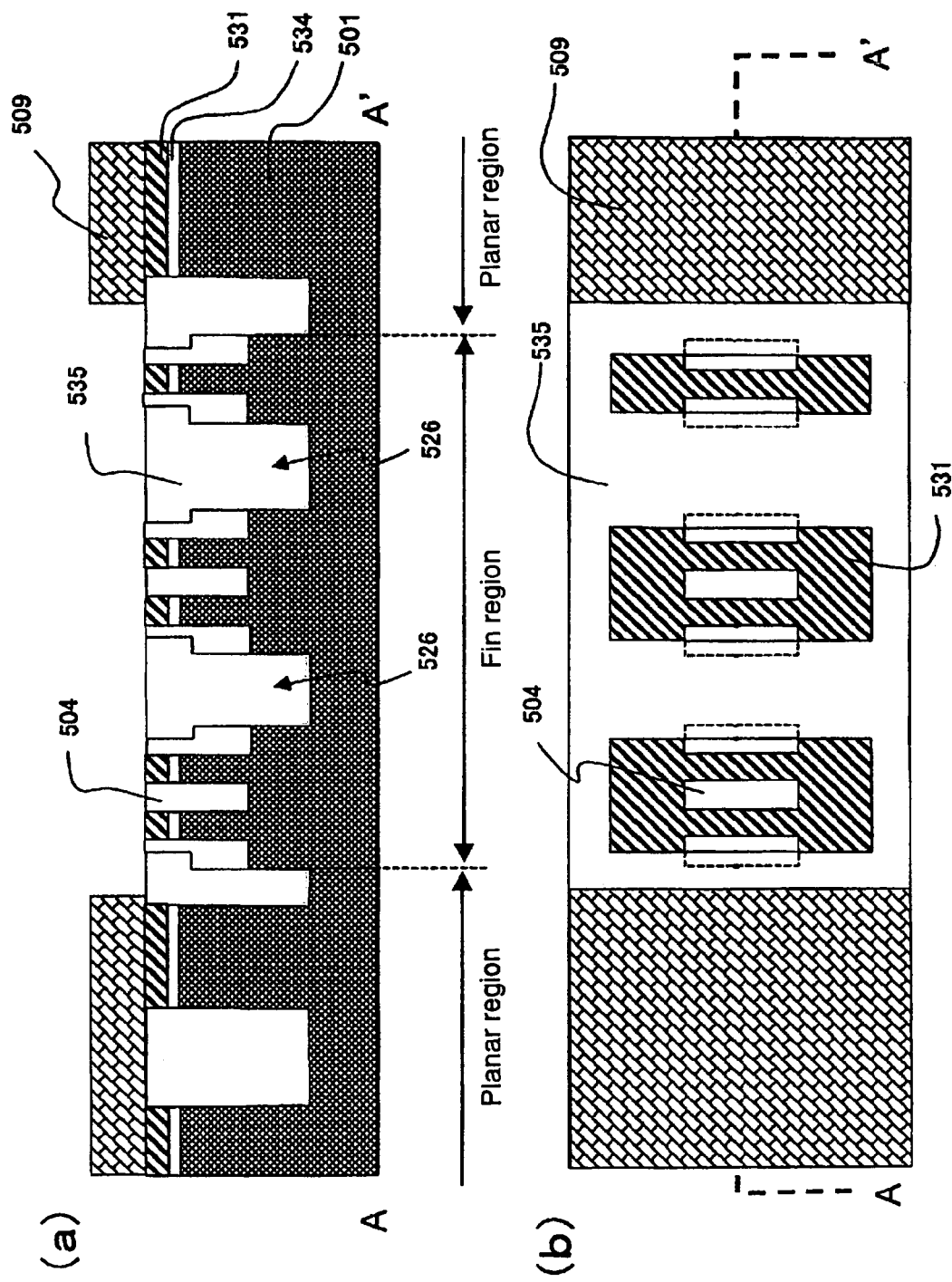
FIGS. 52(a) and 52(b) are explanatory views of the method for production of a semiconductor device according to the present invention.

Next, a second $SiO_2$ film 535 is deposited on the entire surface by a CVD or the like, the $SiO_2$ film 535 is subsequently flattened by CMP using the mask nitride film 531 as a mask, and the $SiO_2$ film 535 is buried in the deep trench (FIGS. 52(a) and 52(b)). In this connection, the second $SiO_2$ film may be another insulating film capable of CMP. Before deposition of the second $SiO_2$ film, a protective insulating film such as a thermally oxidized film may be provided on the side surface and the bottom surface of the silicon substrate in the trench wherein the surfaces are exposed by etching. A resist mask 509 is formed so as to cover a planar region (FIGS. 52(a) and 52(b)).

In subsequent steps, a semiconductor device can be formed in the same manner as in the steps shown in FIGS. 39(a) and 39(b) and subsequent steps in production example 7.

In this connection, for the configuration (FIGS. 45 to 47) in which a part or all of the separation regions between the Fin type FETs (which correspond to reference numeral 412 in FIGS. 41(a) and 41(b)) is formed by a shallow trench (having a depth same as that of the in-transistor Fin separation region) and for production methods thereof, modifications similar to those in production example 7 may be made.

According to this production method, a structure having a shallow trench and a deep trench together can be easily produced, and as in production example 7, the problem of increasing a parasitic capacitance is solved together with the problem of variations in Fin width. There is an advantage that the number of production steps is smaller than the number of production steps in production example 7.

PRODUCTION EXAMPLE 9

Another example of the production method of the present invention will be described using the drawings.

Figure 53:
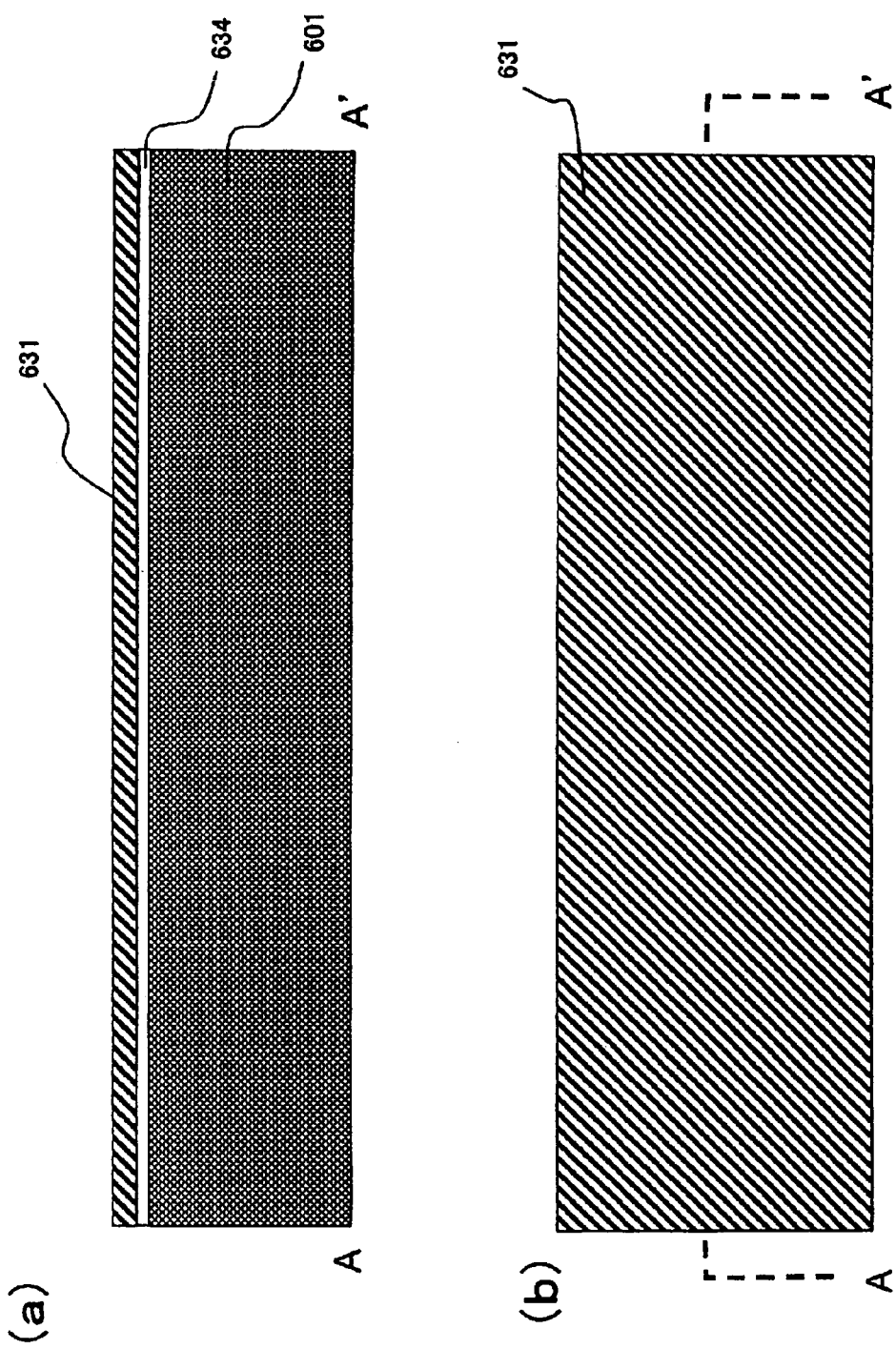
FIGS. 53(a) and 53(b) are explanatory views of a method for production of a semiconductor device according to the present invention.

First, a pad oxide film 634 and a mask nitride film 631 are deposited on a silicon substrate 601 by a CVD method or the like (FIGS. 53(a) and 53(b)). The thickness of the pad oxide film is typically 5 nm to 20 nm, and the thickness of the mask nitride film 631 is typically 80 nm to 200 nm. Since the mask nitride film 631 is a stopper for CMP, the mask may be formed of a material other than a nitride film as long as this purpose can be achieved.

Figure 54:
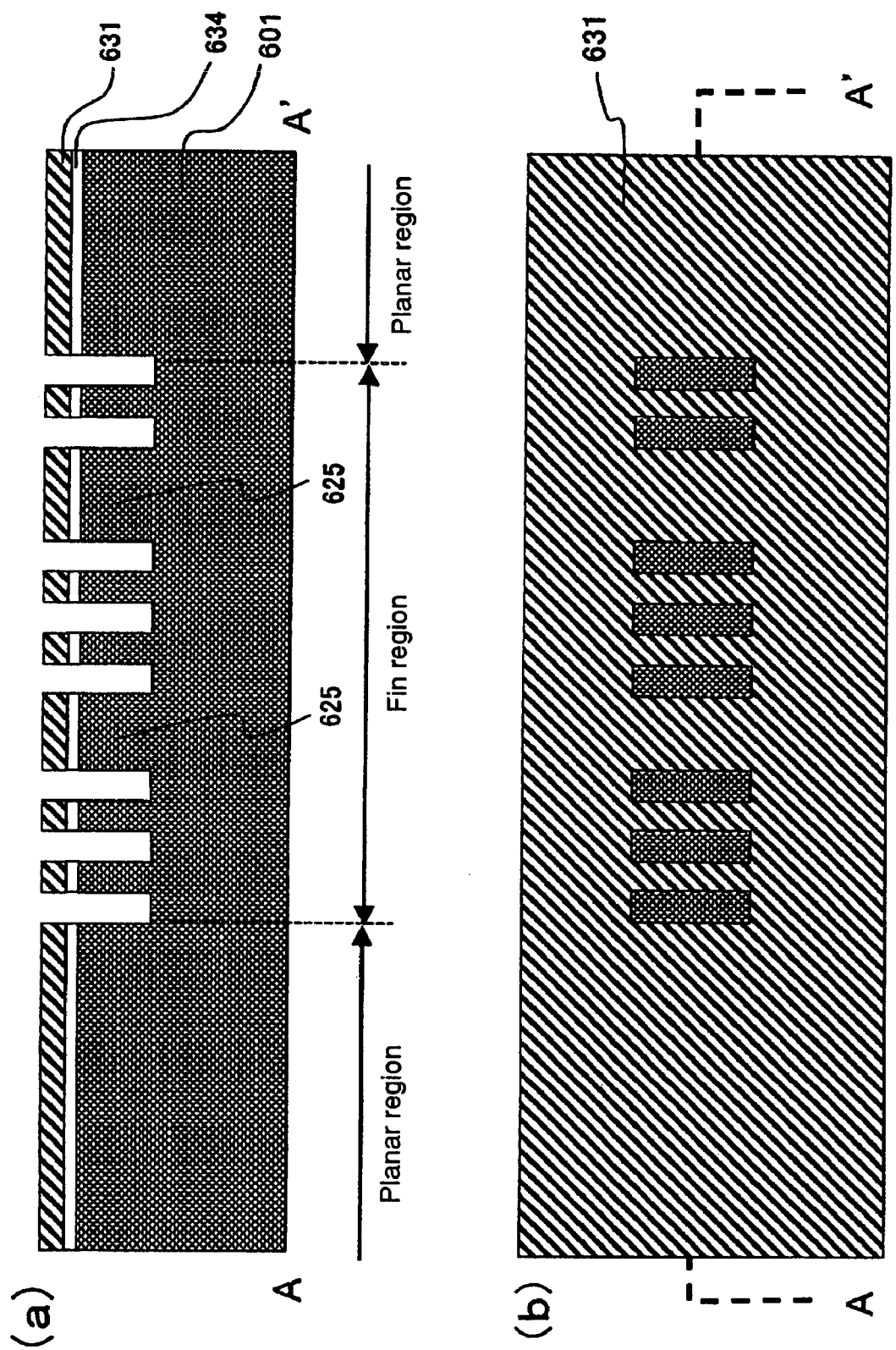
FIGS. 54(a) and 54(b) are explanatory views of the method for production of a semiconductor device according to the present invention.

Next, a resist mask is formed by a lithography technique, and using the resist mask, the mask nitride film 631, the pad oxide film 634 and the silicon substrate 601 are etched at a location (which corresponds to in-transistor Fin separation region 613 of FIGS. 59(a) and 59(b) described later) that corresponds to a portion between Fins to be formed. Thereafter, the silicon substrate 601 is shallowly etched to form a shallow trench (FIGS. 54(a) and 54(b)). The depth of the shallow trench is typically 20 nm to 100 nm. The etching of the silicon substrate may be carried out using the aforementioned resist mask as a mask, or may be carried out using the mask nitride film as a mask after removing the resist mask. A portion denoted by reference numeral 625 in the figure is a dummy region left for suppressing variations in Fin width.

Figure 55:
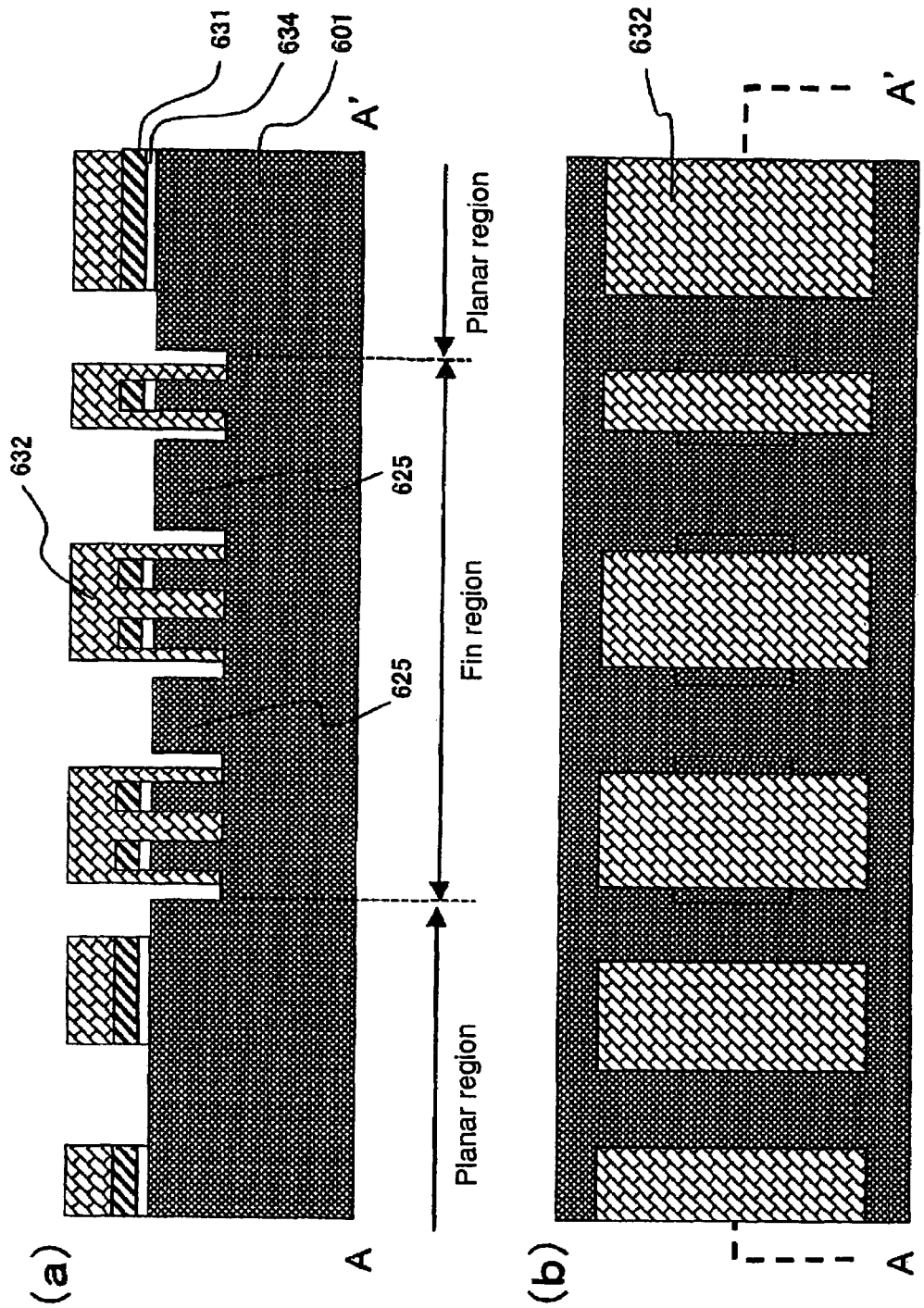
FIGS. 55(a) and 55(b) are explanatory views of the method for production of a semiconductor device according to the present invention.

Next, a resist mask 632 for forming an element region (which is a region consisting of source, drain, channel and extension regions, etc. that constitute a transistor) of a transistor is formed by a lithography technique (FIGS. 55(a) and 55(b)). At this time, the resist mask 632 is provided so as to extend over a part of the outermost shallow trench of the Fin type FET. In this connection, the width of the outermost shallow trench of the Fin type FET may be set greater than the width of another shallow trench (central trench covered with a resist mask in FIG. 55(a)). By increasing the width of the trench in this way, a large allowance for alignment can be provided when the resist mask is provided so as to cover a part of the outermost shallow trench of the Fin type FET.

Figure 56:
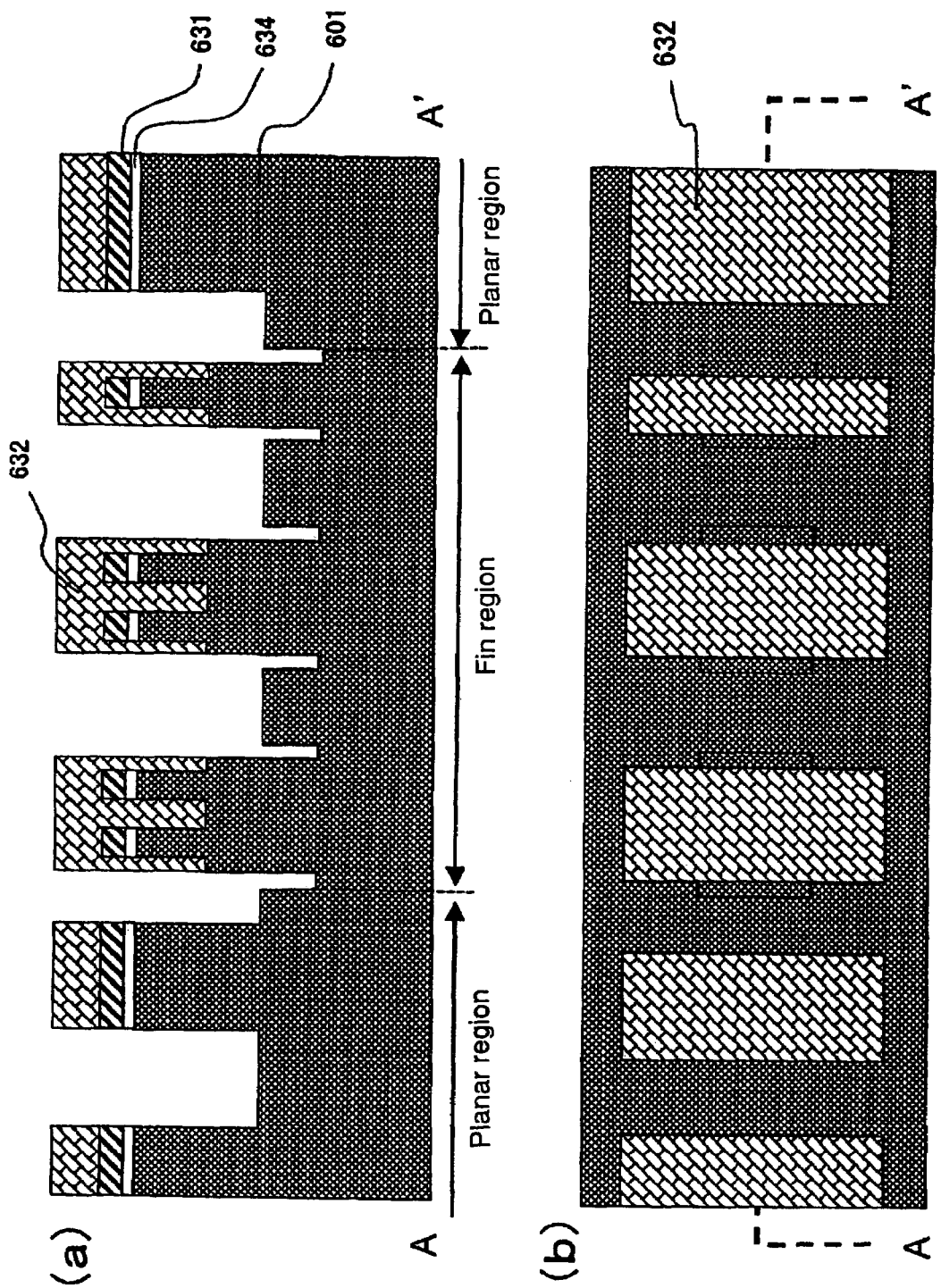
FIGS. 56(a) and 56(b) are explanatory views of the method for production of a semiconductor device according to the present invention.

Next, using the resist mask 632 as a mask, the silicon substrate 601 is etched to form a deep trench (FIGS. 56(a) and 56(b)).

Figure 57:
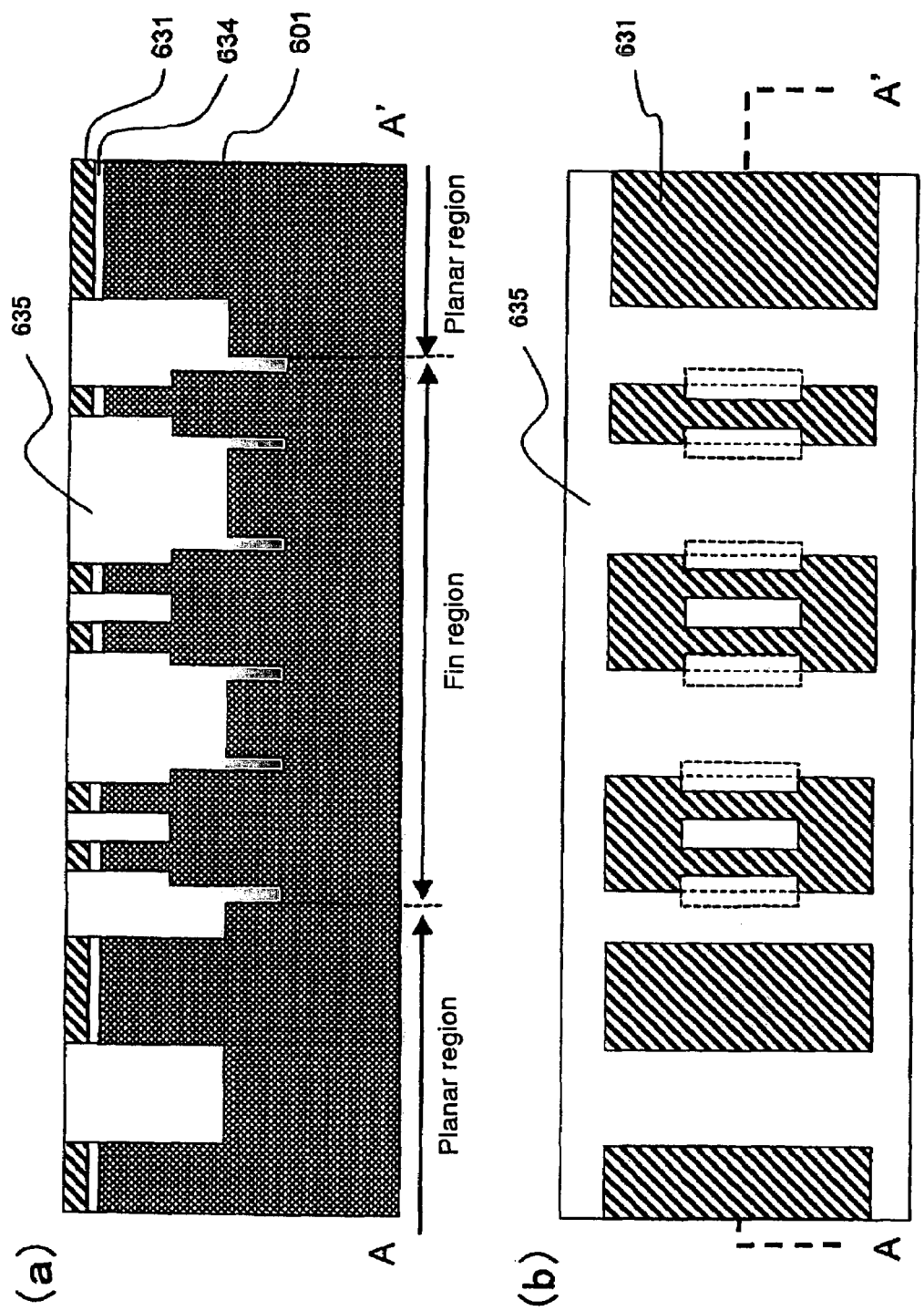
FIGS. 57(a) and 57(b) are explanatory views of the method for production of a semiconductor device according to the present invention.

The resist mask 632 is removed, a SiO$_2$ film 635 is then deposited by CVD so as to fill the trench, and the SiO$_2$ film 635 is flattened by CMP using the mask nitride film 631 as a mask (FIGS. 57(a) and 57(b)).

Figure 58:
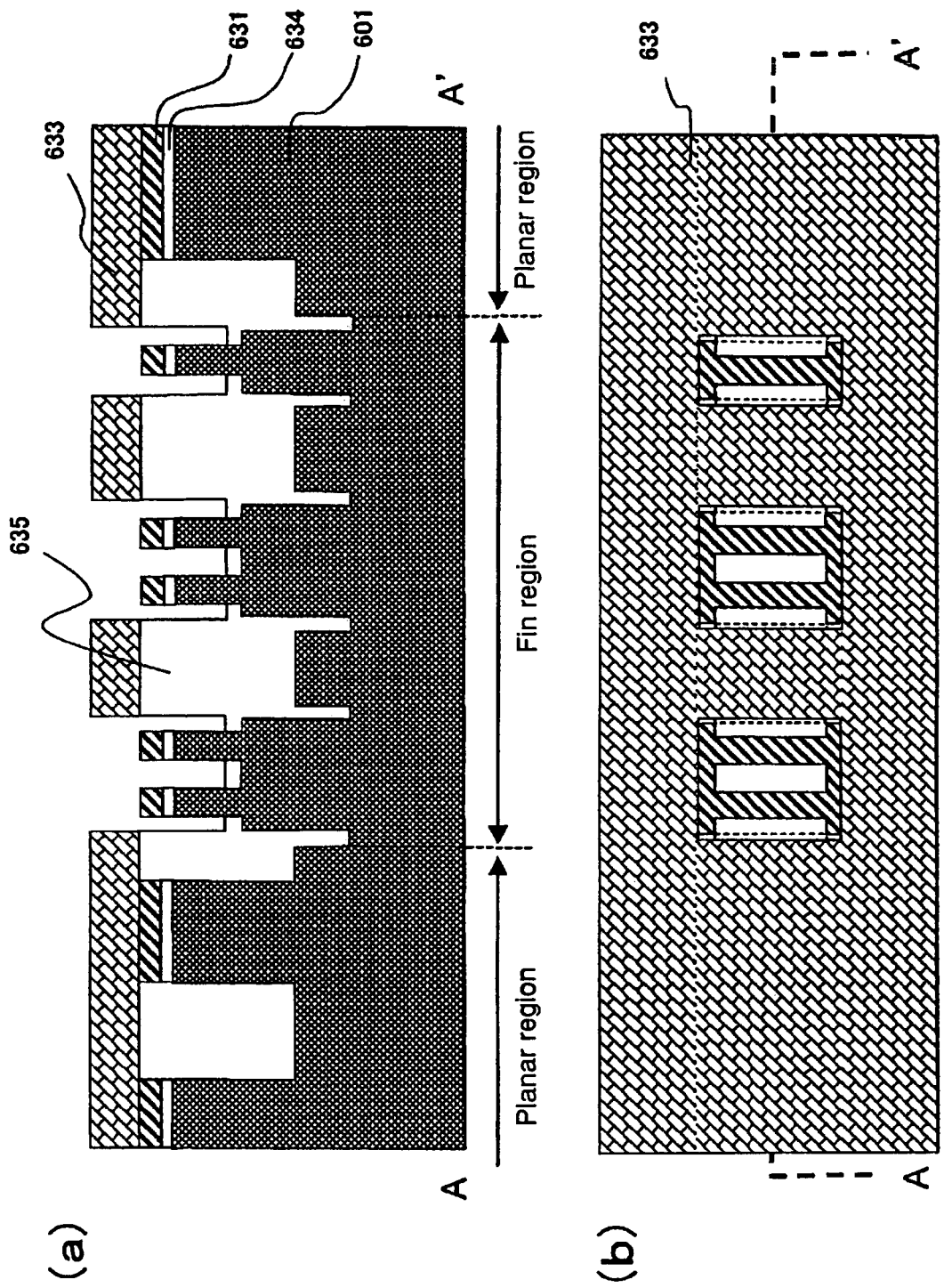
FIGS. 58(a) and 58(b) are explanatory views of the method for production of a semiconductor device according to the present invention.

Next, a resist mask 633 is formed by a lithography technique so as to cover a planar region. The insulating film (SiO$_2$ film 635) of the Fin region is etched back so that a part of the side surface of the silicon region that forms the Fin is exposed (FIGS. 58(a) and 58(b)). However, the SiO$_2$ film 635 over the shallow trench between Fins is not fully removed by the etch-back, but is partly left. In this connection, in the example shown in FIGS. 58(a) and 58(b), the resist mask 633 is also formed on the SiO$_2$ film buried in the deep trench in the Fin region, and is left without being removed in the etch-back.

Figure 59:
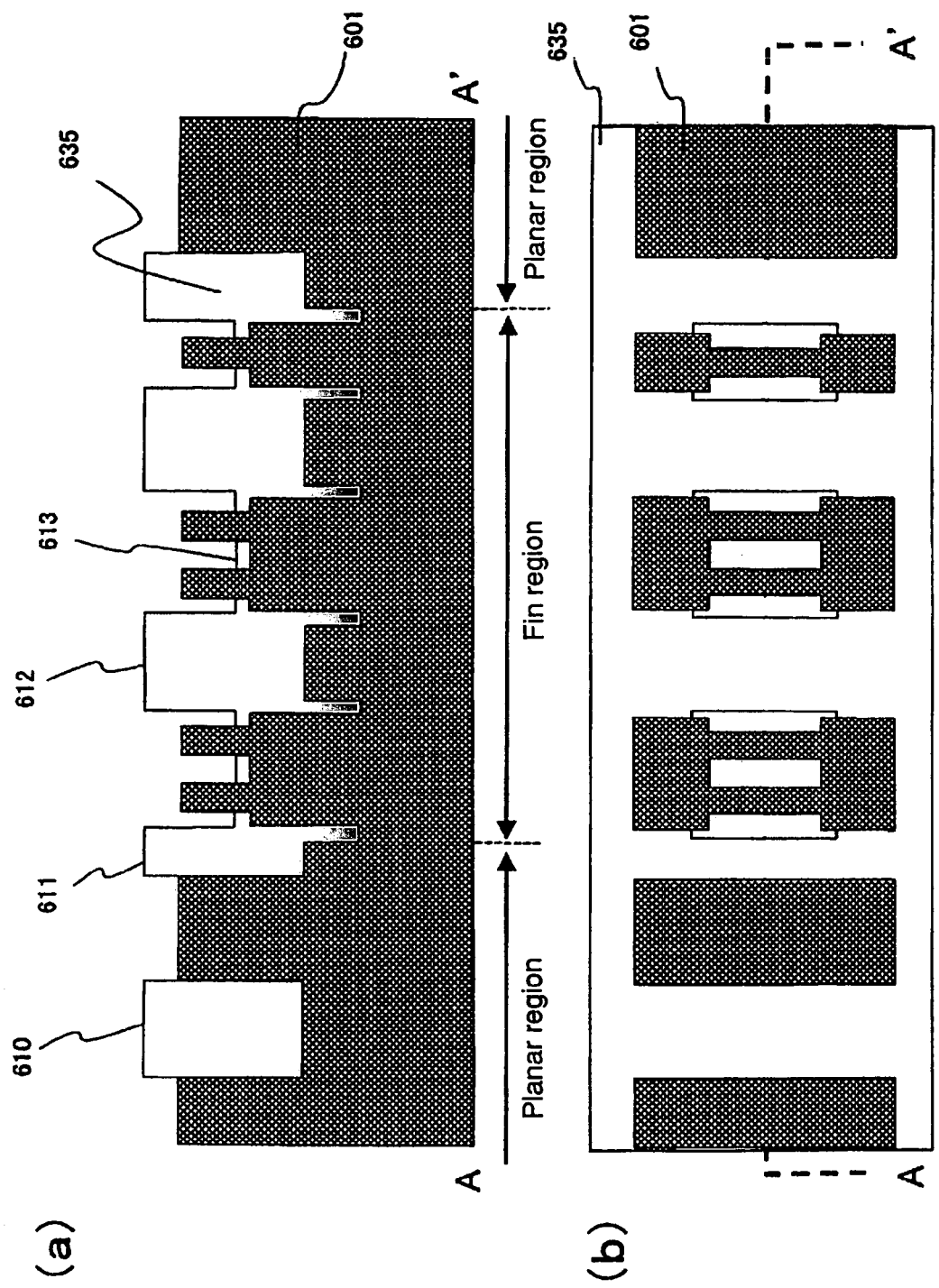
FIGS. 59(a) and 59(b) are explanatory views of the method for production of a semiconductor device according to the present invention.

Next, the mask nitride film 631 and the pad oxide film 634 are removed, a separation region 610 between planar type FETs, a separation region 611 between a planar type FET and a Fin type FET, a separation region 612 between Fin type FETs and an in-transistor Fin separation 613, and an element region isolated by these regions are formed (FIGS. 59(a) and 59(b)).

Figure 60:
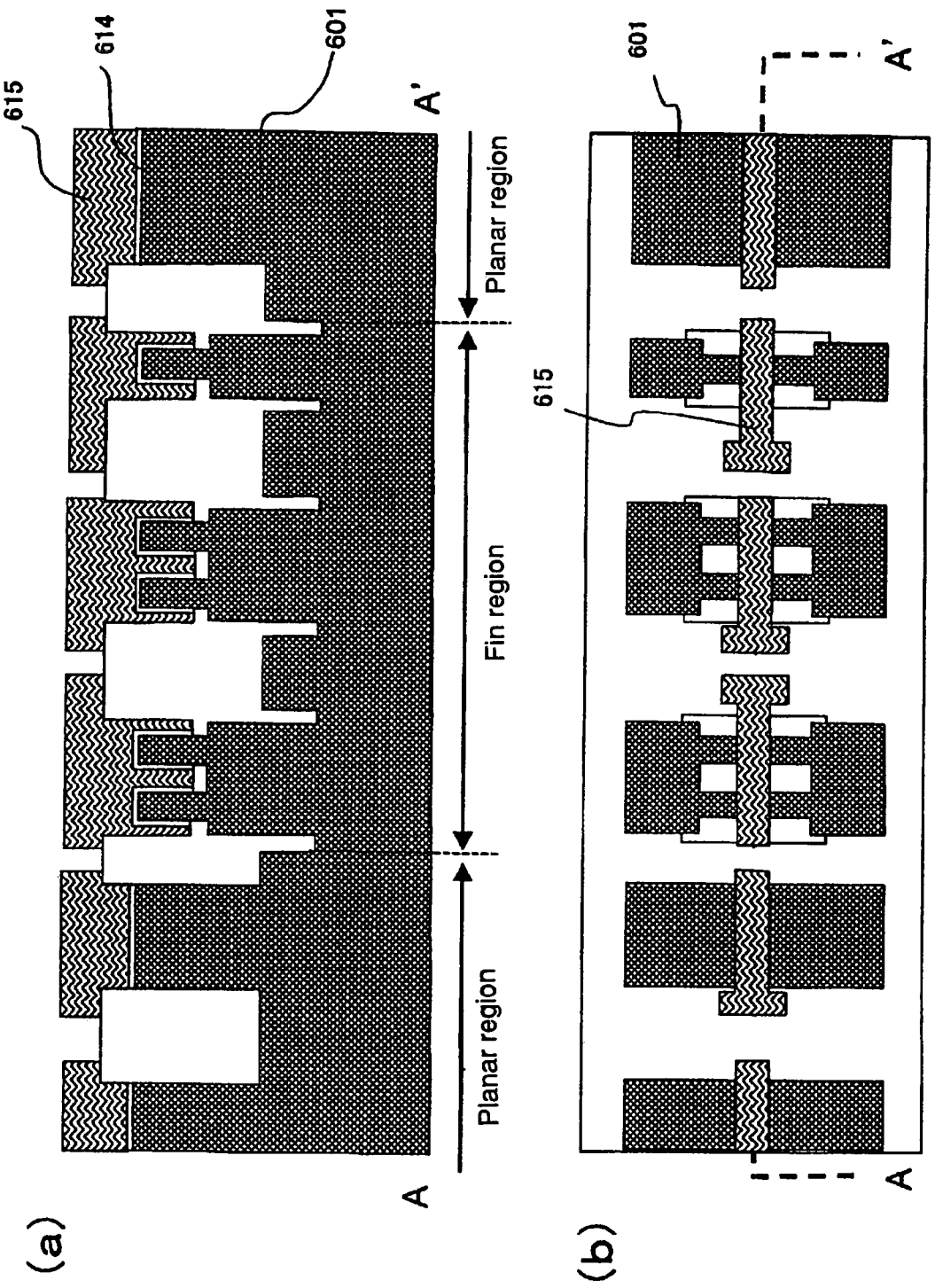
FIGS. 60(a) and 60(b) are explanatory views of the method for production of a semiconductor device according to the present invention.
Figure 61:
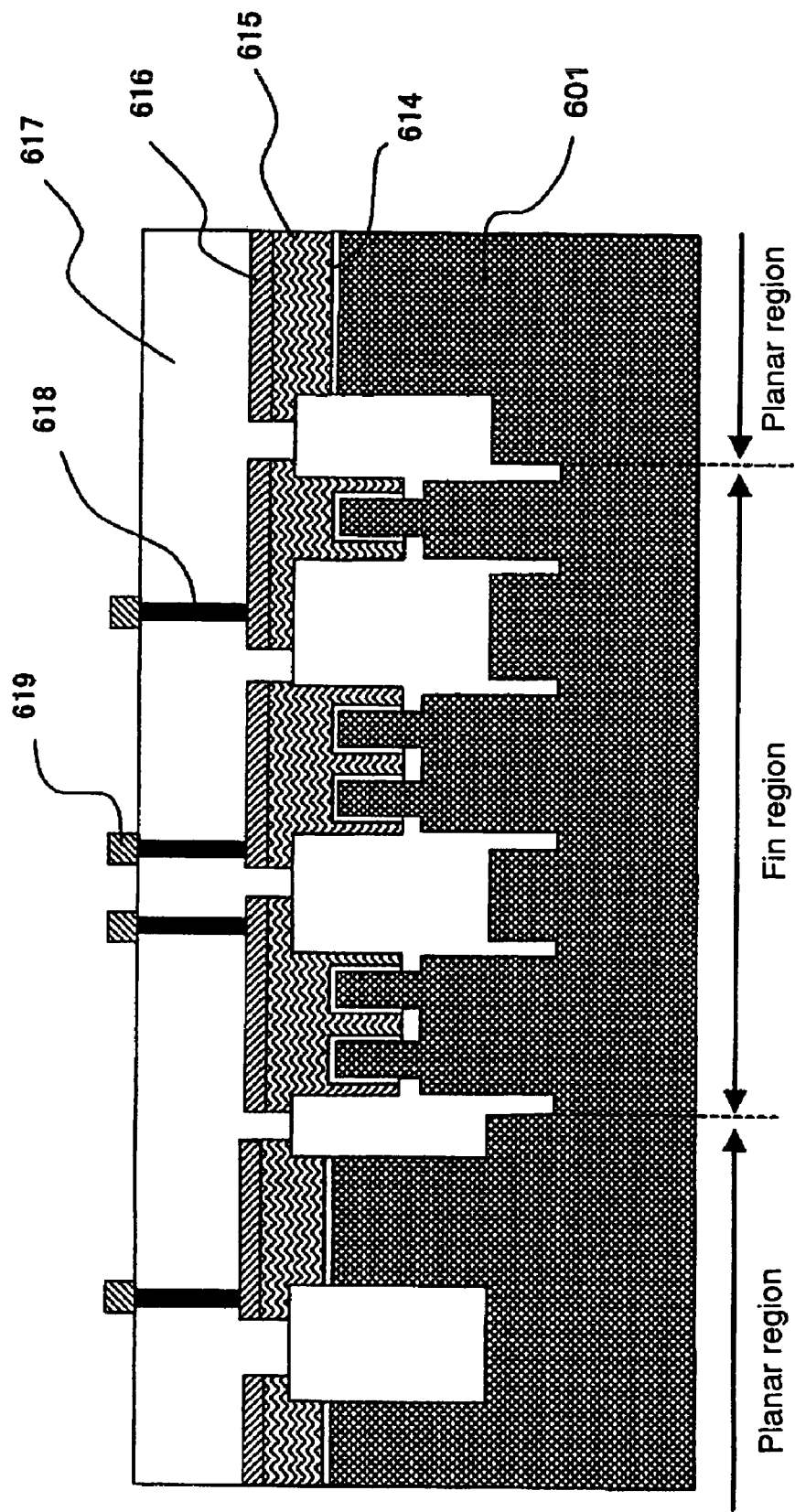
FIG. 61 is an explanatory view of the method for production of a semiconductor device according to the present invention.

After the steps described above, a semiconductor device having the Fin type FET and the planar type FET together is formed through the steps of forming a gate insulating film 614, a gate electrode 615, source and drain regions, a silicide layer 616, an interlayer insulating film 617, a contact plug 618 and a wiring 619 in the same manner as in the production examples described previously (FIGS. 60(a) and 60(b) and 61).

In this connection, for the configuration (FIGS. 45 to 47) in which a part or all of the separation regions 612 between Fin type FETs is formed by a shallow trench (having a depth same as that of the in-transistor Fin separation region) and for production methods thereof, modifications similar to those in production example 7 may be made.

According to this production method, a structure having a shallow trench and a deep trench together can be easily produced, and as in production example 7, the problem of increasing a parasitic capacitance is solved together with the problem of variations in Fin width. Since CMP may be carried out only once, the steps are simplified.

In this connection, the typical dimension of each part and alterations thereof and the typical material of each component and alterations thereof in the semiconductor device produced by the above production examples are similar to those in other embodiments related to the constitution in this specification.

The invention claimed is:

1. A semiconductor device comprising a Fin type field effect transistor which comprises a protrusive semiconductor layer protruding upward with respect to a substrate plane, a gate electrode extending from the upper part of the protrusive semiconductor layer onto facing opposite side surfaces thereof so as to straddle the protrusive semiconductor layer, a gate insulating film interposed between the gate electrode and said protrusive semiconductor layer, and a pair of source and drain regions provided in said protrusive semiconductor layer, wherein the semiconductor device comprises on a semiconductor substrate an element forming region having at least one Fin type field effect transistor, a trench provided on the semiconductor substrate for separating the element forming region from another element forming region, and an element isolation insulating film provided in the trench; and said element forming region comprises a shallow substrate flat surface formed by digging to a depth shallower than the bottom surface of said trench and deeper than the upper surface of said semiconductor substrate, a semiconductor raised portion protruding with respect to the substrate flat surface and formed of a part of said semiconductor substrate, and an insulating film provided on said shallow substrate flat surface; and the protrusive semiconductor layer of said Fin type field effect transistor is formed of a portion protruding with respect to the insulating film of said semiconductor raised portion.

2. The semiconductor device according to claim 1, comprising a plurality of said element forming regions, and a Fin type field effect transistor formed on a well of a first conductivity type is provided on an element forming region different from that of a Fin type field effect transistor formed on a well of a second conductivity type.

3. The semiconductor device according to claim 1 or 2, wherein one Fin type field effect transistor is provided on one said element forming region separated by said trench and the element isolation insulating film buried in the trench.

4. The semiconductor device according to claim 1, wherein said Fin type field effect transistor has a plurality of protrusive semiconductor layers in one transistor.

5. The semiconductor device according to claim 1, comprising a planar type field effect transistor where a channel is formed along the upper surface of the semiconductor substrate on an element forming region different from said element forming region having the Fin type field effect transistor.

6. A method for production of the semiconductor device set forth in claim 1, comprising the steps of:
forming on a semiconductor substrate a first trench for separating element forming regions, and burying an insulating film in the trench to form an element isolation insulating film;
forming a second trench shallower than the bottom surface of said trench on the semiconductor substrate region separated by said element isolation insulating film to form a semiconductor raised portion formed of a part of the semiconductor substrate and protruding with respect to the bottom surface of the second trench;

forming an insulating film on the bottom surface of the second trench to form a protrusive semiconductor layer formed of a portion protruding with respect to the insulating film of said semiconductor raised portion;

forming a gate insulating film at least on the side surface of said protrusive semiconductor layer;

forming a gate electrode material film and patterning the film to form a gate electrode; and introducing an impurity into said protrusive semiconductor layer to form source and drain regions.

7. The method for production of a semiconductor device according to claim 6, wherein the insulating film which is formed on the bottom surface of the second trench is formed by thermally oxidizing the exposed bottom surface of the second trench after forming an antioxidant film on the side surface of said semiconductor raised portion.

8. The method for production of a semiconductor device according to claim 6, wherein the insulating film which is formed on the bottom surface of the second trench is formed by forming an insulating film so as to fill the second trench and etching back the insulating film.

9. The method for production of a semiconductor device according to any one of claims 6 to 8, wherein the first trench is formed simultaneously with formation of a trench for isolating another element forming region provided with a planar type field effect transistor where a channel is formed along the upper surface of the semiconductor substrate.

10. The method for production of a semiconductor device according to claim 6, wherein burying the insulating film in the first trench is simultaneous with burying the insulating film in a trench for isolating another element forming region provided with a planar type field effect transistor where a channel is formed along the upper surface of the semiconductor substrate.

11. A method for production of the semiconductor device set forth in claim 1, comprising the steps of:

forming on a semiconductor substrate a first trench shallower than the bottom surface of a second trench which is subsequently formed to form a semiconductor raised portion formed of a part of the semiconductor substrate and protruding with respect to the bottom surface of the first trench;

forming a second trench for separating an element forming region provided with said semiconductor raised portion and another element forming region;

forming an insulating film so as to fill the first trench and the second trench;

etching back said insulating film to expose said semiconductor raised portion, and to form a protrusive semiconductor layer formed of a portion protruding with respect to said insulating film of the semiconductor raised portion;

forming a gate insulating film at least on the side surface of said protrusive semiconductor layer;

forming a gate electrode material film and pattering the film to form a gate electrode; and introducing an impurity into said protrusive semiconductor layer to form source and drain regions.

12. A method for production of the semiconductor device set forth in claim 1, comprising the steps of:

forming on a semiconductor substrate a first trench shallower than the bottom surface of a second trench which is subsequently formed to form a semiconductor raised portion formed of a part of the semiconductor substrate and protruding with respect to the bottom surface of the first trench;

forming a first insulating film so as to fill the first trench;

forming a second trench for separating an element forming region provided with said semiconductor raised portion and another element forming region;

forming a second insulating film so as to fill the second trench;

etching back the first and second insulating films to expose said semiconductor raised portion, and to form a protrusive semiconductor layer formed of a portion protruding with respect to the first insulating film of the semiconductor raised portion;

forming a gate insulating film at least on the side surface of said protrusive semiconductor layer;

forming a gate electrode material film and pattering the film to form a gate electrode; and introducing an impurity into said protrusive semiconductor layer to form source and drain regions.

13. A method for production of the semiconductor device set forth in claim 1, comprising the steps of:

forming a mask film on a semiconductor substrate;

forming, on the semiconductor substrate on which said mask film is formed, a first trench shallower than the bottom surface of a second trench which is subsequently formed to form a semiconductor raised portion formed of a part of the semiconductor substrate and protruding with respect to the bottom surface of the first trench;

forming a first insulating film so as to fill the first trench;

carrying out polishing using said mask film as a stopper to remove the first insulating film on said mask film except for the inside of the first trench;

forming a second trench for separating an element forming region provided with said semiconductor raised portion and another element forming region;

forming a second insulating film so as to fill the second trench;

carrying out polishing using said mask film as a stopper to remove the second insulating film on said mask film except for the inside of the second trench;

etching back the first and second insulating films to expose said semiconductor raised portion, and to form a protrusive semiconductor layer formed of a portion protruding with respect to the first insulating film of the semiconductor raised portion;

forming a gate insulating film at least on the side surface of said protrusive semiconductor layer;

forming a gate electrode material film and pattering the film to form a gate electrode; and introducing an impurity into said protrusive semiconductor layer to form source and drain regions.

14. A method for production of the semiconductor device set forth in claim 1, comprising the steps of:

forming a first mask film on a semiconductor substrate;

forming, on the semiconductor substrate on which the first mask film is formed, a first trench shallower than the bottom surface of a second trench which is subsequently formed to form a semiconductor raised portion formed of a part of the semiconductor substrate and protruding with respect to the bottom surface of the first trench;

forming a first insulating film so as to fill the first trench;

carrying out polishing using the first mask film as a stopper to remove the first insulating film on the first mask film except for the inside of the first trench;

forming a second mask film;

forming a second trench for separating an element forming region provided with said semiconductor raised portion and another element forming region;

forming a second insulating film so as to fill the second trench;

carrying out polishing using the second mask film as a stopper to remove the second insulating film on the second mask film except for the inside of the second trench;

etching back the first and second insulating films to expose said semiconductor raised portion, and to form a protrusive semiconductor layer formed of a portion protruding with respect to the first insulating film of the semiconductor raised portion;

forming a gate insulating film at least on the side surface of said protrusive semiconductor layer;

forming a gate electrode material film and pattering the film to form a gate electrode; and introducing an impurity into said protrusive semiconductor layer to form source and drain regions.

15. The method for production of a semiconductor device according to claim 14, wherein the second mask film is thicker than the first mask film.

16. The method for production of a semiconductor device according to claim 14 or 15, wherein a pad film formed of a material different from the material of each of the first mask film and the second mask film is provided between the first mask film and the second mask film.

17. The method for production of a semiconductor device according to claim 11, wherein the second trench is formed simultaneously with formation of a trench for separating another element forming region provided with a planar type field effect transistor where a channel is formed along the upper surface of the semiconductor substrate.

18. The method for production of a semiconductor device according to claim 11, wherein burying the insulating film in the second trench is simultaneous with burying the insulating film in a trench for separating another element forming region provided with a planar type field effect transistor where a channel is formed along the upper surface of the semiconductor substrate.

19. The method for production of a semiconductor device according to claim 11, wherein the insulating film formed so as to be buried in the second trench and the insulating film formed so as to fill a trench for separating another element forming region provided with a planar type field effect transistor where a channel is formed along the upper surface of the semiconductor substrate are polished simultaneously.

20. The method for production of a semiconductor device according to claim 11, wherein the first trench has the plane geometry of a strip, and a plurality of the trenches are formed in parallel, and said semiconductor raised portion is formed of a semiconductor portion between first trenches.

21. The method for production of a semiconductor device according to claim 20, wherein in the step of forming the first trench, when the first trench is formed by etching the semiconductor substrate, a dummy region where the semiconductor substrate is left without being removed by the etching is formed between semiconductor raised portions constituting different Fin type field effect transistors in the same element forming region.

22. The method for production of a semiconductor device according to claim 21, further comprising the steps of, after forming the first trench and the dummy region, forming a mask material so as to cover the entire surface; exposing the semiconductor substrate in the dummy region; and etching a region of the semiconductor substrate including the dummy region to form the second trench.

* * * * *